(12) United States Patent
Yamaguchi et al.

(10) Patent No.: US 7,280,008 B2
(45) Date of Patent: Oct. 9, 2007

(54) PRINTED-CIRCUIT BOARD, ELECTRONIC PART HAVING SHIELD STRUCTURE, AND RADIO COMMUNICATION APPARATUS

(75) Inventors: Kunio Yamaguchi, Saitama-ken (JP);
Ryouhei Kimura, Saitama-ken (JP);
Atsushi Tsuboi, Saitama-ken (JP);
Kenyu Morozumi, Kanagawa-ken (JP)

(73) Assignees: Mitsubishi Materials Corporation, Tokyo (JP); Matsushita Electric Industrial Co., Ltd., Osaka (JP)

( * ) Notice: Subject to any disclaimer, the term of this patent is extended or adjusted under 35 U.S.C. 154(b) by 102 days.

(21) Appl. No.: 10/501,934

(22) PCT Filed: Jan. 23, 2003

(86) PCT No.: PCT/JP03/00596

§ 371 (c)(1),
(2), (4) Date: Mar. 21, 2005

(87) PCT Pub. No.: WO03/063561

PCT Pub. Date: Jul. 31, 2003

(65) Prior Publication Data

US 2006/0012421 A1 Jan. 19, 2006

(30) Foreign Application Priority Data

Jan. 24, 2002 (JP) .............................. 2002-016149
Jan. 24, 2002 (JP) .............................. 2002-016150
Jan. 24, 2002 (JP) .............................. 2002-016151
Jun. 24, 2002 (JP) .............................. 2002-182754

(51) Int. Cl.
*H03H 9/64* (2006.01)
*H03H 9/05* (2006.01)

(52) U.S. Cl. ................... 333/193; 310/313 B; 333/194

(58) Field of Classification Search ................. 333/193
See application file for complete search history.

(56) References Cited

U.S. PATENT DOCUMENTS

| 5,162,822 A | * | 11/1992 | Wakamori | ................... 333/193 |
| 6,157,544 A | | 12/2000 | Ferling et al. | |
| 6,330,233 B1 | | 12/2001 | Miya et al. | |
| 6,710,682 B2 | * | 3/2004 | Onishi et al. | ................ 333/193 |
| 6,781,483 B2 | * | 8/2004 | Tanaka et al. | .............. 333/193 |

FOREIGN PATENT DOCUMENTS

GB 2268000 12/1993

(Continued)

*Primary Examiner*—Barbara Summons
(74) *Attorney, Agent, or Firm*—Oblon, Spivak, McClelland, Maier & Neustadt, P.C.

(57) ABSTRACT

In a fitting region for a SAW filter which includes langasite as its piezoelectric element, there are included an input side terminal electrode and an output side terminal electrode which are connected to an input terminal and to an output terminal of the SAW filter. To each of the terminal electrodes, at a position which is separated by just a predetermined distance from the fitting region of the SAW filter, there is connected a micro strip line which extends in mutually opposite directions along a direction which is parallel to the transmission direction of a frequency signal within the SAW filter. A slit is provided in the fitting region of the SAW filter and extends in a direction which intersects the transmission direction of the frequency signal within the SAW filter. A plurality of through holes are provided in the printed substrate and electrically connect together its surface and its rear surface which is grounded. Furthermore, there is provided a protective member which has a conductive surface and which is in contact with the surface of said filter, and said conductive surface of said protective member which is in contact with the surface of said filter is set so as to be of the same size as the surface of said filter, or so as to be smaller than it.

19 Claims, 39 Drawing Sheets

FOREIGN PATENT DOCUMENTS

| | | |
|---|---|---|
| JP | 086371/1980 | 6/1980 |
| JP | 6-120711 | 4/1994 |
| JP | 7-058670 | 3/1995 |
| JP | 11-195852 | 7/1999 |
| JP | 11-251986 | 9/1999 |
| JP | 2001-274756 | 10/2001 |
| JP | 2002-009694 | 1/2002 |
| WO | 01/48276 | 7/2001 |

* cited by examiner

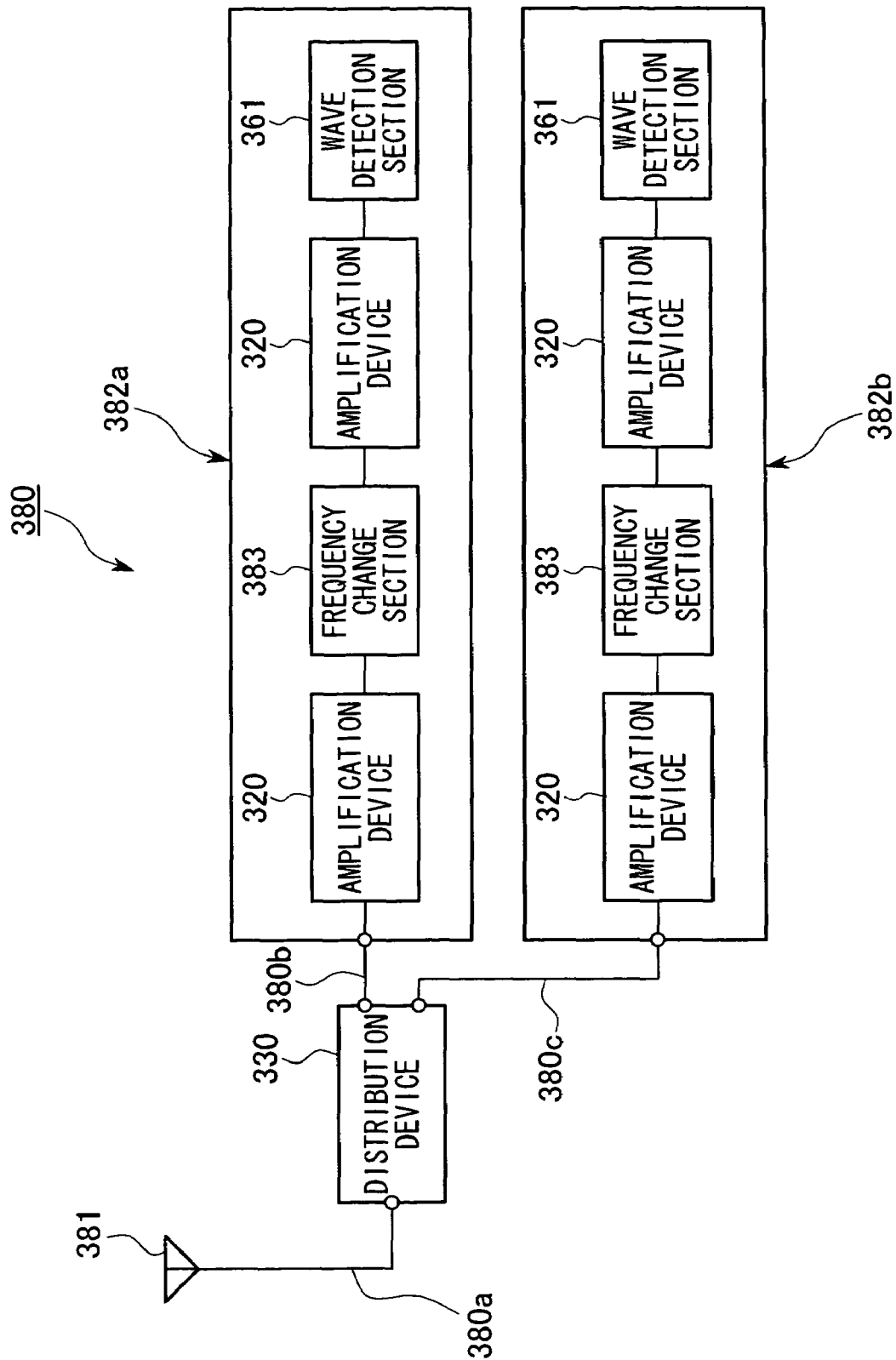

PRINTED-CIRCUIT BOARD, ELECTRONIC PART HAVING SHIELD STRUCTURE, AND RADIO COMMUNICATION APPARATUS

TECHNICAL FIELD

The present invention relates: to a printed substrate (an electronic component) which is equipped with a SAW (Surface Acoustic Wave) filter which is made from a piezoelectric element such as, for example, langasite or the like; to an amplification device, a distribution device, a composition device, a switchover device, a signal reception device, and a signal transmission device in a communication system which comprises said printed substrate; to a mobile station device and a base station device in a mobile communication system which comprises said printed substrate; and to a wireless communication device which comprises said printed substrate.

Furthermore, the present invention relates: to an electronic component which comprises a shield structure which is equipped with a SAW filter which is made from a piezoelectric element such as, for example, langasite or the like; to an amplification device, a distribution device, a composition device, a switchover device, a signal reception device, and a signal transmission device in a communication system which comprises said electronic component; to a mobile station device and a base station device in a mobile communication system which comprises said electronic component; and to a wireless communication device which comprises said electronic component.

BACKGROUND ART

In the prior art, there is a known SAW filter which, by taking advantage of surface acoustic waves (SAW) which are transmitted along the surface of a piezoelectric material such as, for example, quartz or the like, eliminates noise by only allowing to pass a frequency signal of a predetermined frequency band.

With this kind of SAW filter, it is possible to obtain a higher attenuation characteristic as compared to quartz by including a piezoelectric material such as, for example, langasite ($La_3Ga_5SiO_{14}$) or the like, which has a crystalline structure just like that of quartz.

However, with a SAW filter according to the prior art such as the one described above, it sometimes happens that the attenuation characteristic undesirably deteriorates, according to the structure of the printed substrate upon which it is mounted, and there is a fear that it may no longer be possible to obtain the desired attenuation characteristic.

SUMMARY OF THE INVENTION

The present invention is one which has been made in consideration of the above described circumstances, and it takes as its first objective to provide: a printed substrate which is capable of preventing undesirable deterioration of the attenuation characteristic of a filter such as, for example, a SAW filter or the like; to an amplification device, a distribution device, a composition device, a switchover device, a signal reception device, and a signal transmission device in a communication system which comprises said printed substrate; to a mobile station device and a base station device in a mobile communication system which comprises said printed substrate; and to a wireless communication device which comprises said printed substrate.

Furthermore, with an electronic component which comprises a SAW filter of this type, a conductive protective member such as, for example, one in sheet form or the like is carried over a SAW filter which is mounted upon an appropriate electronic circuit substrate such as a printed substrate or the like; and, furthermore, it is arranged to reduce the influence of electromagnetic radiation and noise by covering the surroundings of the SAW filter by a shield case which is made from metal or the like.

However, with an electronic component which comprises a SAW filter according to the prior art such as the one described above, according to the shape and the size of the conductive protective member which is carried upon the SAW filter, it sometimes happens that the attenuation characteristic is undesirably deteriorated, and there is a fear that it may no longer be possible to obtain the desired attenuation characteristic.

The present invention is one which has been made in consideration of the above described circumstances, and it takes as its second objective to provide: an electronic component which comprises a shield structure which is capable of preventing undesirable deterioration of the attenuation characteristic of a filter such as, for example, a SAW filter or the like; to an amplification device, a distribution device, a composition device, a switchover device, a signal reception device, and a signal transmission device in a communication system which comprises said electronic component; to a mobile station device and a base station device in a mobile communication system which comprises said electronic component; and to a wireless communication device which comprises said electronic component.

In order to solve the above described problems and to achieve the first related objective, the printed substrate of the first invention is a printed substrate for mounting a filter (such as, for example, a SAW filter in an embodiment which will be described hereinafter), characterized by comprising an input side terminal electrode (for example, an input side terminal electrode 12a in an embodiment which will be described hereinafter) and an output side terminal electrode (for example, an output side terminal electrode 13e in an embodiment which will be described hereinafter) in a fitting region for said filter (for example, a fitting region 11 in an embodiment which will be described hereinafter), wherein a slit (such as, for example, a slit 15 in an embodiment which will be described hereinafter) which is pierced through said printed substrate in said fitting region is provided so as to intersect the straight line which joins said input side terminal electrode and said output side terminal electrode.

According to the printed substrate of the above described structure, by providing the slit which is pierced through the printed substrate upon which is mounted the filter such as for example a SAW filter or the like, so as to intersect the straight line which joins said input side terminal electrode and said output side terminal electrode which are connected to the input terminal and to the output terminal of the filter, it is possible to suppress undesirable propagation of the input signal which is inputted from the input side terminal electrode, upon, for example, the printed substrate, directly to the output side terminal electrode. Due to this, it is possible to set so that the input signal from the input side terminal electrode to is reliably propagated within the filter, and it is possible to prevent deterioration of the attenuation characteristic of the filter with respect to the input signal.

Furthermore, with the printed substrate of the second invention, said slit is characterized by extending in a direction which is orthogonal to the transmission direction (such as, for example, a transmission direction P in an embodiment which will be described hereinafter) of an input signal within said filter.

According to the printed substrate of the above described structure, by providing the slit which extends in a direction which is orthogonal to the transmission direction of an input signal within said filter, it is possible to suppress the undesirable propagation of the input signal along the slit, and it is possible to establish reliable propagation within the filter. By doing this, it is possible to prevent deterioration of the attenuation characteristic of the filter with respect to the input signal.

Furthermore, the printed substrate of the third invention is characterized in that there is further included a lead wire (such as, for example, a micro strip line 14 in an embodiment which will be described hereinafter) which connects said input side terminal electrode and said output side terminal electrode, and the direction in which said slit extends intersects the direction (such as, for example, a direction parallel to the direction of transmission P in an embodiment which will be described hereinafter) in which said lead wire extends.

According to the printed substrate of the above described structure, it is possible to suppress the undesirable propagation of the input signal within the filter, for example over the printed substrate or the like, and it is possible to establish reliable propagation within the filter.

By doing this, it is possible to prevent deterioration of the attenuation characteristic of the filter with respect to the signal which is inputted to the filter.

Furthermore, the printed substrate of the fourth invention is characterized in that a through hole (such as, for example, a through hole 16 in an embodiment which will be described hereinafter) is provided which electrically connects together the surface of said printed substrate and the rear surface of said printed substrate which has been grounded.

According to the printed substrate of the above described structure, it is possible to suppress the undesirable propagation of the input signal which is inputted to the filter, such as for example over the printed substrate or the like, and it is possible to establish reliable propagation within the filter at a yet higher level.

By doing this, it is possible to prevent deterioration of the attenuation characteristic of the filter with respect to the signal which is inputted to the filter.

Furthermore, with the printed substrate of the fifth invention, said filter is characterized in that it utilizes langasite as its piezoelectric element, and allows signals of a predetermined frequency band to pass by taking advantage of surface elastic waves which are transmitted along the surface of said piezoelectric element.

According to the printed substrate of the above described structure, it is possible to prevent deterioration of the attenuation characteristic of the filter with respect to the input signal; and, as compared to a SAW filter which utilizes, for example, quartz or the like as its piezoelectric element, it is possible reliably to obtain the desired attenuation characteristic.

Furthermore, the amplification device in a communication system of the sixth invention (such as, for example, an amplification device 20 in an embodiment which will be described hereinafter) is characterized by including a printed substrate according to the first through the fifth invention.

According to the amplification device in a communication system of the above described structure, it is possible to amplify and to transmit only the desired signal, even if noise is mixed in with the input signal.

Furthermore, the distribution device in a communication system of the seventh invention (such as, for example, a distribution device 30 in an embodiment which will be described hereinafter) is characterized by including either one of a printed substrate according to the first through the fifth invention, and an amplification device of the sixth invention.

According to the distribution device in a communication system of the above described structure, it is possible to distribute only the desired signal, even if noise is mixed in with the input signal.

Furthermore, the composition device in a communication system of the eighth invention (such as, for example, a composition device 40 in an embodiment which will be described hereinafter) is characterized by including any one of a printed substrate according to the first through the fifth invention, and an amplification device of the sixth invention.

According to the composition device in a communication system of the above described structure, it is possible to combine and to transmit only the desired signal, even if noise is mixed in with the input signal.

Furthermore, the switchover device in a communication system of the ninth invention (such as, for example, a switchover device 50 in an embodiment which will be described hereinafter) is characterized by including any one of a printed substrate according to the first through the fifth invention, and an amplification device of the sixth invention.

According to the switchover device in a communication system of the above described structure, for example, a first transmission line which conducts an input signal to a printed substrate or to an amplification device and a second transmission line or the like over which only, for example, an input signal is simply allowed to pass are provided, and it becomes possible to perform many types of processing with respect to the input signal by switching over and utilizing either of these transmission lines.

For example, if the noise which is mixed in with the input signal is high, or the like, the band of the input signal is limited by utilizing the first transmission line, and only the desired signal is transmitted; while, if for example band limitation is not required, then the second transmission line is utilized.

Furthermore, the signal reception device in a communication system of the tenth invention (such as, for example, a signal reception device 60 in an embodiment which will be described hereinafter) is characterized by comprising any one of the printed substrates according to any one of the first through the fifth inventions, the amplification device of the sixth invention, the distribution device of the seventh invention, the composition device of the eighth invention, and the switchover device of the ninth invention.

According to the signal reception device in a communication system of the above described structure, it is possible to extract only the desired signal from the signal which is received, even if, for example, an interference signal or the like is mixed thereinto.

Furthermore, the signal transmission device in a communication system of the eleventh invention (such as, for example, a signal transmission device 70 in an embodiment which will be described hereinafter) is characterized by comprising any one of the printed substrates according to any one of the first through the fifth inventions, the amplification device of the sixth invention, the distribution device of the seventh invention, the composition device of the eighth invention, and the switchover device of the ninth invention.

According to the signal transmission device in a communication system of the above described structure, it is possible to suppress spurious signal transmission in the signal which is transmitted.

Furthermore, the mobile station device in a mobile communication system of the twelfth invention is characterized by comprising the signal reception device of the first invention and the signal transmission device of the eleventh invention.

According to the mobile station device in a mobile communication system of the above described structure, even if for example an interference signal or the like is mixed in with the signal which is received, it is possible to extract only the desired signal. Furthermore, it is possible to suppress spurious signal transmission in the signal which is transmitted.

Furthermore, the base station device in a mobile communication system of the thirteenth invention is characterized by comprising the signal reception device of the tenth invention and the signal transmission device of the eleventh invention.

According to the base station device in a mobile communication system of the above described structure, even if for example an interference signal or the like is mixed in with the signal which is received, it is possible to extract only the desired signal. Furthermore, it is possible to suppress spurious signal transmission in the signal which is transmitted.

Furthermore, the wireless communication device of the fourteenth invention (such as, for example, a wireless communication device 80 in an embodiment which will be described hereinafter) is characterized by comprising is characterized by comprising any one of the printed substrates according to any one of the first through the fifth inventions, the amplification device of the sixth invention, the distribution device of the seventh invention, the composition device of the eighth invention, the switchover device of the ninth invention, the signal reception device of the tenth invention, the signal transmission device of the eleventh invention, the mobile station device of the twelfth invention, and the base station device of the thirteen invention, and by performing wireless communication.

According to the wireless communication device in a mobile communication system of the above described structure, even if for example an interference signal or the like is mixed in with the signal which is received, it is possible to extract only the desired signal. Furthermore, it is possible to suppress spurious signal transmission in the signal which is transmitted.

In order to solve the above described problems and to achieve the first related objective, the printed substrate of the fifteenth invention is a printed substrate for mounting a filter (such as, for example, a SAW filter in an embodiment which will be described hereinafter), characterized by comprising: an input side terminal electrode (such as, for example, an input side terminal electrode 112*a* in an embodiment which will be described hereinafter) and an output side terminal electrode (such as, for example, an output side terminal electrode 113*e* in an embodiment which will be described hereinafter) in a fitting region (such as, for example, a fitting region 111 in an embodiment which will be described hereinafter) for said filter; and lead wires (such as, for example, micro strip lines 114, 114 in an embodiment which will be described hereinafter) which connect said input side terminal electrode and said output side terminal electrode; and wherein: said lead wires extend in a direction (such as, for example, a direction of propagation P in an embodiment which will be described hereinafter) which is parallel to the transmission direction of an input signal within said filter.

According to the printed substrate of the above described structure, by extending the lead wires which are connected to the input side terminal electrode and to the output side terminal electrode which are connected to the input terminal and to the output terminal of the filter in a direction which is parallel to the transmission direction of an input signal within said filter, it is possible to suppress undesirable propagation of the input signal which is inputted to the filter, such as for example over the printed substrate or the like, and it is possible to establish reliable propagation within the filter.

By doing this, it is possible to prevent deterioration of the attenuation characteristic of the filter with respect to the input signal which is inputted into the filter.

Furthermore, with the printed substrate of the sixteenth invention, said lead wires are characterized by extending in a direction which is orthogonal to the transmission direction of an input signal within said filter up to an elbow position at a predetermined distance from said fitting region, and extend in a direction parallel to the transmission direction of the input signal within said filter at said elbow position.

According to the printed substrate of the above described structure, at the elbow position at the predetermined distance from the fitting region of the filter, by extending the lead wires which are connected to the input side terminal electrode and to the output side terminal electrode in a direction which is parallel to the transmission direction of an input signal within said filter, it is possible to suppress undesirable propagation of the input signal which is inputted from the input side terminal electrode directly to the output side terminal electrode, and it is possible to establish reliable propagation within the filter. Due to this, it is possible to prevent deterioration of the attenuation characteristic of the filter with respect to the input signal which is inputted from the input side terminal electrode.

Furthermore, with the printed substrate of the seventeenth invention, said predetermined distance is characterized by being less than or equal to 10 mm. According to the printed substrate of the above described structure, if the predetermined distance from the fitting region of the filter exceeds 10 mm, then there is a fear that the attenuation characteristic of the filter will deteriorate, for example to about 20 dB. By contrast to this, by setting the elbow position to within 10 mm which is the predetermined distance from the fitting region of the filter, it is possible to obtain the desired attenuation characteristic for the input signal.

Furthermore, with the printed substrate of the eighteenth invention, said filter is characterized by using langasite as its piezoelectric element, and by allowing signals of a predetermined frequency band to pass by taking advantage of surface elastic waves which are transmitted along the surface of said piezoelectric element.

According to the printed substrate of the above described structure, it is possible to prevent deterioration of the attenuation characteristic of the filter with respect to the input signal; and, as compared to a SAW filter which utilizes, for example, quartz or the like as its piezoelectric element, it is possible reliably to obtain a higher desired attenuation characteristic.

Furthermore, the amplification device in a communication system of the nineteenth invention (such as, for example, an amplification device 20 in an embodiment which will be described hereinafter) is characterized by comprising a printed substrate according to any one of the fifteenth through the eighteenth inventions.

According to the amplification device in a mobile communication system of the above described structure, even if noise is mixed in with the input signal, it is possible to amplify and to transmit only the desired signal.

Furthermore, the distribution device in a communication system of the twentieth invention (such as, for example, a distribution device 30 in an embodiment which will be described hereinafter) is characterized by comprising any one of a printed substrate according to any one of the fifteenth through the eighteenth inventions, and an amplification device according to the nineteenth invention.

According to the distribution device in a mobile communication system of the above described structure, even if noise is mixed in with the input signal, it is possible to distribute and to transmit only the desired signal.

Furthermore, the composition device in a communication system of the twenty-first invention (such as, for example, a composition device 40 in an embodiment which will be described hereinafter) is characterized by comprising any one of a printed substrate according to any one of the fifteenth through the eighteenth inventions, and an amplification device according to the nineteenth invention.

According to the composition device in a mobile communication system of the above described structure, even if noise is mixed in with the input signal, it is possible to combine and to transmit only the desired signal.

Furthermore, the switchover device in a communication system of the twenty-second invention (such as, for example, a switchover device 50 in an embodiment which will be described hereinafter) is characterized by comprising any one of a printed substrate according to any one of the fifteenth through the eighteenth inventions, and an amplification device according to the nineteenth invention.

According to the switchover device in a communication system of the above described structure, for example, a first transmission line which conducts an input signal to a printed substrate or to an amplification device and a second transmission line or the like over which only, for example, an input signal is simply allowed to pass are provided, and it becomes possible to perform many types of processing with respect to the input signal by switching over and utilizing either of these transmission lines.

For example, if the noise which is mixed in with the input signal is high, or the like, the band of the input signal is limited by utilizing the first transmission line, and only the desired signal is transmitted; while, if for example band limitation is not required, then the second transmission line is utilized.

Furthermore, the signal reception device in a communication system of the twenty-third invention (such as, for example, a signal reception device 60 in an embodiment which will be described hereinafter) is characterized by comprising any one of a printed substrate according to any one of the fifteenth through the eighteenth inventions, an amplification device according to the nineteenth invention, a distribution device according to the twentieth invention, a composition device according to the twenty-first invention, and a switchover device according to the twenty-second invention.

According to the signal reception device in a communication system of the above described structure, even if, for example, an interference signal or the like is mixed in with the signal which is received, it is possible to extract only the desired signal.

Furthermore, the signal transmission device in a communication system of the twenty-fourth invention (such as, for example, a signal transmission device 70 in an embodiment which will be described hereinafter) is characterized by comprising any one of a printed substrate according to any one of the fifteenth through the eighteenth inventions, an amplification device according to the nineteenth invention, a distribution device according to the twentieth invention, a composition device according to the twenty-first invention, and a switchover device according to the twenty-second invention.

According to the signal transmission device in a communication system of the above described structure, it is possible to suppress spurious signal transmission in the signal which is transmitted.

Furthermore, the mobile station device in a mobile communication system of the twenty-fifth invention is characterized by comprising a signal reception device according to the twenty-third invention and a signal transmission device according to the twenty-fourth invention.

According to the mobile station device in a mobile communication system of the above described structure, even if, for example, an interference signal or the like is mixed in with the signal which is received, it is possible to extract only the desired signal. Furthermore, it is possible to suppress spurious signal transmission in the signal which is transmitted.

Furthermore, the base station device in a mobile communication system of the twenty-sixth invention is characterized by comprising a signal reception device according to the twenty-third invention and a signal transmission device according to the twenty-fourth invention.

According to the base station device in a mobile communication system of the above described structure, even if, for example, an interference signal or the like is mixed in with the signal which is received, it is possible to extract only the desired signal. Furthermore, it is possible to suppress spurious signal transmission in the signal which is transmitted.

Furthermore, the wireless communication device of the twenty-seventh invention (such as, for example, a wireless communication device 80 in an embodiment which will be described hereinafter) is characterized by comprising any one of a printed substrate according to any one of the fifteenth through the eighteenth inventions, an amplification device according to the nineteenth invention, a distribution device according to the twentieth invention, a composition device according to the twenty-first invention, a switchover device according to the twenty-second invention, a signal reception device according to the twenty-third invention, a signal transmission device according to the twenty-fourth invention, a mobile station device according to the twenty-fifth invention, and a base station device according to the twenty-sixth invention, and by performing wireless communication.

According to the wireless communication device of the above described structure, even if, for example, an interference signal or the like is mixed in with the signal which is received, it is possible to extract only the desired signal. Further, it is possible to suppress spurious signal transmission in the signal which is transmitted.

In order to solve the above described problems and to achieve the first related objective, the printed substrate of the twenty-eighth invention is a printed substrate for mounting a filter (such as, for example, a SAW filter in an embodiment which will be described hereinafter), and is characterized by comprising: an input side terminal electrode (such as, for example, an input side terminal electrode 212*a* in an embodiment which will be described hereinafter) and an output side terminal electrode (such as, for example, an output side terminal electrode 213*e* in an embodiment which will be described hereinafter) in a fitting region (such as, for example, a fitting region 211 in an embodiment which will be described hereinafter) for said filter; lead wires (such as, for example, micro strip lines 214, 214 in an embodiment which will be described hereinafter) which connect said input side terminal electrode and said output side terminal electrode, and which extend in a direction which is orthogonal to the transmission direction (such as, for example, a direction of propagation P in an embodiment which will be described hereinafter) of an input signal within said filter up to an elbow position at a predetermined distance from said fitting region, and extend in a direction parallel to the transmission direction of the input signal within said filter at said elbow position; and a through hole (such as, for example, a through hole 216 in an embodiment which will be described hereinafter) which electrically connects together the surface of said printed substrate and the rear surface of said printed substrate which has been grounded.

According to the printed substrate of the above described structure, by providing the through hole within the fitting region of the fitter, or outside that fitting region, in the state in which the lead wires which are connected to said input side terminal electrode and said output side terminal electrode are set so as to extend in a direction which is parallel to the transmission direction of the input signal in the filter, at an elbow position at a predetermined distance from the fitting region of the filter, it is possible to reduce the influence of noise when performing the desired band transmission processing within the filter. Furthermore, it is possible to suppress undesirable propagation of the input signal which is inputted from the input side terminal electrode, for example, directly over the printed substrate or the like, so as to reach the output side terminal electrode, and it is possible to establish the input signal to be reliably propagated within the filter. Due to this, it is possible to prevent deterioration of the attenuation characteristic of the filter with respect to the input signal.

Furthermore, with the printed substrate of the twenty-ninth invention, said through hole is characterized by being provided in the vicinity of said input side terminal electrode and said output side terminal electrode.

According to the printed substrate of the above described structure, by providing the through hole in the vicinity of the input side terminal electrode and the output side terminal electrode, along with it being possible to reduce the influence of noise by a yet further level, it is also possible reliably to establish transmission of the input signal within the filter.

Furthermore, with the printed substrate of the thirtieth invention, the diameter of said through hole is characterized by being 0.3 to 0.5 mm.

According to the printed substrate of the above described structure, by setting the diameter of the through hole to 0.3 to 0.5 mm, along with it being possible to reduce the influence of noise, also it becomes possible to establish the input signal to be reliably transmitted within the filter, so that it is possible to obtain the desired attenuation characteristic. On the other hand, if the diameter of the through hole is less than 0.3 mm, or if this diameter is greater than 0.5 mm, then there is a fear that it will become impossible to obtain the desired attenuation characteristic.

Furthermore, with the printed substrate of the thirty-first invention, said through hole outside of said fitting region is characterized by being provided in a region within a predetermined distance from said fitting region.

According to the printed substrate of the above described structure, along with it being possible to reduce the influence of noise when performing the desired band transmission processing within the filter, it is possible to suppress the undesirable propagation of the input signal which is inputted to the filter, for example along the printed substrate or the like, and it is possible reliably to establish transmission within the filter.

Due to this, it is possible to prevent deterioration of the attenuation characteristic of the filter with respect to an input signal which is inputted into the filter.

Furthermore, with the printed substrate of the thirty-second invention, said filter is characterized by utilizing langasite as its piezoelectric element, and by allowing signals of a predetermined frequency band to pass by taking advantage of surface elastic waves which are transmitted along the surface of said piezoelectric element.

According to the printed substrate of the above described structure, it is possible to prevent deterioration of the attenuation characteristic of the filter with respect to the input signal; and, as compared to a SAW filter which utilizes, for example, quartz or the like as its piezoelectric element, it is possible reliably to obtain a higher desired attenuation characteristic.

Furthermore, the amplification device in a communication system of the thirty-third invention (such as, for example, an amplification device 20 in an embodiment which will be described hereinafter) is characterized by comprising a printed substrate according to any one of the twenty-eighth through the thirty-second inventions.

According to the amplification device in a communication system of the above described structure, even if noise is mixed in with the input signal, it is possible to amplify only the desired signal.

Furthermore, the distribution device in a communication system of the thirty-fourth invention (such as, for example, a distribution device 30 in an embodiment which will be described hereinafter) is characterized by comprising any one of a printed substrate according to any one of the twenty-eighth through the thirty-second inventions, and an amplification device according to the thirty-third invention.

According to the distribution device in a communication system of the above described structure, even if noise is mixed in with the input signal, it is possible to distribute and to transmit only the desired signal.

Furthermore, the composition device in a communication system of the thirty-fifth invention (such as, for example, a composition device 40 in an embodiment which will be described hereinafter) is characterized by comprising any one of a printed substrate according to any one of the twenty-eighth through the thirty-second inventions, and an amplification device according to the thirty-third invention.

According to the composition device in a communication system of the above described structure, even if noise is mixed in with the input signal, it is possible to combine and to transmit only the desired signal.

Furthermore, the switchover device in a communication system of the thirty-sixth invention (such as, for example, a switchover device 50 in an embodiment which will be described hereinafter) is characterized by comprising any one of a printed substrate according to any one of the twenty-eighth through the thirty-second inventions, and an amplification device according to the thirty-third invention.

According to the switchover device in a communication system of the above described structure, for example, a first transmission line which conducts an input signal to a printed substrate or to an amplification device and a second transmission line or the like over which only, for example, an input signal is simply allowed to pass are provided, and it becomes possible to perform many types of processing with respect to the input signal by switching over and utilizing either of these transmission lines.

For example, if the noise which is mixed in with the input signal is high, or the like, the band of the input signal is limited by utilizing the first transmission line, and only the desired signal is transmitted; while, if for example band limitation is not required, then the second transmission line is utilized.

Furthermore, the signal reception device in a communication system of the thirty-seventh invention (such as, for example, a signal reception device 60 in an embodiment which will be described hereinafter) is characterized by comprising any one of a printed substrate according to any one of the twenty-eighth through the thirty-second inventions, an amplification device according to the thirty-third invention, a distribution device according to the thirty-fourth invention, a composition device according to the thirty-fifth invention, and a switchover device according to the thirty-sixth invention.

According to the signal reception device in a communication system of the above described structure, even if, for example, an interference signal or the like is mixed in with the signal which is received, it is possible to extract only the desired signal.

Furthermore, the signal transmission device in a communication system of the thirty-eighth invention (such as, for example, a signal transmission device 70 in an embodiment which will be described hereinafter) is characterized by comprising any one of a printed substrate according to any one of the twenty-eighth through the thirty-second inventions, an amplification device according to the thirty-third invention, a distribution device according to the thirty-fourth invention, a composition device according to the thirty-fifth invention, and a switchover device according to the thirty-sixth invention.

According to the signal transmission device in a communication system of the above described structure, it is possible to suppress spurious signal transmission in the signal which is transmitted.

Furthermore, the mobile station device in a mobile communication system of the thirty-ninth invention is characterized by comprising a signal reception device according to the twenty-eighth invention and a signal transmission device according to the thirty-eighth invention.

According to the mobile station device in a mobile communication system of the above described structure, even if, for example, an interference signal or the like is mixed in with the signal which is received, it is possible to extract only the desired signal. Furthermore, it is possible to suppress spurious signal transmission in the signal which is transmitted.

Furthermore, the base station device in a mobile communication system of the fortieth invention is characterized by comprising a signal reception device according to the thirty-seventh invention and a signal transmission device according to the thirty-eighth invention.

According to the base station device in a mobile communication system of the above described structure, even if, for example, an interference signal or the like is mixed in with the signal which is received, it is possible to extract only the desired signal. Furthermore, it is possible to suppress spurious signal transmission in the signal which is transmitted.

Furthermore, the wireless communication device of the forty-first invention (such as, for example, a wireless communication device 80 in an embodiment which will be described hereinafter) is characterized by comprising any one of a printed substrate according to any one of the twenty-eighth through the thirty-second inventions, an amplification device according to the thirty-third invention, a distribution device according to the thirty-fourth invention, a composition device according to the thirty-fifth invention, a switchover device according to the thirty-sixth invention, a signal reception device according to the thirty-seventh invention, a signal transmission device according to the thirty-eighth invention, a mobile station device according to the thirty-ninth invention, and a base station device according to the fortieth invention.

According to the wireless communication device of the above described structure, even if, for example, an interference signal or the like is mixed in with the signal which is received, it is possible to extract only the desired signal. Furthermore, it is possible to suppress spurious signal transmission in the signal which is transmitted.

In order to solve the above described problems and to achieve the second related objective, the electronic component comprising a shield structure of the forty-second invention is characterized by comprising: a printed substrate (such as, for example, a printed substrate 312 in an embodiment which will be described hereinafter) comprising a fitting region (such as, for example, a fitting region 313 in an embodiment which will be described hereinafter) for mounting a filter; a filter (such as, for example, a SAW filter 311 in an embodiment which will be described hereinafter) which is mounted in said fitting region of said printed substrate; and a protective member (such as, for example, a protective member 315 in an embodiment which will be described hereinafter) which comprises a conductive surface (such as, for example, electrically conductive coating surfaces 315A, 315B in an embodiment which will be described hereinafter), and which is in contact with a surface (such as, for example, a surface 311A in an embodiment which will be described hereinafter) of said filter; and in that: said conductive surface of said protective member (such as, for example, the electrically conductive coating surface 315A in an embodiment which will be described hereinafter) which is in contact with the surface of said filter is set so as to be of the same size as said surface of said filter, or so as to be smaller than the surface of said filter.

According to the electronic component comprising a shield structure of the above described structure, by the size of the surface of the protective member which is in contact with the surface of the filter and which covers this surface of the filter being made to be the same as the size of the surface of the filter, or being made to be smaller than the surface of the filter, the undesirable propagation of the input signal which is inputted to the filter over, for example, the space on top of the surface of the filter or over the printed substrate or the like is suppressed, and, along with it being possible reliably to establish transmission within the filter, it is possible reliably to suppress the influence of electromagnetic waves or of noise from the outside. Due to this, it is possible to prevent deterioration of the attenuation characteristic of the filter for the input signal which is inputted to the filter.

Furthermore, the electronic component comprising a shield structure of the forty-third invention is characterized by further comprising a shield box (such as, for example, a shield frame member 316 and a shield lid member 317 in an embodiment which will be described hereinafter) which covers said filter and said protective member, and in that said conductive surface of said protective member (such as, for example, an electrically conductive coating surface 315B in an embodiment which will be described hereinafter) is in contact with the inner surface (such as, for example, an inner surface 317A in an embodiment which will be described hereinafter) of said shield box.

According to the electronic component comprising a shield structure of the above described structure, by the protective member which is arranged so as to be in contact with the surface of the filter being furthermore set up so as to be in contact with the inner surface of the shield box, the undesirable propagation of the input signal which is inputted to the filter over, for example, the space on top of the surface of the filter or over the printed substrate or the like is suppressed, and, along with it being possible reliably to establish transmission within the filter, it is possible reliably to suppress the influence of electromagnetic waves or of noise from the outside. Due to this, it is possible to prevent deterioration of the attenuation characteristic of the filter for the input signal which is inputted to the filter by yet a further level.

Furthermore, with the electronic component comprising a shield structure of the forty-fourth invention, said protective member is characterized by being capable of elastic deformation, and in that the thickness of said protective member when it has been elastically deformed in the state in which the conductive surface of said protective member is in contact with the surface of said filter and the inner surface of said shield box is set so as to be 50% to 80% of its thickness in the natural state.

According to the electronic component comprising a shield structure of the above described structure, it is possible to prevent positional deviation or the like of the protective member which is arranged so as to be in contact with the surface of the filter and with the inner surface of the shield box, and it is possible to obtain the desired attenuation characteristic of the filter in a stable manner and with good repeatability.

Here, if for example the thickness of the protective member in its elastically deformed state is less than 50% of its thickness in its natural state, then the weight which is required for maintaining the protective member in its elastically deformed state becomes excessively large, and there is a fear that damage to the filter or the like may occur; while, conversely, if the thickness of the protective member in its elastically deformed state is greater than 80% of its thickness in its natural state, then it becomes impossible to prevent positional deviation or the like of the protective member.

Moreover, with the protective member in its elastically deformed state, by setting the size of the surface of the protective member which covers the surface of the filter to be the same as the size of the surface of the filter, or to be smaller than the surface of the filter, it is possible to prevent the formation of a portion which is depressed in the downwards direction from the surface of the filter, or the formation of a portion which projects towards the outside from above the surface of the filter, or the like; and thus it is possible reliably to prevent deterioration of the attenuation characteristic of the filter with regard to the input signal which is inputted to the filter.

Furthermore, with the electronic component comprising a shield structure of the forty-fifth invention, said protective member is characterized by being formed in a roughly circular pillar shape, and in that the axial line direction of said protective member is arranged so as to be parallel to the transmission direction (such as, for example, a transmission direction P in an embodiment which will be described hereinafter) of the input signal in said filter.

According to the electronic component comprising a shield structure of the above described structure, the undesirable propagation of the input signal which is inputted to the filter over, for example, the space on top of the surface of the filter or over the printed substrate or the like is suppressed, and, along with it being possible reliably to establish transmission within the filter, it is possible reliably to suppress the influence of electromagnetic waves or of noise from the outside. Due to this, it is possible reliably to prevent deterioration of the attenuation characteristic of the filter for the input signal which is inputted to the filter.

Furthermore, with the electronic component comprising a shield structure of the forty-sixth invention, said protective member is characterized by being formed in a roughly circular pillar shape, and in that the axial line direction of said protective member is arranged so as to intersect with the transmission direction (such as, for example, a transmission direction P in an embodiment which will be described hereinafter) of the input signal in said filter.

According to the electronic component comprising a shield structure of the above described structure, the undesirable propagation of the input signal which is inputted to the filter over, for example, the space on top of the surface of the filter or over the printed substrate or the like is suppressed, and, along with it being possible reliably to establish transmission within the filter, it is possible reliably to suppress the influence of electromagnetic waves or of noise from the outside. Due to this, it is possible reliably to prevent deterioration of the attenuation characteristic of the filter for the input signal which is inputted to the filter by yet a further level.

Furthermore, with the electronic component comprising a shield structure of the forty-seventh invention, said filter is characterized by utilizing langasite as its piezoelectric element, and in that it allows signals of a predetermined frequency band to pass by taking advantage of surface elastic waves which are transmitted along the surface of said piezoelectric element.

According to the electronic component comprising a shield structure of the above described structure, it is possible to prevent deterioration of the attenuation characteristic of the filter with respect to the input signal; and, as compared to a SAW filter which utilizes, for example, quartz or the like as its piezoelectric element, it is possible reliably to obtain a higher desired attenuation characteristic.

Furthermore, the amplification device in a communication system of the forty-eighth invention (such as, for example, an amplification device 320 in an embodiment which will be described hereinafter) is characterized by comprising an electronic component according to any one of the forty-second through the forty-seventh inventions.

According to the amplification device in a communication system of the above described structure, even if noise is mixed in with the input signal, it is possible to amplify and to transmit only the desired signal.

Furthermore, the distribution device in a communication system of the forty-ninth invention (such as, for example, a distribution device 330 in an embodiment which will be described hereinafter) is characterized by comprising any one of an electronic component according to any one of the forty-second through the forty-seventh inventions, and an amplification device according to the forty-eighth invention.

According to the distribution device in a communication system of the above described structure, even if noise is mixed in with the input signal, it is possible to distribute and to transmit only the desired signal.

Furthermore, the composition device in a communication system of the fiftieth invention (such as, for example, a composition device 340 in an embodiment which will be described hereinafter) is characterized by comprising any one of an electronic component according to any one of the forty-second through the forty-seventh inventions, and an amplification device according to the forty-eighth invention.

According to the composition device in a communication system of the above described structure, even if noise is mixed in with the input signal, it is possible to combine and to transmit only the desired signal.

Furthermore, the switchover device in a communication system of the fifty-first invention (such as, for example, a switchover device 350 in an embodiment which will be described hereinafter) is characterized by comprising any one of an electronic component according to any one of the forty-second through the forty-seventh inventions, and an amplification device according to the forty-eighth invention.

According to the switchover device in a communication system of the above described structure, for example, a first transmission line which conducts an input signal to a printed substrate or to an amplification device and a second transmission line or the like over which only, for example, an input signal is simply allowed to pass are provided, and it becomes possible to perform many types of processing with respect to the input signal by switching over and utilizing either of these transmission lines.

For example, if the noise which is mixed in with the input signal is high, or the like, the band of the input signal is limited by utilizing the first transmission line, and only the desired signal is transmitted; while, if for example band limitation is not required, then the second transmission line is utilized.

Furthermore, the signal reception device in a communication system of the fifty-second invention (such as, for example, a signal reception device 360 in an embodiment which will be described hereinafter) is characterized by comprising any one of an electronic component according to any one of the forty-second through the forty-seventh inventions, an amplification device according to the forty-eighth invention, a distribution device according to the forty-ninth invention, a composition device according to the fiftieth invention, and a switchover device according to the fifty-first invention.

According to the signal reception device in a communication system of the above described structure, even if, for example, an interference signal or the like is mixed in with the signal which is received, it is possible to extract only the desired signal.

Furthermore, the signal transmission device in a communication system of the fifty-third invention (such as, for example, a signal transmission device 370 in an embodiment which will be described hereinafter) is characterized by comprising any one of an electronic component according to any one of the forty-second through the forty-seventh inventions, an amplification device according to the forty-eighth invention, a distribution device according to the forty-ninth invention, a composition device according to the fiftieth invention, and a switchover device according to the fifty-first invention.

According to the signal transmission device in a communication system of the above described structure, it is possible to suppress spurious signal transmission in the signal which is transmitted.

Furthermore, the mobile station device in a mobile communication system of the fifty-fourth invention is characterized by comprising a signal reception device according to the fifty-second invention and a signal transmission device according to the fifty-third invention.

According to the mobile station device in a mobile communication system of the above described structure, even if, for example, an interference signal or the like is mixed in with the signal which is received, it is possible to extract only the desired signal. Furthermore, it is possible to suppress spurious signal transmission in the signal which is transmitted.

Furthermore, the base station device in a mobile communication system of the fifty-fifth invention is characterized by comprising a signal reception device according to the fifty-second invention and a signal transmission device according to the fifty-third invention.

According to the base station device in a mobile communication system of the above described structure, even if, for example, an interference signal or the like is mixed in with the signal which is received, it is possible to extract only the desired signal.

Furthermore, it is possible to suppress spurious signal transmission in the signal which is transmitted.

Furthermore, the wireless communication device of the fifty-sixth invention (such as, for example, a wireless communication device 380 in an embodiment which will be described hereinafter) is characterized by comprising any one of an electronic component according to any one of the forty-second through the forty-seventh inventions, an amplification device according to the forty-eighth invention, a distribution device according to the forty-ninth invention, a composition device according to the fiftieth invention, a switchover device according to the fifty-first invention, a signal reception device according to the fifty-second invention, a signal transmission device according to the fifty-third invention, a mobile station device according to the fifty-fourth invention, and a base station device according to the fifty-fifth invention, and by performing wireless communication.

According to the wireless transmission device of the above described structure, even if, for example, an interference signal or the like is mixed in with the signal which is received, it is possible to extract only the desired signal. Furthermore, it is possible to suppress spurious signal transmission in the signal which is transmitted.

BRIEF DESCRIPTION OF THE DRAWINGS

FIG. 63 is a structural figure showing a wireless communication device which comprises an electronic component according to an embodiment of the present invention.

PREFERRED EMBODIMENTS FOR IMPLEMENTING THE INVENTION

The First Preferred Embodiment

Figure 1:
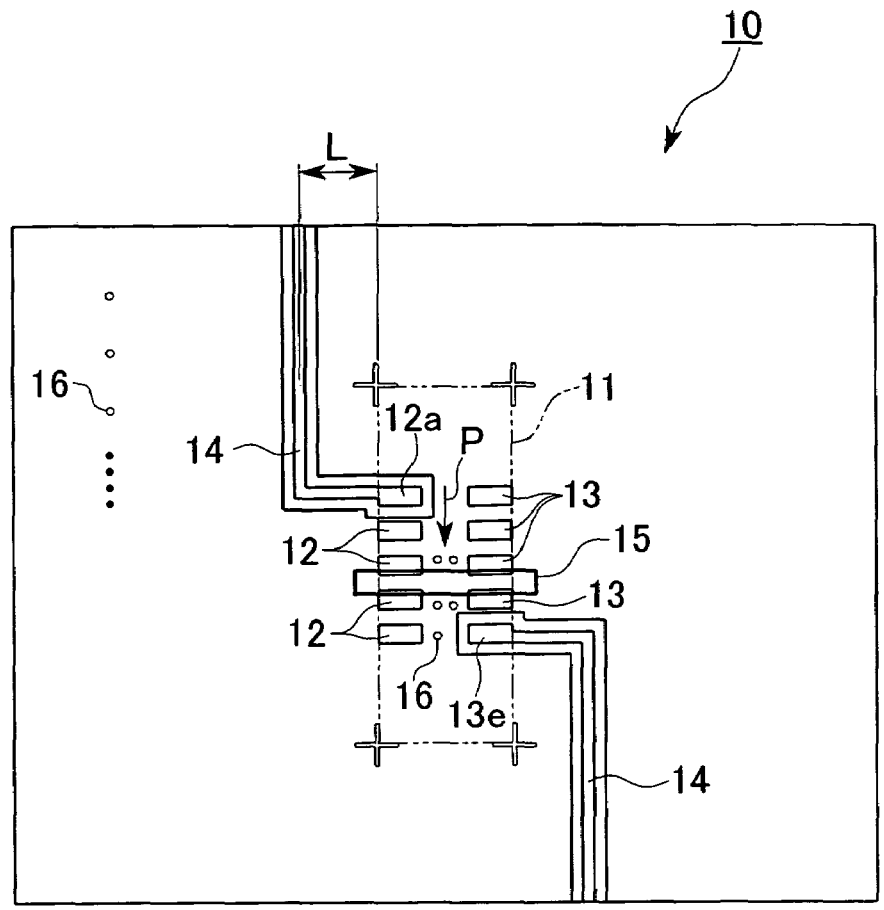
FIG. 1 is a plan view of a printed substrate according to an embodiment of the present invention.

In the following, a printed substrate according to a first embodiment of the present invention will be explained with reference to the appended drawings. FIG. 1 is a plan view of a printed substrate 10 (an electronic component) according to a first embodiment of the present invention.

The printed substrate 10 according to the first embodiment is one which is equipped with a SAW filter which includes, for example, langasite ($La_3Ga_5SiO_{14}$) as its piezoelectric element, and, as shown in FIG. 1, it comprises, in a fitting region 11 for an SAW filter which is for example shaped as a rectangle or the like as seen in plan view, a plurality of pairs (for example 5 pairs) of terminal electrodes which are exposed at their two mutually opposing long sides, in other words input side terminal electrodes 12, . . . 12 and output side terminal electrodes 13, . . . 13 which constitute pairs.

It should be understood that, with these terminal electrodes 12, . . . 12 and 13, . . . 13, only one pair of an input side terminal electrode 12 and an output side terminal electrode 13 (for example the input side terminal electrode 12a and the output side terminal electrode 13e shown in FIG. 1) which are opposed in, for example, the diagonal direction are connected to the input terminal and the output terminal of the SAW filter, while the other terminal electrodes 12, . . . 12 and 13, . . . 13 are connected to ground. In other words, the transmission direction P of the frequency signal which is inputted within the SAW filter is made to be, for example, the direction parallel to the long side.

Micro strip lines 14, 14 are connected to the input side terminal electrode 12a and the output side terminal electrode 13e which are connected to the input terminal and to the output terminal of the SAW filter.

The micro strip lines 14, 14 which are connected to the terminal electrodes 12a, 13e are bent into, for example, letter "L" shapes, and they are provided at positions which are separated by just a predetermined distance #L (for example 10 mm or the like) from the fitting region 11 of the SAW filter (in other words, at elbow positions), so as to extend in mutually opposite directions, and along directions which are parallel to the transmission direction P of the frequency signal within the SAW filter.

It should be understood that, in the following, the distances from the fitting region 11 of the SAW filter to the elbow positions are taken as being the distances L of the micro strip lines.

Furthermore, in the fitting region 11 of the SAW filter, a slit 15 is provided which extends along a direction which intersects with the transmission direction P of the frequency signal within the SAW filter (for example, in the direction orthogonal thereto).

This slit 15 is made as, for example, a rectangular shaped through hole as seen in cross sectional view, and it is provided, in the vicinity of the central portion of the fitting region of the SAW filter, between predetermined mutually adjoining ones of the terminal electrodes 12, 12 and 13, 13.

Furthermore, in the fitting region 11 of the SAW filter, there are provided a plurality of through holes 16, . . . 16 of a predetermined diameter (for example, of diameter 0.3 mm or the like) between adjoining ones of the terminal electrodes 12, 12 and 13, 13 and between opposing terminal electrodes 12, 13; and an electrically conductive material is provided within each of these through holes 16, for electrically connecting together the surface of the printed substrate 10 and its rear surface, which is connected to ground.

Furthermore, upon the portions of the printed substrate 10 other than the fitting region 11 for the SAW filter, there are provided a plurality of through holes 16, . . . 16 of a predetermined diameter (for example, of diameter 0.5 mm or the like) at a predetermined interval (for example, 2 to 3 mm or the like).

The printed substrate 10 according to the first embodiment has the above described structure.

When a SAW filter (not shown in the figures) is fitted to this printed substrate 10, and a frequency signal is transmitted through the SAW filter via the input side terminal electrode 12a and the output side terminal electrode 13e, by providing the slit 15 within the fitting region 11 for the SAW filter, then it is possible to prevent the frequency signal which is inputted, for example, from the input side terminal electrode 12*a* from being undesirably transmitted directly to the output side terminal electrode 13*e*.

In other words, after the frequency signal which is inputted from the input side terminal electrode 12*a* has been transmitted through the SAW filter from the input terminal of the SAW filter to its output terminal, then, in order for this signal to arrive at the output side terminal electrode 13*e*, it is arranged for the desired band transmission processing to be performed within the SAW filter.

By doing this, it is possible to prevent deterioration of the attenuation characteristic of the SAW filter which is fitted to the printed substrate 10.

As described above, according to the printed substrate 10 according to the first embodiment, it is possible to prevent deterioration of the attenuation characteristic of the SAW filter which is fitted, and, even in the case of a SAW filter which includes, for example, langasite as its piezoelectric element, it is possible reliably to obtain the desired attenuation characteristic.

In the following, an example of the test results for the attenuation characteristic when a SAW filter which includes langasite as its piezoelectric element is fitted to the printed substrate 10 according to the first embodiment will be explained while referring to the appended drawings.

Figure 2:
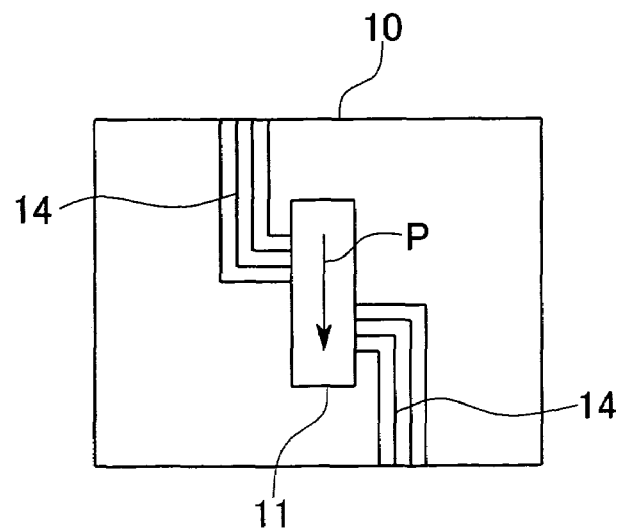
FIG. 2 is a schematic view showing the shape of a micro strip line of the printed substrate.
Figure 3:
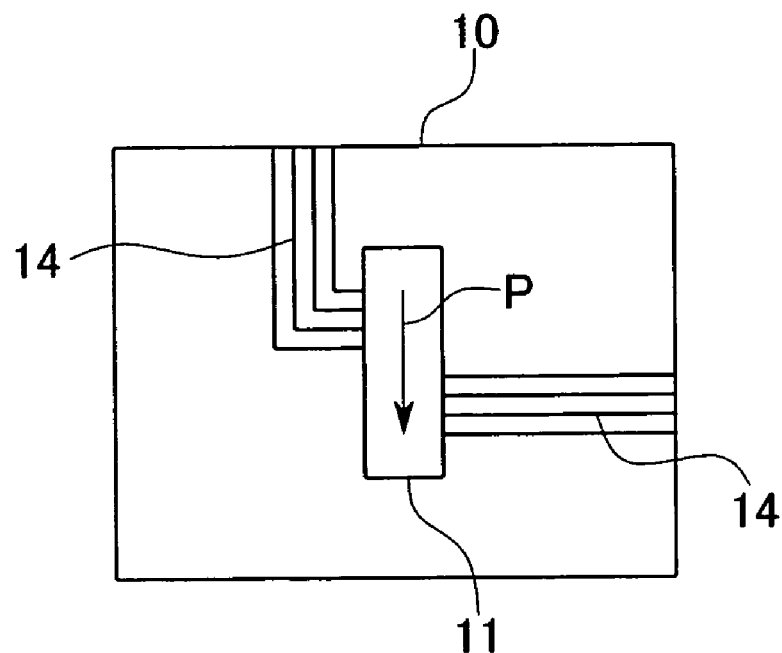
FIG. 3 is a schematic view showing the shape of a micro strip line of the printed substrate.
Figure 4:
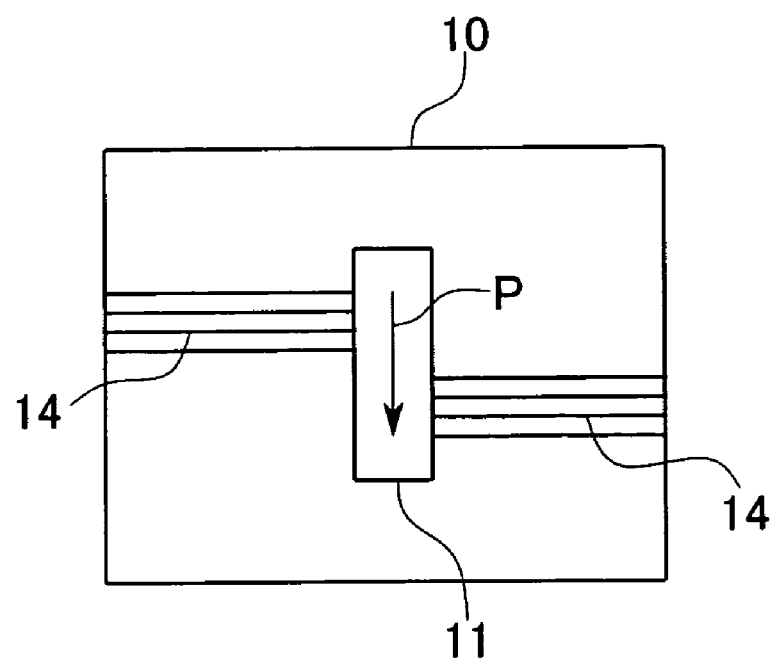
FIG. 4 is a schematic view showing the shape of a micro strip line of the printed substrate.
Figure 5:
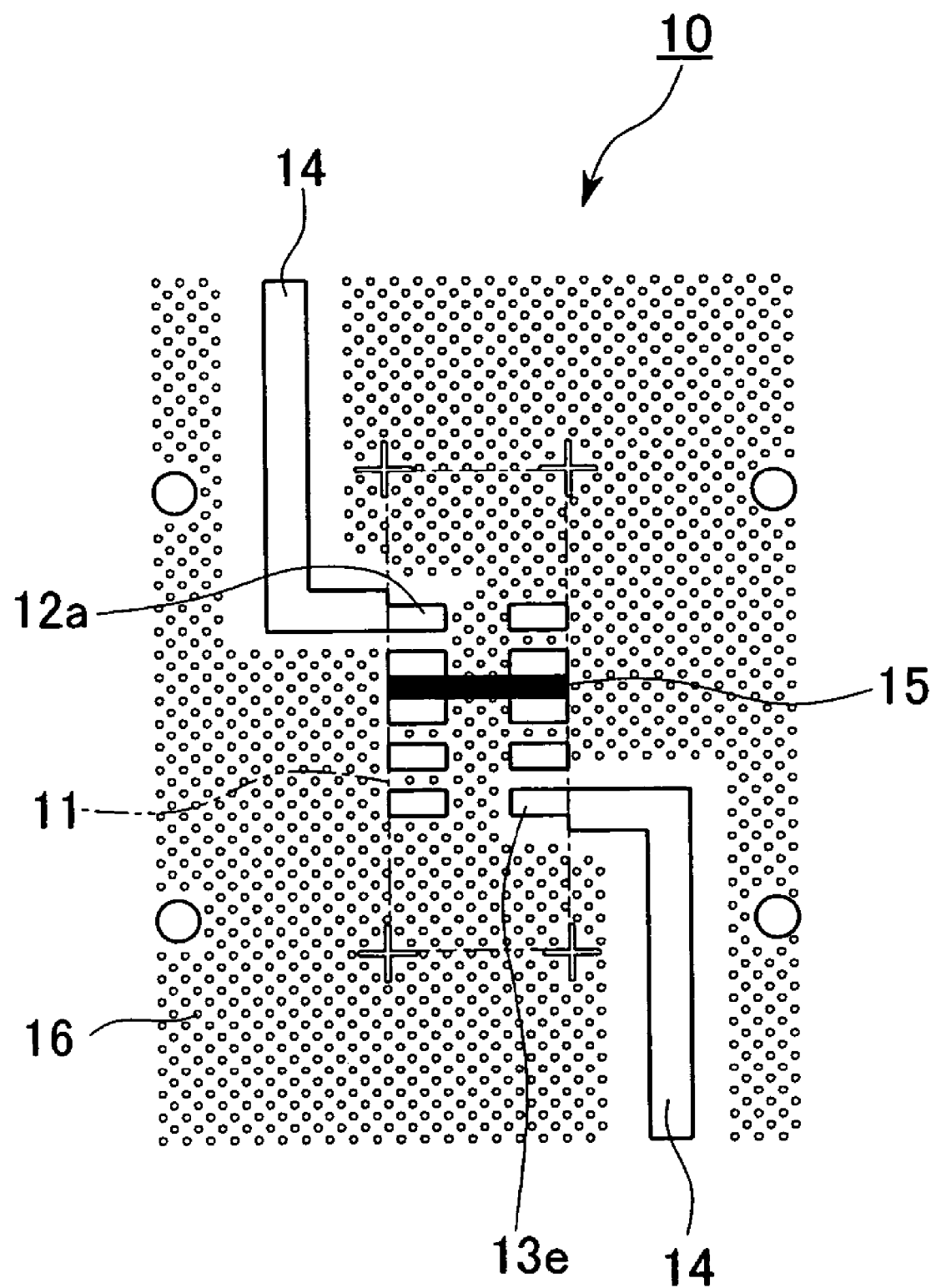
FIG. 5 is a plan view showing the shape of a slit of a printed substrate according to the first embodiment.
Figure 6:
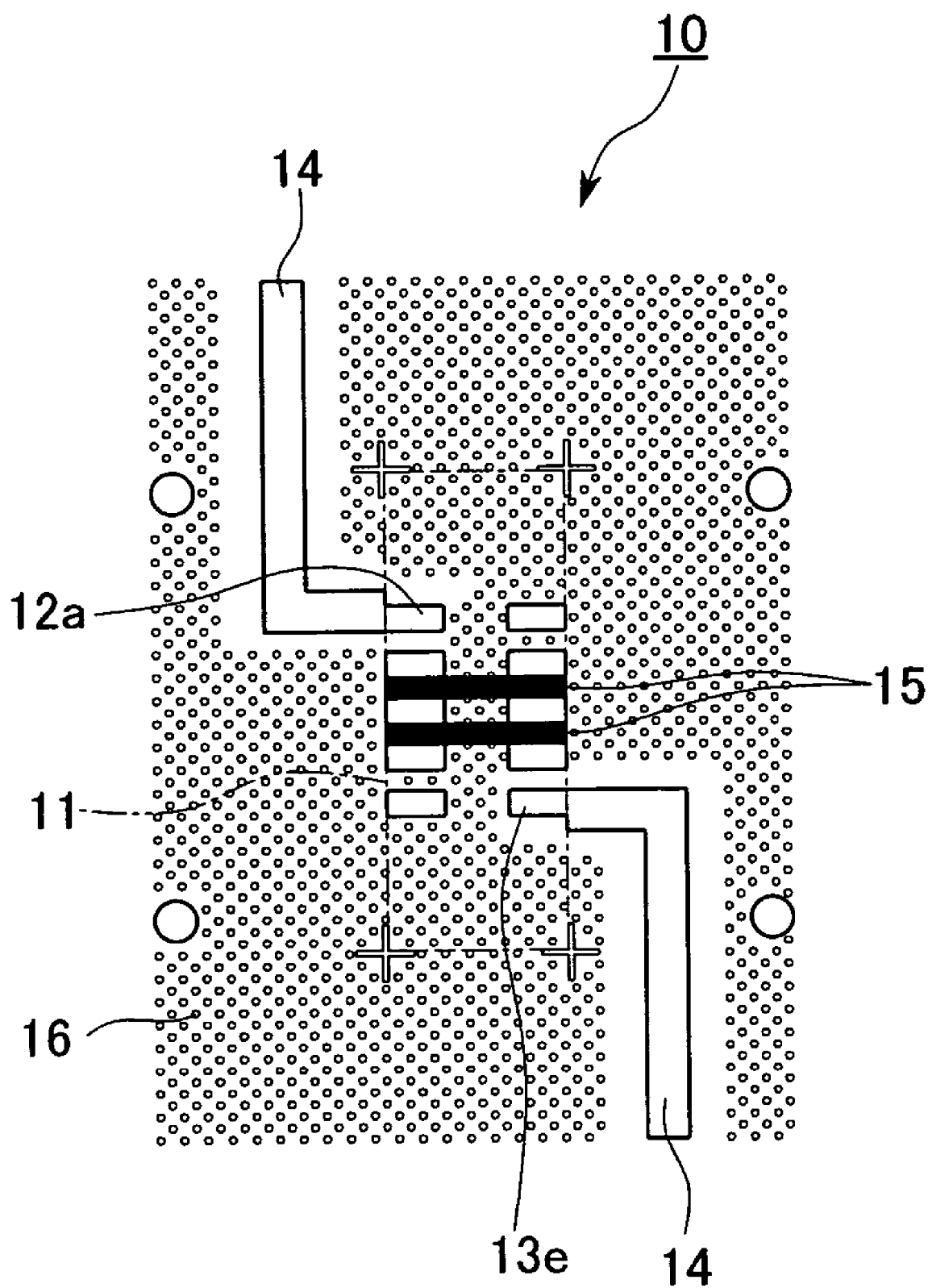
FIG. 6 is a plan view showing the shape of a slit of a printed substrate according to the second embodiment.
Figure 7:
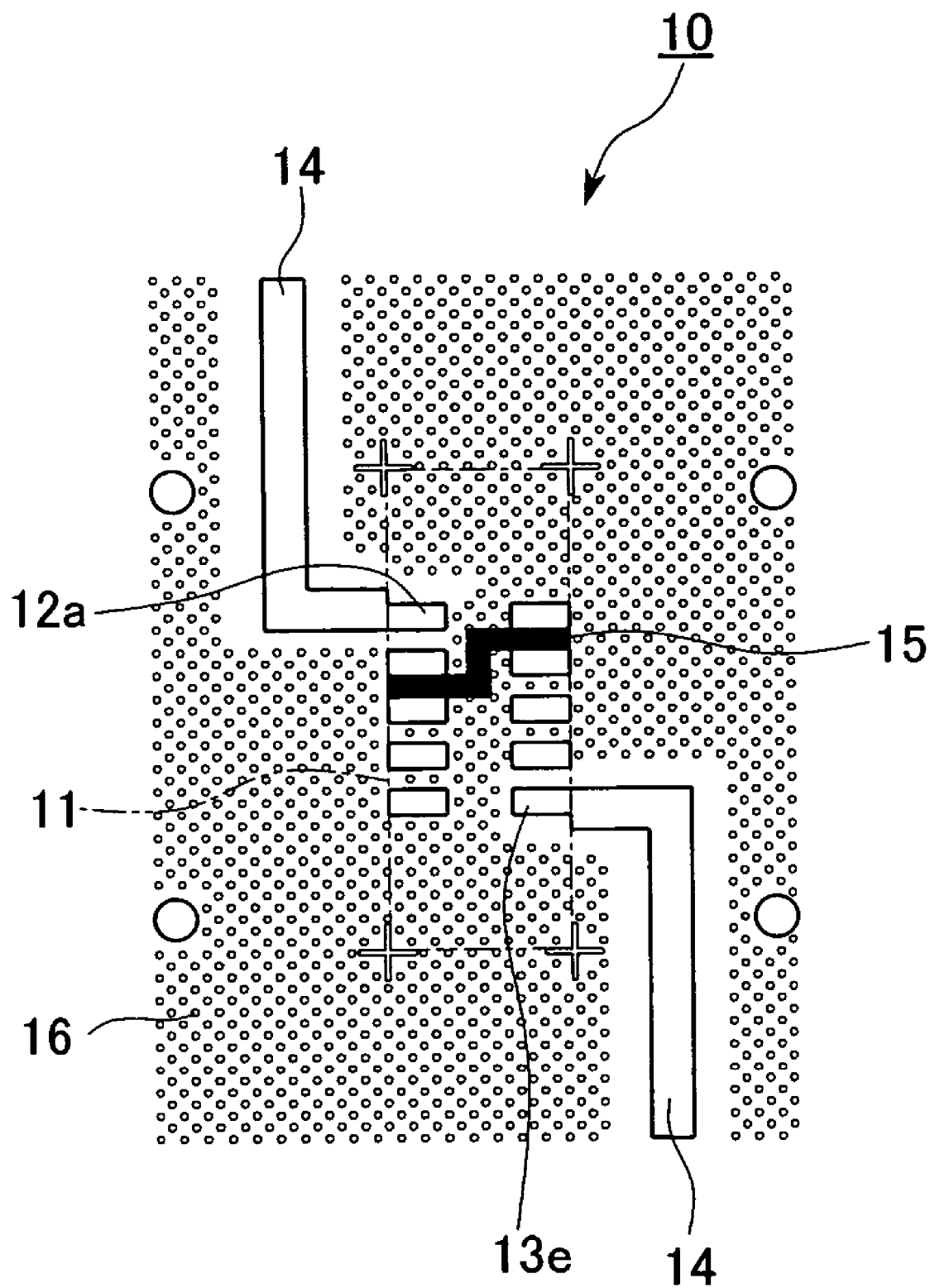
FIG. 7 is a plan view showing the shape of a slit of a printed substrate according to the third embodiment.

FIGS. 2 through 4 are schematic views showing the shape of the micro strip line 14 of the printed substrate 10; FIG. 5 is a plan view showing the shape of a slit 15 of the printed substrate 10 according to the first embodiment; FIG. 6 is a plan view showing the shape of a slit 15 of a printed substrate 10 according to the second embodiment; FIG. 7 is a plan view showing the shape of a slit 15 of a printed substrate 10 according to the third embodiment; and FIG. 8 is a plan view of a printed substrate according to a first comparison example.

Figure 8:
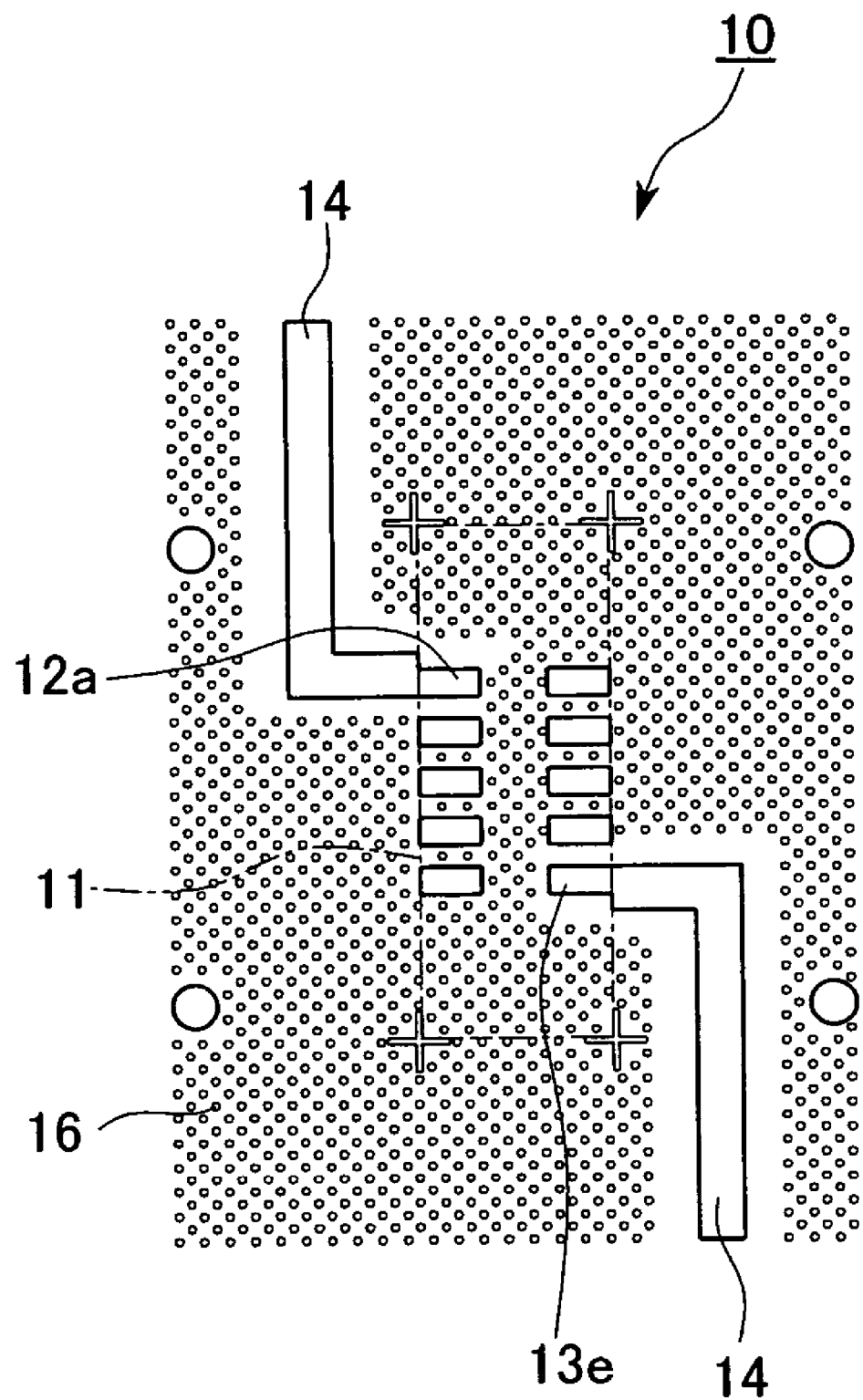
FIG. 8 is a plan view of a printed substrate according to a first comparison example.

It should be understood that, in the following, a printed substrate 10 which was provided with a single slit 15 as shown in FIG. 5 was taken as the first embodiment, a printed substrate 10 which was provided with two slits 15 as shown in FIG. 6 was taken as the second embodiment, a printed substrate 10 which was provided with a crank shaped slit 15 as shown in FIG. 7 was taken as the third embodiment, and a printed substrate 10 as shown in FIG. 8 in which no slit was provided was taken as the comparison example.

In the following, the manner will be explained in which the attenuation characteristic was tested when a SAW filter was fitted to the printed substrates of the first through the third embodiments and a comparison example.

First, as shown in the Table 1 given below, for the first through the third embodiments and the comparison example, a plurality of printed substrates were manufactured with different shapes and lengths of the micro strip lines 14, 14, and different positions and numbers and diameters of the through holes 16, . . . 16.

TABLE 1

| | MICRO STRIP LINE SHAPE | MICRO STRIP LINE LENGTH | THROUGH HOLES | SLIT SHAPE | ATTEN-UATION |
|---|---|---|---|---|---|
| TYPE 1 | HORIZONTAL (INPUT SIDE) \| HORIZONTAL (OUTPUT SIDE) | 20 mm (INPUT AND OUTPUT) | φ0.3, 0.5 | NO SLIT | 46 dB |
| | | | | TWO SLITS | 48 dB |
| | | | | CRANK | 50 dB |
| | | | | ONE SLIT | 50 dB |
| TYPE 2 | VERTICAL (INPUT SIDE) \| HORIZONTAL (OUTPUT SIDE) | 3 mm (INPUT)-20 mm (OUTPUT) | φ0.3, 0.5 | NO SLIT COMPARISON EXAMPLE | 53 dB |
| | | 5 mm (INPUT)-20 mm (OUTPUT) | | | 53 dB |
| | | 10 mm (INPUT)-20 mm (OUTPUT) | | | 53 dB |
| | | 15 mm (INPUT)-20 mm (OUTPUT) | | | 50 dB |
| | | 3 mm (INPUT)-20 mm (OUTPUT) | | TWO SLITS SECOND EMBODIMENT | 54 dB |
| | | 5 mm (INPUT)-20 mm (OUTPUT) | | | 54 dB |
| | | 10 mm (INPUT)-20 mm (OUTPUT) | | | 53 dB |
| | | 15 mm (INPUT)-20 mm (OUTPUT) | | | 52 dB |
| | | 3 mm (INPUT)-20 mm (OUTPUT) | | CRANK THIRD EMBODIMENT | 56 dB |
| | | 5 mm (INPUT)-20 mm (OUTPUT) | | | 55 dB |
| | | 10 mm (INPUT)-20 mm (OUTPUT) | | | 55 dB |
| | | 15 mm (INPUT)-20 mm (OUTPUT) | | | 51 dB |
| | | 3 mm (INPUT)-20 mm (OUTPUT) | | ONE SLIT FIRST EMBODIMENT | 60 dB |
| | | 5 mm (INPUT)-20 mm (OUTPUT) | | | 60 dB |
| | | 10 mm (INPUT)-20 mm (OUTPUT) | | | 59 dB |
| | | 15 mm (INPUT)-20 mm (OUTPUT) | | | 51 dB |
| TYPE 3 | VERTICAL (INPUT SIDE) \| HORIZONTAL (OUTPUT SIDE) | 3 mm(INPUT AND OUTPUT) | φ0.3, 0.5 | NO SLIT COMPARISON EXAMPLE | 58 dB |
| | | 5 mm(INPUT AND OUTPUT) | | | 58 dB |
| | | 10 mm(INPUT AND OUTPUT) | | | 58 dB |
| | | 15 mm(INPUT AND OUTPUT) | | | 55 dB |
| | | 3 mm(INPUT AND OUTPUT) | | TWO SLITS SECOND EMBODIMENT | 66 dB |
| | | 5 mm(INPUT AND OUTPUT) | | | 65 dB |
| | | 10 mm(INPUT AND OUTPUT) | | | 65 dB |
| | | 15 mm(INPUT AND OUTPUT) | | | 62 dB |
| | | 3 mm(INPUT AND OUTPUT) | | CRANK THIRD EMBODIMENT | 68 dB |
| | | 5 mm(INPUT AND OUTPUT) | | | 68 dB |
| | | 10 mm(INPUT AND OUTPUT) | | | 66 dB |
| | | 15 mm(INPUT AND OUTPUT) | | | 62 dB |
| | | 3 mm(INPUT AND OUTPUT) | | ONE SLIT FIRST EMBODIMENT | 71 dB |
| | | 5 mm(INPUT AND OUTPUT) | | | 70 dB |
| | | 10 mm(INPUT AND OUTPUT) | | | 70 dB |
| | | 15 mm(INPUT AND OUTPUT) | | | 65 dB |

And, solder was adhered in predetermined positions upon each of the printed substrates, and the SAW filters were mounted upon this solder, and the SAW filters and the printed substrates were joined together by heating them up to, for example, 220° C. And the attenuation characteristic of the SAW filters was measured.

As shown in Table 1, with regard to the shape of the micro strip lines 14, 14, in the first through the third embodiment and the first comparison example, it will be understood that the transmission characteristics are enhanced with the printed substrate of type 2 (for example, vertical (input side)—horizontal (output side) shown in Table 1) which has a micro strip line 14 which extends in a direction (for example, the "vertical" direction shown in Table 1) which is parallel with respect to the transmission direction P of the frequency signal within the SAW filter as shown in FIG. 3, as compared to the printed substrate of type 1 (for example, horizontal (input side)—horizontal (output side) shown in Table 1) in which the micro strip lines 14, 14 extend in a direction (for example, the "horizontal" direction shown in Table 1) which is orthogonal with respect to the transmission direction P of the frequency signal within the SAW filter as shown in FIG. 4.

Furthermore it will be understood that the attenuation characteristic is enhanced with the printed substrate of type 3 (for example, vertical (input side)—vertical (output side) shown in Table 1) in which, as shown in FIG. 2, the micro strip lines 14, 14 extend in a direction (for example, the "vertical" direction shown in Table 1) which is parallel with respect to the transmission direction P of the frequency signal within the SAW filter, as compared to the printed substrate of type 2 shown in FIG. 3.

Furthermore it is understood that, as shown for the printed substrates of type 2 and type 3 in Table 1, for the first through the third embodiment and the first comparison example, when the length L of the micro strip lines 14, 14 becomes longer than a predetermined length (for example, 10 mm or the like), the attenuation characteristic changes to a deteriorating tendency.

Furthermore, in the region in which the SAW filter is mounted, the through holes 16 of a predetermined diameter (for example, a diameter of 0.3 mm or the like) are formed between the mutually neighboring terminal electrodes 12 and 12, 12 and 13, and 13 and 13, while, upon the printed substrate outside this region, the through holes 16, . . . , 16 of a predetermined diameter (for example, a diameter of 0.5 mm or the like) are formed at predetermined intervals (for example, at intervals of 2 to 3 mm or the like).

Here, it will be understood that the attenuation characteristic is enhanced in the first through the third embodiment in which the slit 15 is provided, as compared with the first comparison example in which no slit is provided in the region in which the SAW filter is mounted. Furthermore, it will also be understood that the attenuation characteristic is enhanced in the case of the third embodiment in which a single crank shaped slit 15 was provided, as compared with the second embodiment in which two slits 15, 15 were provided; and that they are yet further enhanced by a still further degree in the case of the first embodiment in which a single slit 15 of a straight line form as compared with the third embodiment.

And it will be understood that an attenuation characteristic of the desired value (for example, 70 dB) is exhibited in the case, as shown in FIG. 2, of a printed substrate of the type 3 in which the micro strip lines 14, 14 extend in a direction which is parallel with respect to the transmission direction P of the frequency signal within the SAW filter, with the length L of these micro strip lines 14 being less than or equal to a predetermined length (for example, 10 mm or the like), and with through holes 16, . . . , 16 of a predetermined diameter (for example, of diameter 0.3 mm or the like) being formed in the region which carries the SAW filter between adjoining ones of the terminal electrodes 12 and 12, 12 and 13, and 13 and 13, and with through holes 16, . . . , 16 of a predetermined diameter (for example, of diameter 0.5 mm or the like) being formed in the printed substrate in regions other than this region at a predetermined interval (for example an interval of 2 to 3 mm or the like).

Furthermore, if the length of the slit 15 is extended in both directions from, for example, 1 mm to 10 mm, then it has been observed that the attenuation characteristic greatly deteriorates when the length of the slit 15 is, undesirably, greater than the length L of the micro strip lines 14.

Figure 9:
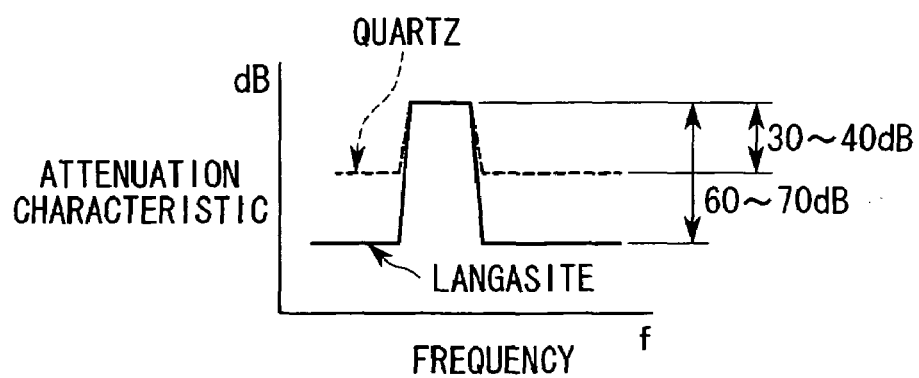
FIG. 9 is a figure showing the frequency characteristic of a SAW filter.

It should be understood that, as compared to the attenuation characteristic of a SAW filter which includes, for example, quartz as its piezoelectric element (for example, 30 to 40 dB or the like), according to the printed substrate 10 according to the above described first embodiment, as for example in the figure shown in FIG. 9 of the frequency characteristic of a SAW filter, it is possible to take advantage efficiently of the higher attenuation characteristic like the attenuation characteristic of a SAW filter which includes, for example, langasite ($La_3Ga_5SiO_{14}$) as its piezoelectric element (for example, 60 to 70 dB or the like).

In the following, an amplification device, a distribution device, a composition device, a switchover device, a signal reception device, and a signal transmission device which incorporate a printed substrate according to an embodiment of the present invention, a mobile station device and a base station device in a mobile communication system which incorporates said printed substrate, and a wireless communication device which incorporates said printed substrate, will be explained with reference to the appended drawings.

Figure 10:
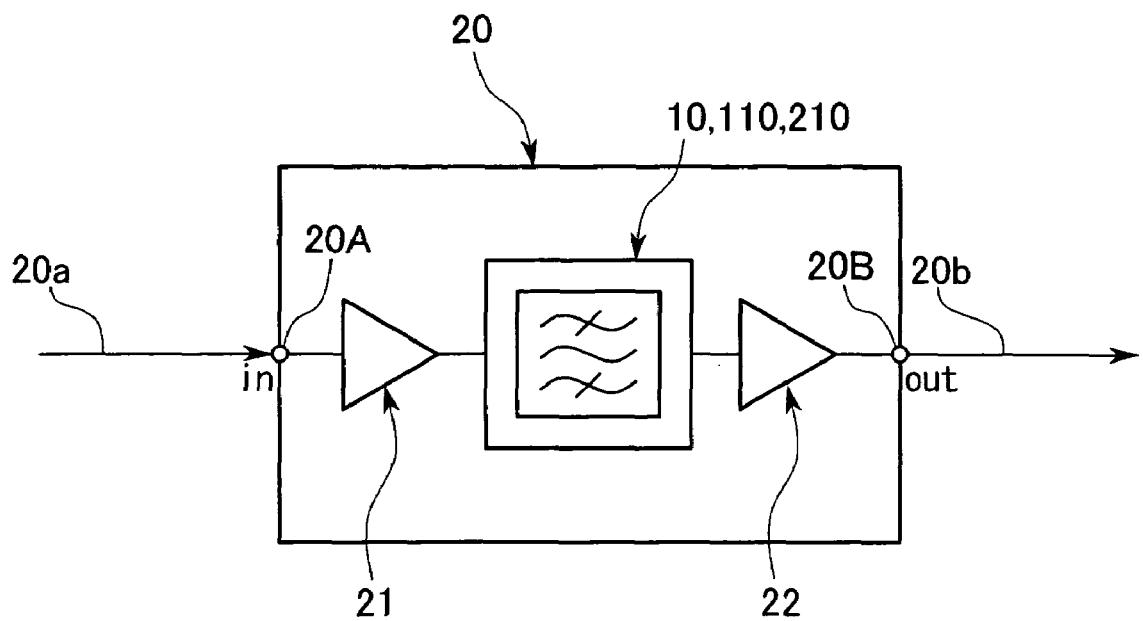
FIG. 10 is a structural figure showing an amplification device in a communication system which comprises a printed substrate according to an embodiment of the present invention.
Figure 11:
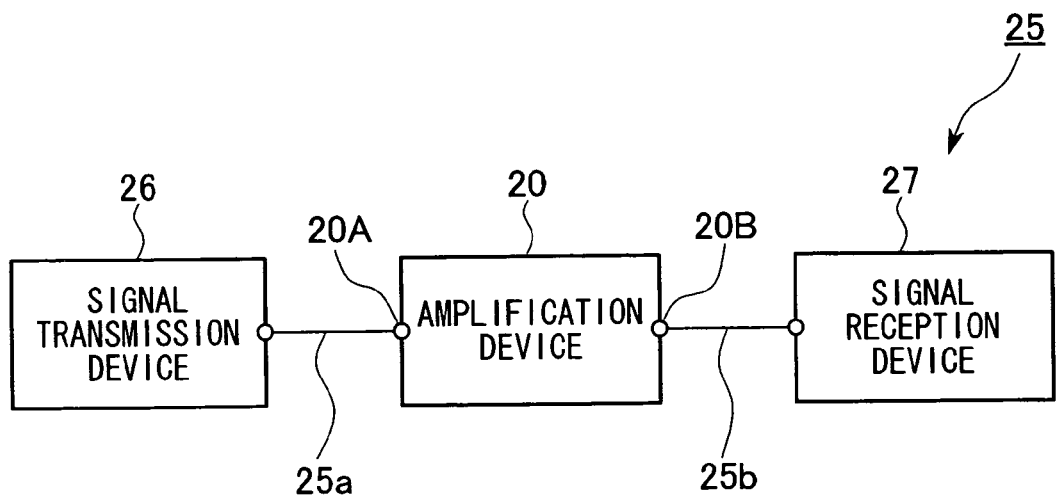
FIG. 11 is a structural view of a communication system which comprises the amplification device shown in FIG. 10.
Figure 12:
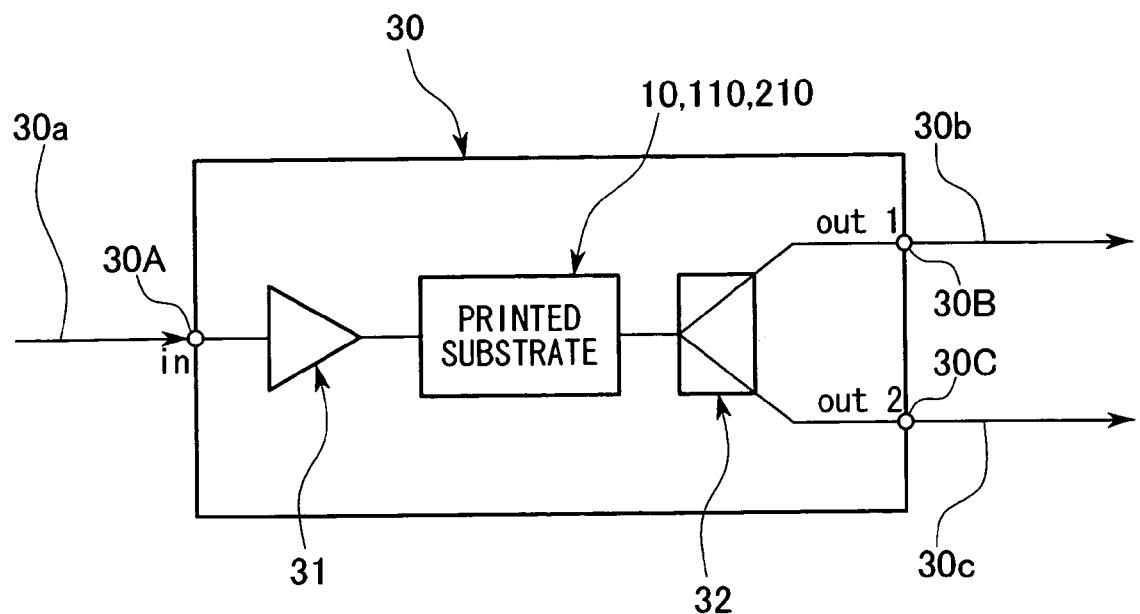
FIG. 12 is a structural figure showing a distribution device in a communication system which comprises a printed substrate according to an embodiment of the present invention.
Figure 13:
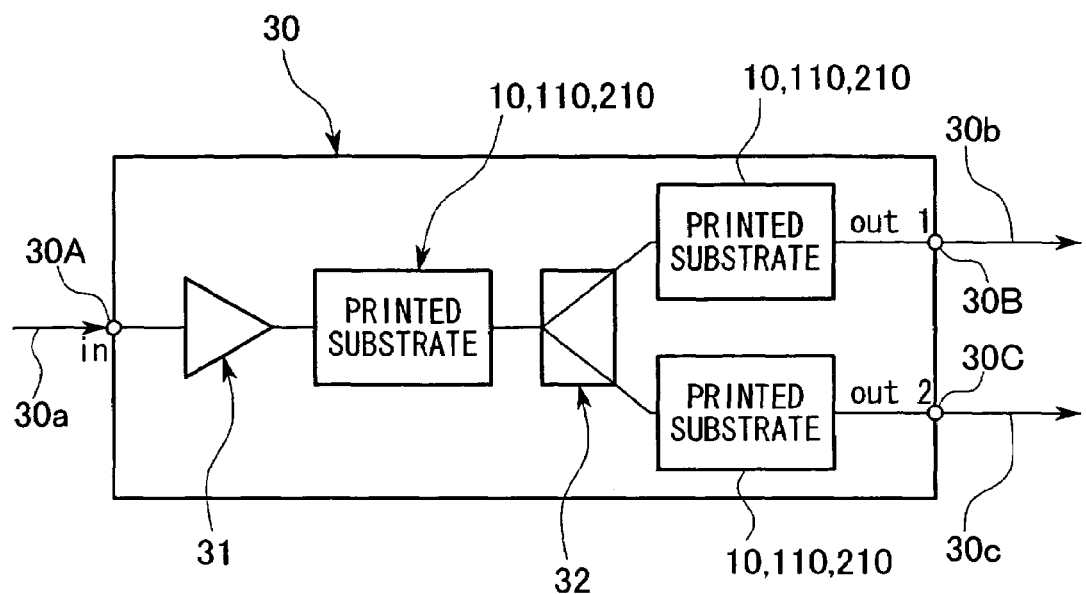
FIG. 13 is a structural figure showing a distribution device in a communication system which comprises a printed substrate according to an embodiment of the present invention.
Figure 14:
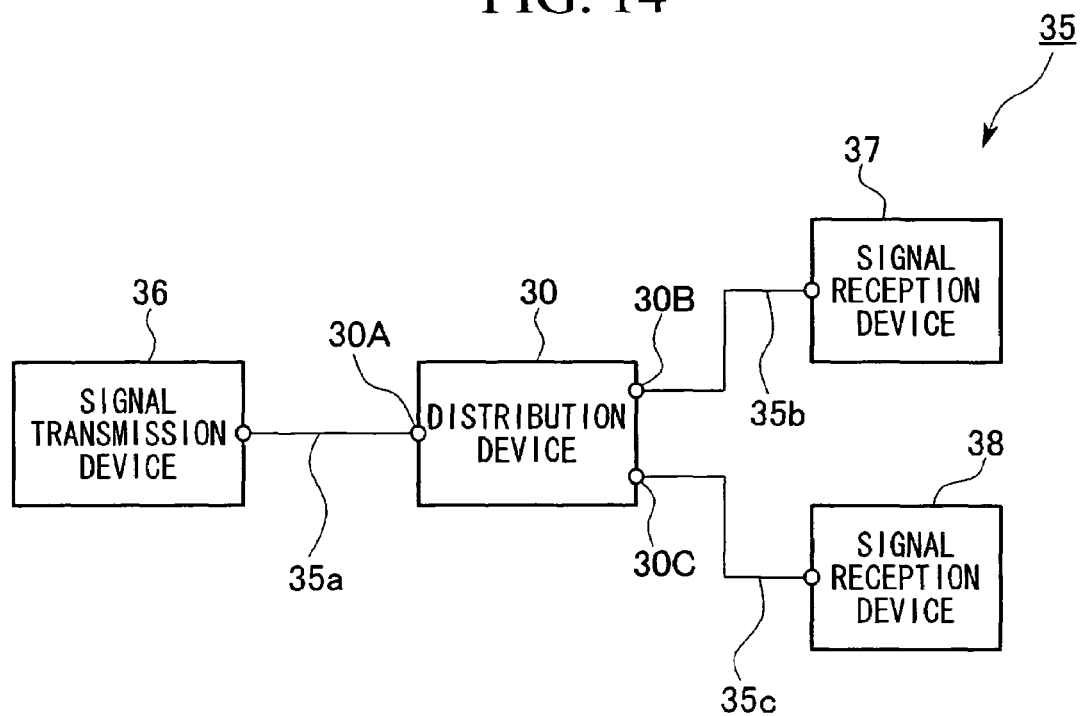
FIG. 14 is a structural view of a communication system which comprises the distribution device shown in FIG. 12 or FIG. 13.
Figure 15:
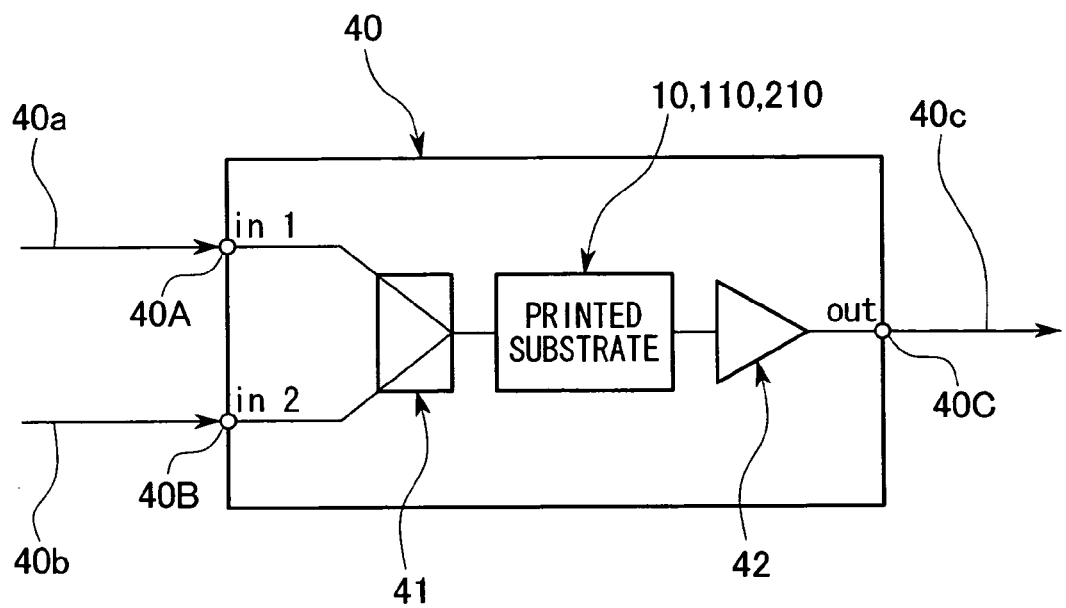
FIG. 15 is a structural figure showing a composition device in a communication system which comprises a printed substrate according to an embodiment of the present invention.
Figure 16:
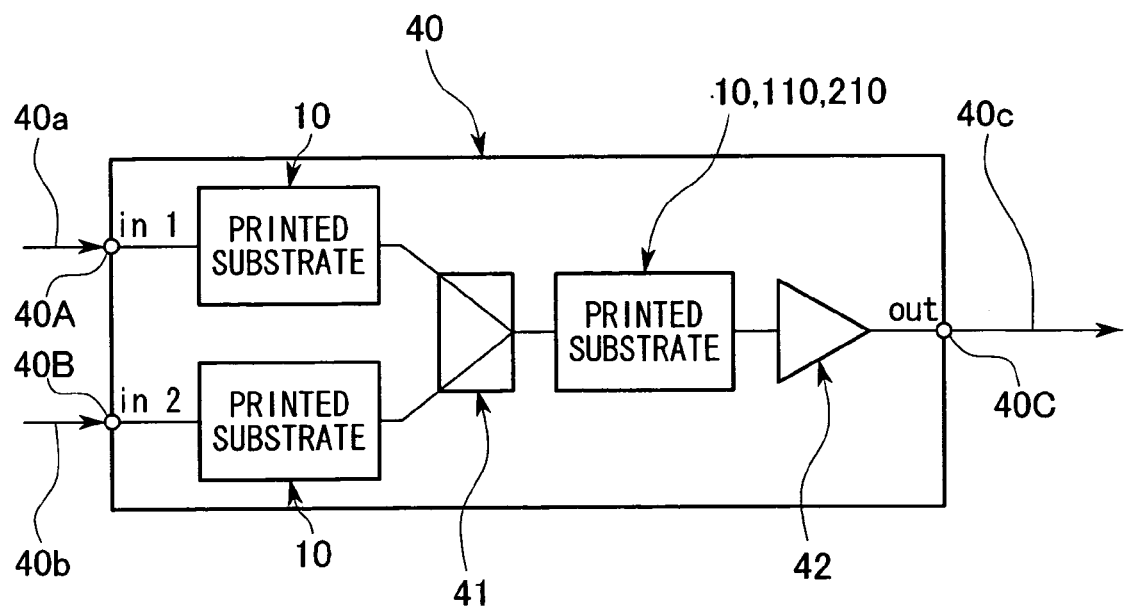
FIG. 16 is a structural figure showing a composition device in a communication system which comprises a printed substrate according to an embodiment of the present invention.
Figure 17:
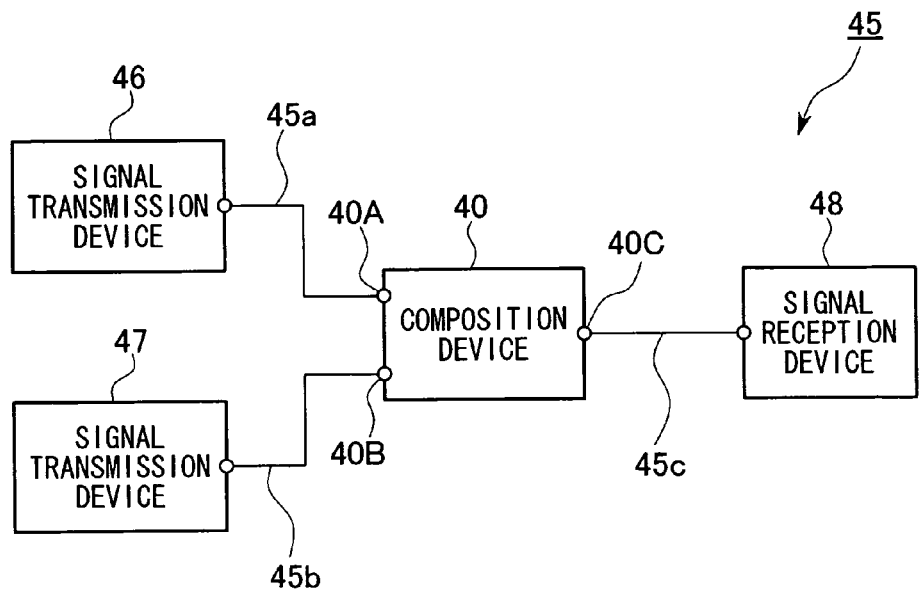
FIG. 17 is a structural view of a communication system which comprises the composition device shown in FIG. 15 or FIG. 16.
Figure 18:
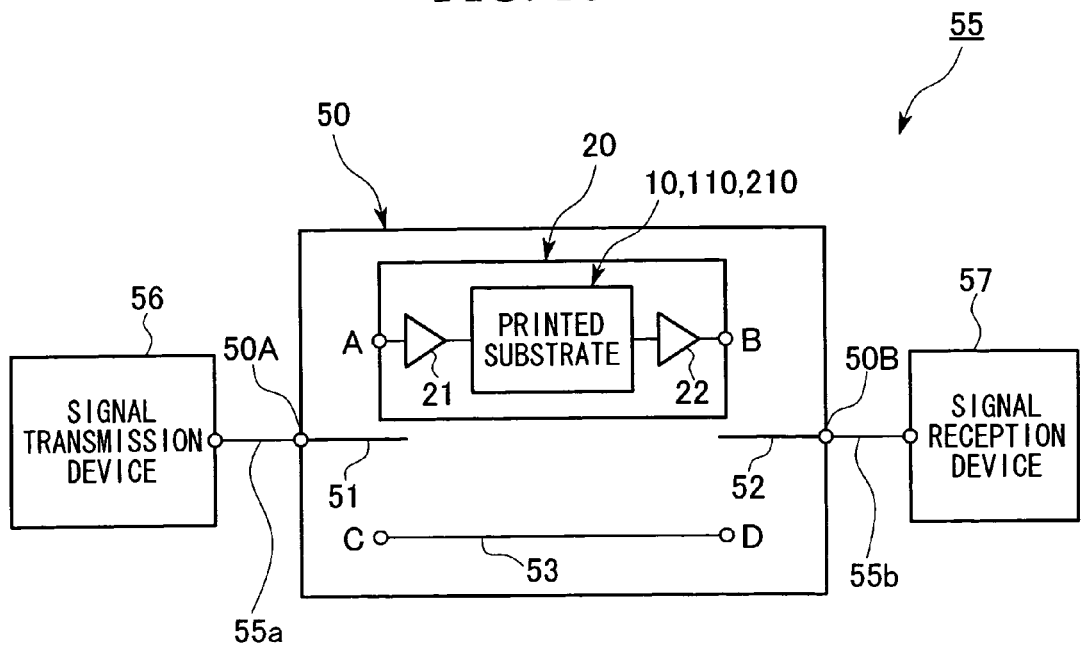
FIG. 18 is a structural figure showing a switchover device in a communication system which comprises a printed substrate according to an embodiment of the present invention.
Figure 19:
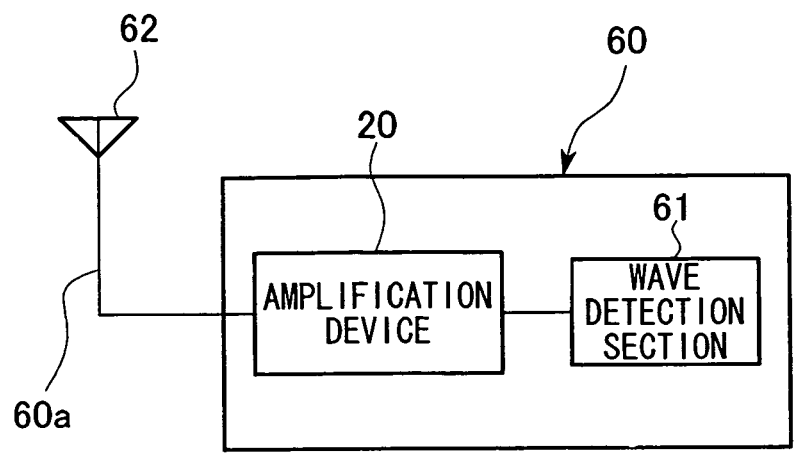
FIG. 19 is a structural figure showing a signal reception device in a communication system which comprises a printed substrate according to an embodiment of the present invention.
Figure 20:
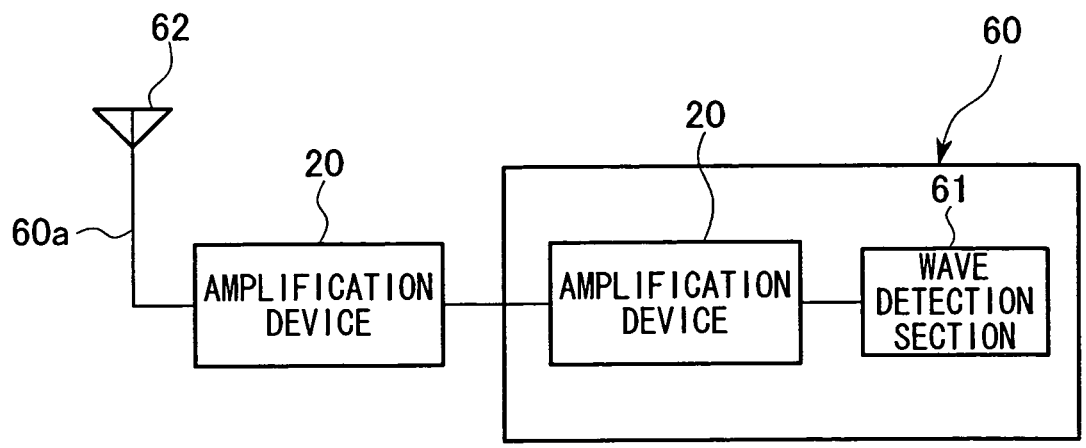
FIG. 20 is a structural figure showing a signal reception device in a communication system which comprises a printed substrate according to an embodiment of the present invention.
Figure 21:
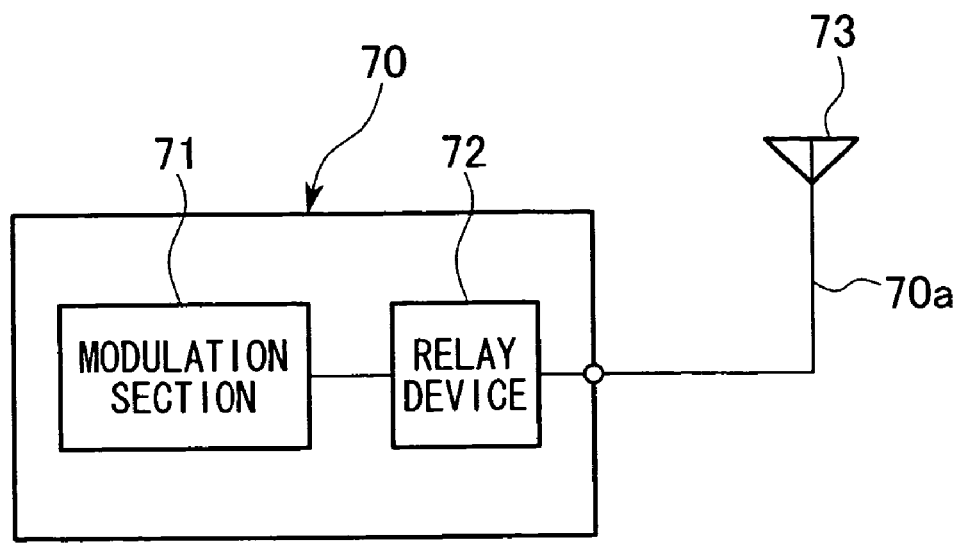
FIG. 21 is a structural figure showing a signal transmission device in a communication system which comprises a printed substrate according to an embodiment of the present invention.
Figure 22:
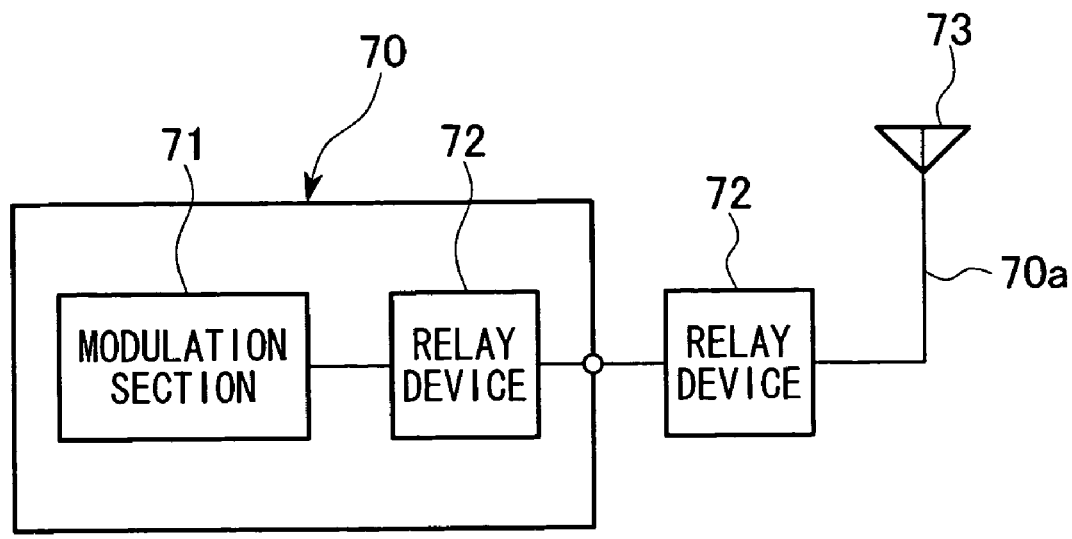
FIG. 22 is a structural figure showing a signal transmission device in a communication system which comprises a printed substrate according to an embodiment of the present invention.
Figure 23:
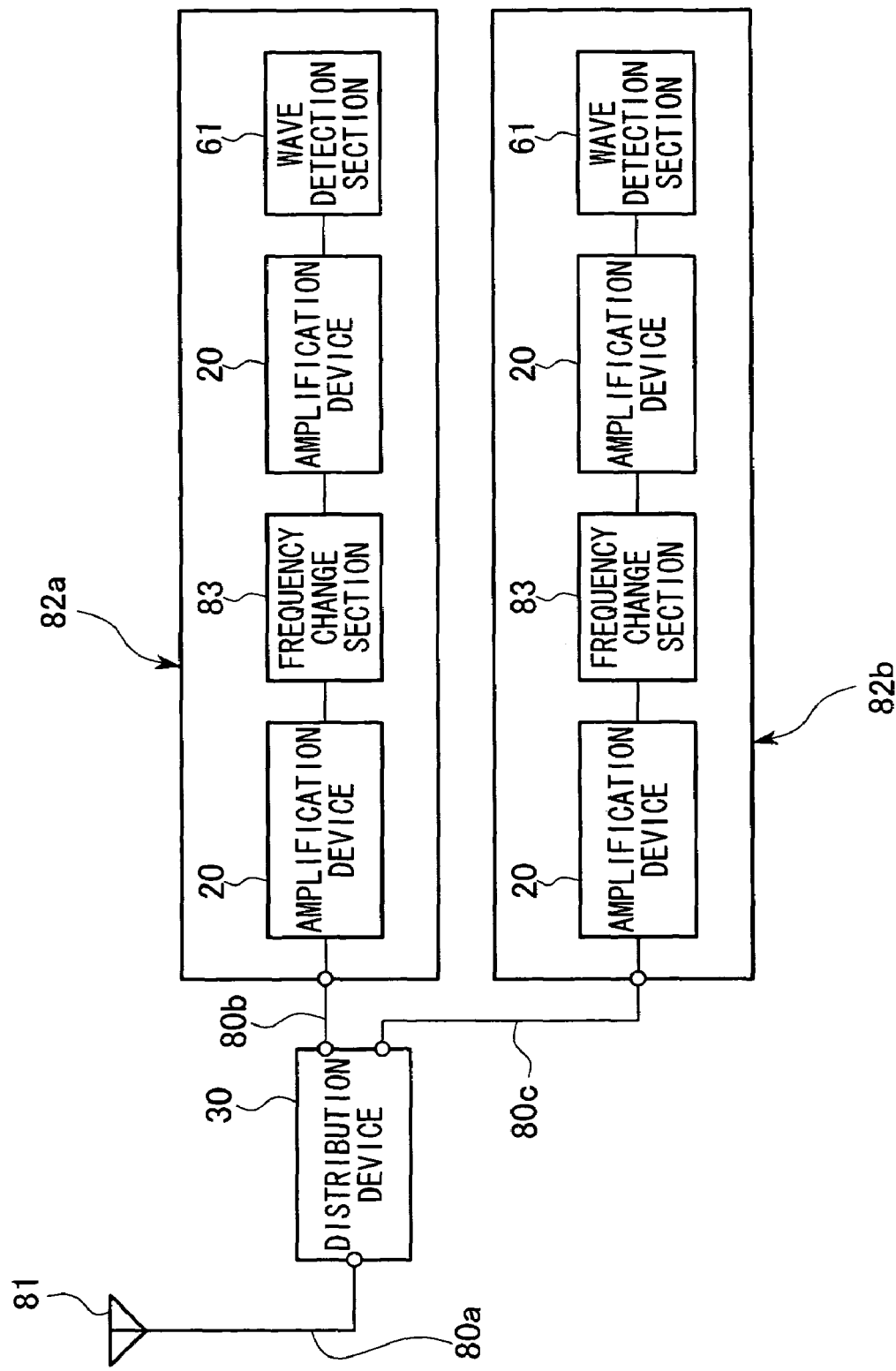
FIG. 23 is a structural figure showing a wireless communication device which comprises a printed substrate according to an embodiment of the present invention.

FIG. 10 is a structural figure showing an amplification device 20 in a communication system which comprises a printed substrate 10 (110, 210) according to an embodiment of the present invention; FIG. 11 is a structural view of a communication system 25 which comprises the amplification device 20 shown in FIG. 10; FIGS. 12 and 13 are structural figures showing a distribution device 30 in a communication system which comprises a printed substrate 10 (110, 210) according to an embodiment of the present invention; FIG. 14 is a structural view of a communication system 35 which comprises the distribution device 30 shown in FIG. 12 or FIG. 13; FIGS. 15 and 16 are structural figures showing a composition device 40 in a communication system which comprises a printed substrate 10 (110, 210) according to an embodiment of the present invention; FIG. 17 is a structural view of a communication system 45 which comprises the composition device 40 shown in FIG. 15 or FIG. 16; FIG. 18 is a structural figure showing a switchover device 50 in a communication system which comprises a printed substrate 10 (110, 210) according to an embodiment of the present invention; FIGS. 19 and 20 are structural figures showing a signal reception device 60 in a communication system which comprises a printed substrate 10 (110, 210) according to an embodiment of the present invention; FIGS. 21 and 22 are structural figures showing a signal transmission device 70 in a communication system which comprises a printed substrate 10 (110, 210) according to an embodiment of the present invention; and FIG. 23 is a structural figure showing a wireless communication device 80 which comprises a printed substrate 10 (110, 210) according to an embodiment of the present invention.

The amplification device 20 in a communication system which is provided with the printed substrate 10 (110, 210) according to this embodiment, as shown for example in FIG. 10, comprises: an amplifier 21 which is connected via an input terminal 20A to a transmission line for an input signal; a printed substrate 10 (110, 210) which carries a SAW filter which is connected to this amplifier 21 and which comprises, for example, langasite as its piezoelectric element; and an amplifier 22 which outputs a signal which is outputted from the printed substrate 10 (110, 210) via an output terminal 20B to a transmission line 20b.

According to the amplification device 20 of the above described structure, even if noise has been mixed in with the input signal in the transmission line 20a, it is possible to amplify only the desired signal and to transmit it to the transmission line 20b. Moreover, by mounting a SAW filter which utilizes langasite as its piezoelectric element to the printed substrate 10 (110, 210), it is possible to obtain a higher elimination performance for the interfering waves, as compared to the case of mounting a SAW filter which utilizes, for example, quartz as its piezoelectric element.

If, for example, it is necessary to provide 60 dB or greater as an out of band attenuation amount, then, with a SAW filter which includes quartz as its piezoelectric element, it is necessary to construct the SAW filter in two stages. However, with a SAW filter which includes langasite as its piezoelectric element, it is possible to ensure the desired out of band attenuation amount with only a single SAW filter. By doing this, it becomes possible to make the device more compact and lighter in weight.

It should be understood that, with this amplification device 20, it will be acceptable to dispose the amplifiers 21 and 22 within the printed substrate 10 (110, 210). Furthermore, the number of the amplifiers is not limited to two; it would also be acceptable to provide any appropriate number of amplifiers.

Yet further, it is possible to apply this amplification device 20 effectively to the case of amplification, or the like, in a location in the surroundings of which the noise is relatively low, such as for example indoors or in a room which is sheltered or the like, of a signal which has arrived by transmission from a location in the surroundings of which the noise is relatively great, such as for example the outdoors or the like.

For example, with the communication system 25 shown in FIG. 11, after noise or the like which has been mixed in in a transmission line 25a has been eliminated in the amplification device 20 from a signal which has been inputted from a signal transmission device 26 via a transmission line 25a, only the desired signal is amplified by the amplification device 20. And this signal which has been amplified by the amplification device 20 is transmitted to a signal reception device 27 via a transmission line 25b.

A distribution device 30 in a communication system which is equipped with a printed substrate 10 (110, 210) according to this embodiment, as shown for example in FIG. 12, comprises: an amplifier 31 which is connected via an input terminal 30A to a transmission line 30a for an input signal; a printed substrate 10 (110, 210) to which is mounted a SAW filter which is equipped with, for example, langasite as its piezoelectric element, and which is connected to this amplifier 31; and a distribution device 32 which distributes the signal which is outputted from the printed substrate 10 (110, 210), and which outputs it via output terminals 30B and 30C to two transmission lines 30b and 30c.

According to the distribution device 30 of the above described structure, even if noise is mixed in with the input signal in the transmission line 30a, it is possible to distribute only the desired signal and to transmit it to either one of the transmission lines 30b or 30c.

It should be understood that, in this distribution device 30, it will be acceptable to arrange the amplifier 31 and the distribution device 32 within the printed substrate 10 (110, 210). Furthermore, the number of amplifiers is not limited to one; any appropriate number of amplifiers may be provided.

It should be understood that this distribution device in a communication system which incorporates the printed substrate 10 (110, 210), as for example shown in FIG. 13, after having further inputted the signals which have been distributed by the distribution device 32 to printed substrates 10, 10, may also output them to two transmission lines 30b and 30c via the output terminals 30B and 30C. In this case, furthermore, it will be acceptable to output the signals which have been outputted from the printed substrates 10, 10 after distribution to the output terminals 30B and 30C via amplifiers.

In the communication system 35 which is shown, for example, in FIG. 14, a signal which has been inputted to the distribution device 30 from a signal transmission device 36 via a transmission line 35a is distributed into, for example, two signals by the distribution device 30, and each of these signals is transmitted to one of two signal reception devices 37 and 38 via a transmission line 35b, 35c.

Here, the distribution device 30 is not limited to two input signals; it will also be acceptable for it to perform distribution in any appropriate number.

A composition device 40 in a communication system which incorporates a printed substrate 10 (110, 210) according to this embodiment, as for example shown in FIG. 15, comprises: a composition section 41 which is connected to a transmission line 40a for an input signal via an input terminal 40A and to a transmission line 40b for an input signal via an input terminal 40B, and which combines the two signals which are inputted; a printed substrate 10 (110, 210) which is connected to this composition section 41 and which is equipped with a SAW filter which comprises, for example, langasite as its piezoelectric element; and an amplifier 42 which amplifies the signal which is outputted from the printed substrate 10 (110, 210), and which outputs it via an output terminal 40C to a transmission line 40c.

According to the composition device 40 of the above described structure, even if noise is mixed in with the input signals in the transmission line 40a and in the transmission line 40b, it is possible to combine only the desired signals and to transmit the combination to the transmission line 40c.

It should be understood that, in this composition device 40, it would also be acceptable to dispose the composition section 41 and the amplifier 42 within the printed substrate 10 (110, 210). Furthermore, in this composition device 40, it would also be acceptable to omit the amplifier 42.

It should be understood that, with the composition device 40 in a communication system which comprises the printed substrate 10 (110, 210) according to this embodiment, as for example shown in FIG. 16, it would also be acceptable to perform the composition of signals which have been outputted from a printed substrate 10 which is connected to the transmission line 40a for a signal which is inputted via the input terminal 40A, and from a printed substrate 10 which is connected to the transmission line 40b for a signal which is inputted via the input terminal 40B, with the composition section 41. In this case, the signal which has been outputted from the composition section 41 may be transmitted to a transmission line 40c, not via any printed substrate 10 (110, 210).

For example, with the communication system 45 shown in FIG. 17, a signal which has been inputted via a transmission line 45a from a signal transmission device 46 and a signal which has been inputted via a transmission line 45b from a signal transmission device 47 are combined by a composition device 40, and are transmitted to a signal reception device 48.

Here, the composition device 40 is not limited to two signals which are inputted; it will also be acceptable for it to combine any appropriate number of input signals.

A switchover device 50 in a communication system which comprises the printed substrate 10 (110, 210) according to this embodiment, as for example shown in FIG. 18, is disposed in a communication system 55 which comprises a signal transmission device 56 and a signal reception device 57, and is connected via an input terminal 50A to a transmission line 55a for the input signal, and comprises: an input side switch 51 which changes over the transmission circuit for the input signal to one or the other of the amplification device 20 or the transmission line 53, and an output side switch 52 which outputs a signal which is outputted from one or the other of the amplification device 20 or the transmission line 53 to a transmission line 55b via an output terminal 50B.

According to the switchover device 50 of the above described structure, in a case such as, for example, if the noise which is mixed in with the input signal in the transmission line 55a is high or the like, then, if it is desired to limit the band of the input signal so as to cause only the desired signal to be transmitted, then the input terminal 50A and the amplification device 20 are connected together by the input side switch 51, and the output terminal 50B and the amplification device 20 are connected together by the output side switch 52. On the other hand, if band limitation is not required, then the input terminal 50A and the transmission line 53 are connected together by the input side switch 51, and the output terminal 50B and the transmission line 53 are connected together by the output side switch 52.

It should be understood that, in this switchover device 50, it would also be acceptable to dispose the amplifiers 21 and 22 of the amplification device 20, and the switches 51 and 52 and the transmission line 53, within the printed substrate 10 (110, 210) of the amplification device 20.

A signal reception device 60 in a communication system which comprises the printed substrate 10 (110, 210) according to this embodiment is included in a mobile station device or a base station device or a wireless communication device or the like in a mobile communication system which comprises, for example, a signal transmission device and an antenna and the like, and, as for example shown in FIG. 19, comprises an amplification device 20 which is connected via a line 60a to an antenna 62, and a wave detection section 61.

According to the signal reception device 60 of the above described structure, even if for example an interference signal or the like is mixed in with a signal which is received via the antenna 62, it is possible to extract only the desired signal.

It should be understood that, with a mobile station device or a base station device or a wireless communication device or the like in a mobile communication system which is provided with this signal reception device 60, as for example shown in FIG. 20, it would also be acceptable to include an amplification device 20 between the antenna 62 and the signal reception device 60.

A signal transmission device 70 in a communication system which comprises the printed substrate 10 (110, 210) according to this embodiment is included in a mobile station device or a base station device or a wireless communication device or the like in a mobile communication system which comprises, for example, a signal reception device and an antenna and the like, and, as for example shown in FIG. 21, comprises a modulation section 71 and a relay device 72 which includes the printed substrate 10 (110, 210) and which relays the signal which is outputted from the modulation section 71; and the signal which is outputted from the relay device 72 is transmitted to an antenna 73 via a line 70a.

According to the signal transmission device 70 of the above described structure, it is possible to suppress spurious signal transmission for the signal which is transmitted via the antenna 73.

It should be understood that, with a mobile station device or a base station device or a wireless communication device or the like in a mobile communication system which is provided with this signal transmission device 70, as for example shown in FIG. 22, it would also be acceptable to include a relay device 72 between the antenna 73 and the signal transmission device 70.

A wireless communication device 80 in a communication system which comprises the printed substrate 10 (110, 210) according to this embodiment is one which constitutes a mobile station device or a base station device or a wireless communication device or the like in a mobile communication system which comprises, for example, a signal transmission device and a signal reception device and an antenna and the like, and, as for example shown in FIG. 23, comprises a distribution device 30 which is connected to an antenna 81 via a line 80a, and to a distribution device 30 via a line 80b and a line 80c, and which comprises, for example two signal reception devices 82a and 82b.

Furthermore, these two signal reception devices 82a and 82b may have, for example, the same structure; for example, the signal reception device 82a may comprise an amplification device 20 which is connected to the line 80b, a frequency change section 83 which is connected to this amplification device 20, and a wave detection section 61 to which is inputted the signal which is outputted from the frequency change section 83, via the amplification device 20.

According to the wireless communication device 80 of the above described structure, even if it is the case that, for example, an interference signal or the like is mixed into the signal which is being received via the antenna 81, it is still possible to extract only the desired signal by itself. Furthermore, it is possible to suppress spurious signal transmission for a signal which is being transmitted via the antenna 81.

As has been described above, the printed substrate 10 (110, 210) according to this embodiment may be incorporated in, for example, an amplification device 20, a distribution device 30, a composition device 40, a switchover device 50, a signal reception device 60, a signal transmission device 70, or the like; and if, for example, any of these devices 20, . . . , 70, or indeed the printed substrate 10 (110, 210) itself, is incorporated in a mobile station device or a base station device of, for example, a mobile communication system, then it is possible to obtain the desired out of band attenuation amount characteristic for the signal which is received, it is possible to suppress crosstalk due to interference, and it is possible to suppress spurious signal transmission in a signal which is being transmitted.

Furthermore, by fitting a SAW filter which comprises langasite as its piezoelectric element to the printed substrate 10 (110, 210), along with reducing the amount of SAW filters which are required, it is also possible to ensure the desired out of band attenuation amount, so that it becomes possible to reduce the size of the device and to increase its lightness.

The Second Embodiment

Figure 24:
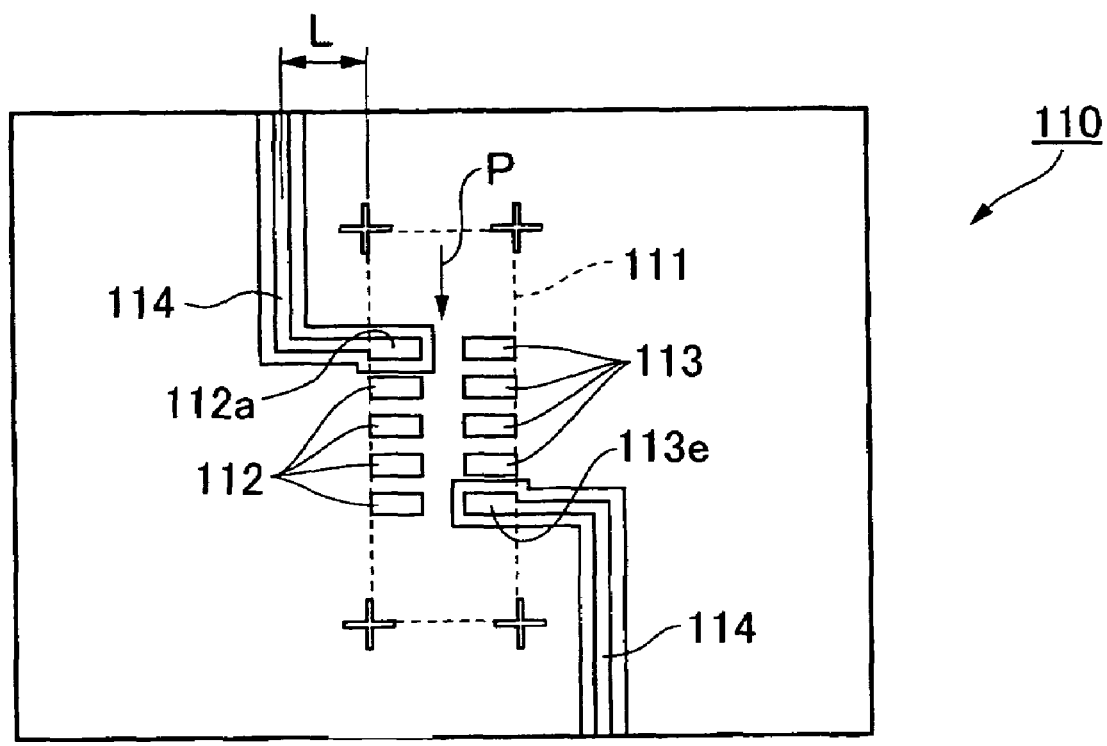
FIG. 24 is a plan view of a printed substrate according to an embodiment of the present invention.

In the following, a printed substrate according to a second embodiment of the present invention will be explained with reference to the appended drawings. FIG. 24 is a plan view of a printed substrate (an electronic component) 110 according to the second embodiment of the present invention.

The printed substrate 110 according to the second embodiment is one which is equipped with a SAW filter which includes, for example, langasite ($La_3Ga_5SiO_{14}$) as its piezoelectric element, and, as shown in FIG. 24, it comprises, in a fitting region 111 for an SAW filter which is for example shaped as a rectangle or the like as seen in plan view, a plurality of pairs (for example 5 pairs) of terminal electrodes which are exposed at their two mutually opposing long sides, in other words input side terminal electrodes 112, . . . 112 and output side terminal electrodes 113, . . . 113 which constitute pairs.

It should be understood that, with these terminal electrodes 112, . . . 112 and 113, . . . 113, only one pair of an input side terminal electrode 112 and an output side terminal electrode 113 (for example the input side terminal electrode 112a and the output side terminal electrode 113e shown in FIG. 24) which are opposed in, for example, the diagonal direction are connected to the input terminal and the output terminal of the SAW filter, while the other terminal electrodes 112, . . . , 112 and 113, . . . , 113 are connected to ground. In other words, the propagation direction P of the surface elastic wave in the SAW filter is made to be, for example, the direction parallel to the long side.

Micro strip lines 114, 114 are connected to the input side terminal electrode 112a and the output side terminal electrode 113e which are connected to the input terminal and to the output terminal of the SAW filter.

The micro strip lines 114, 114 which are connected to the terminal electrodes 112a, 113e are bent into, for example, letter "L" shapes, and they are provided at positions which are separated by just a predetermined distance #L (for example 10 mm or the like) from the fitting region 111 of the SAW filter (in other words, at elbow positions), so as to extend in mutually opposite directions, and along directions which are parallel to the propagation direction P of the surface elastic wave within the SAW filter.

It should be understood that, in the following, the distances from the fitting region 111 of the SAW filter to the elbow positions are taken as being the distances L of the micro strip lines.

Here, the distance L of the micro strip lines is desirably set to within 10 mm, and, by it being set in this manner, it is possible to obtain the desired attenuation characteristic; while, if the distance L of the micro strip lines exceeds 10 mm, then there is a fear that the attenuation characteristic of the SAW filter will undesirably deteriorate to, for example, about 20 dB.

The printed substrate 110 according to the second embodiment has the above described structure.

When a SAW filter (not shown in the figures) is fitted to this printed substrate 110, and an input signal is transmitted through the SAW filter via the input side terminal electrode 112a and the output side terminal electrode 113e, then, by the micro strip lines 114, 114 being provided at the elbow positions which are separated by just the predetermined distance #L (for example, 10 mm or the like) from the fitting region for the SAW filter, so that they extend along directions which are parallel with respect to the propagation direction P of the surface elastic waves, and in mutually opposite directions, it is possible to prevent the input signal which is inputted from, for example, the input side terminal electrode 112a from being undesirably transmitted directly to the output side terminal electrode 113e.

In other words, after the input signal which is inputted from the input side terminal electrode 112a has been transmitted through the SAW filter from the input terminal of the SAW filter to its output terminal, then, in order for this signal to arrive at the output side terminal electrode 113e, it is arranged for the desired band transmission processing to be performed within the SAW filter.

By doing this, it is possible to prevent deterioration of the attenuation characteristic of the SAW filter which is fitted to the printed substrate 110.

As described above, according to the printed substrate 110 according to the second embodiment, it is possible to prevent deterioration of the attenuation characteristic of the SAW filter which is fitted, and, even in the case of a SAW filter which includes, for example, langasite as its piezoelectric element, it is possible reliably to obtain the desired attenuation characteristic.

In the following, an example of the test results for the attenuation characteristic when a SAW filter which includes langasite as its piezoelectric element is fitted to the printed substrate 110 according to the second embodiment will be explained while referring to the appended drawings.

FIGS. 25 through 28 are schematic views showing the shape of the micro strip line 114 of the printed substrate 110.

Figure 25:
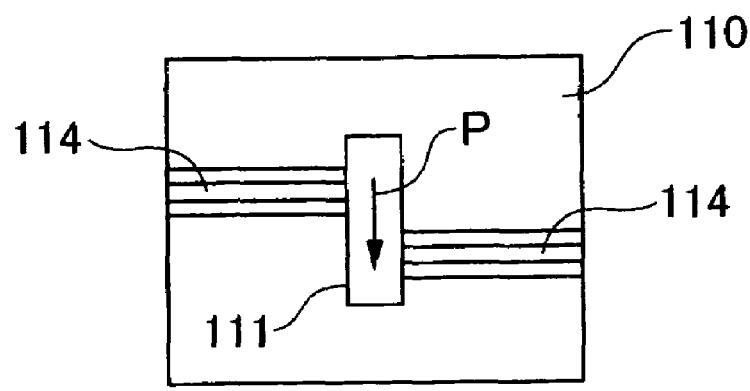
FIG. 25 is a schematic view showing the shape of a micro strip line of a printed substrate according to a second comparison example.

It should be understood that, in the following, a printed substrate 110 in which the micro strip lines 114, 114 extended in directions which were orthogonal with respect to the propagation direction of the surface elastic wave within the SAW filter, as shown in FIG. 25, was taken as the second comparison example.

Figure 26:
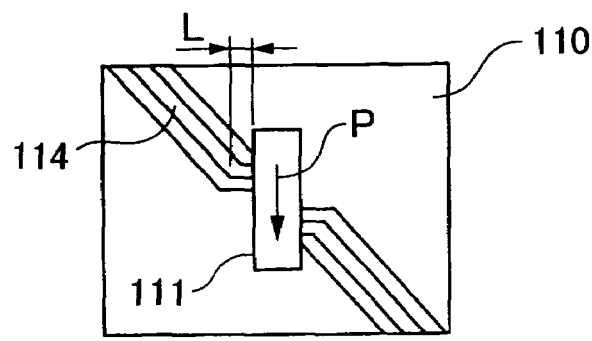
FIG. 26 is a schematic view showing the shape of a micro strip line of a printed substrate according to a third comparison example.

Furthermore, as shown in FIG. 26, a printed substrate 110 in which the micro strip lines 114, 114 extended so as to be separated from the fitting region 111 for the SAW filter in directions which intersected with respect to the propagation direction P of the surface elastic wave in the SAW filter at the elbow positions which were separated by just the predetermined distance #L (for example, 10 mm or the like) from the fitting region 111 for the SAW filter was taken as the third comparison example.

Figure 27:
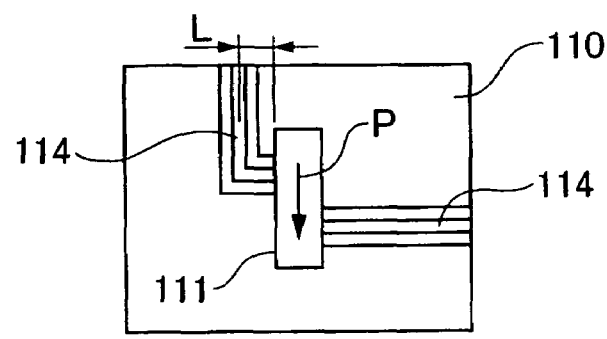
FIG. 27 is a schematic view showing the shape of a micro strip line of a printed substrate according to a fourth comparison example.

Moreover, as shown in FIG. 27, a printed substrate 110 in which one of the micro strip lines 114 (for example, the micro strip line 114 which was connected to the input side terminal electrode 112a) extended in a direction which was parallel with respect to the direction of propagation P of the surface elastic wave in the SAW filter at the elbow position which was separated by just the predetermined distance #L (for example, 10 mm or the like) from the fitting region 111 for the SAW filter, while the other one of the micro strip lines 114 (for example the micro strip line 114 which was connected to the output side terminal electrode 113e) extended in a direction which was orthogonal with respect to the direction of propagation P of the surface elastic wave, was taken as the fourth comparison example.

Figure 28:
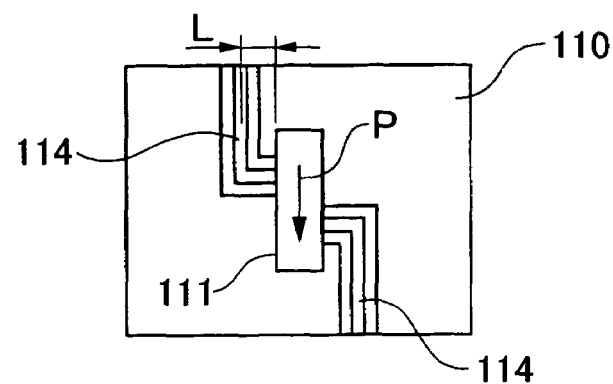
FIG. 28 is a schematic view showing the shape of a micro strip line of a printed substrate according to a fourth embodiment.

Furthermore, as shown in FIG. 28, a printed substrate 110 in which the micro strip lines 114 extended in a direction which was parallel with respect to the direction of propagation P of the surface elastic wave in the SAW filter at the elbow position which was separated by just the predetermined distance #L (for example, 10 mm or the like) from the fitting region 111 for the SAW filter, was taken as the fourth embodiment.

In the following, the manner will be explained in which the attenuation characteristic was tested when a SAW filter was fitted to the printed substrates of the second through fourth comparison examples and the fourth embodiment.

First, as shown in the Table 2 given below, for the second through the fourth comparison examples and the fourth embodiment, a plurality of printed substrates were manufactured with different distances L of the micro strip lines.

TABLE 2

| THROUGH HOLE PATTERN | DISTANCE OF MICRO STRIP LINES | ATTENUATION |
|---|---|---|
| COMPARISON EXAMPLE 2 | 20 mm | 46 dB |
| COMPARISON EXAMPLE 3 | 20 mm | 52 dB |
| COMPARISON EXAMPLE 4 | 3 mm | 53 dB |
|  | 5 mm | 53 dB |
|  | 10 mm | 53 dB |
|  | 15 mm | 50 dB |
| FOURTH EMBODIMENT | 3 mm | 58 dB |
|  | 5 mm | 58 dB |
|  | 10 mm | 58 dB |
|  | 15 mm | 55 dB |

And, solder was adhered in predetermined positions upon each of the printed substrates, and the SAW filters were mounted upon this solder, and the SAW filters and the printed substrates were joined together by heating them up to, for example, 220° C. And the attenuation characteristic of the SAW filters was measured.

It will be understood that, as shown in FIG. 2, for the second comparison example and the third comparison example which had the same distance L for the micro strip lines, the attenuation characteristic was enhanced for the third comparison example, in which the micro strip lines 114, 114 extended so as to be separated from the fitting region 111 for the SAW filter in directions which intersected with respect to the direction of propagation P of the surface elastic wave in the SAW filter.

Moreover it will be understood that, for the fourth comparison example and the fourth embodiment which had the same distance L for the micro strip lines, the attenuation characteristic was enhanced for the fourth embodiment, in which the two micro strip lines 114, 114 in directions which were orthogonal with respect to the direction of propagation P of the surface elastic wave in the SAW filter.

Furthermore it will be understood that, as shown in the fourth comparison example and the fourth embodiment, when the distance L of the micro strip lines had a length which exceeded a predetermined length (for example 10 mm or the like), then the attenuation characteristic was reduced.

And it will be understood that the attenuation characteristic attained its maximum value (for example, 58 dB) for the fourth embodiment in which the distance L of the micro strip lines was less than 10 mm (for example, 3 mm, 5 mm, 10 mm or the like), and the two micro strip lines 114, 114 extended in directions which were parallel with respect to the direction of propagation P of the surface elastic wave in the SAW filter, in other words, in directions which did not easily experience any influence of feed-through.

It should be understood that, in the above described second embodiment, an attenuation characteristic of the desired high value (for example, 70 dB) which is peculiar to, for example, langasite or the like can be obtained by providing a plurality of through holes of a predetermined size, to which electrically conductive material is provided for electrically connecting together the surface of the printed substrate 110 and its rear surface, in predetermined positions, for example within the fitting region 111 of the SAW filter, and outside said fitting region 111, and/or by providing a slit which consists of a through hole which extends in, for example, a direction (for example, the orthogonal direction) which intersects the direction of propagation P of the surface elastic wave within the fitting region 111 of the SAW filter, for example.

It should be understood that, as compared to the attenuation characteristic of a SAW filter which includes, for example, quartz as its piezoelectric element (for example, 30 to 40 dB or the like), according to the printed substrate 110 according to the above described second embodiment, as for example in the figure shown in FIG. 9 of the frequency characteristic of a SAW filter, it is possible to take advantage efficiently of the higher attenuation characteristic like the attenuation characteristic of a SAW filter which includes, for example, langasite ($La_3Ga_5SiO_{14}$) as its piezoelectric element (for example, 60 to 70 dB or the like).

Just like the printed substrate 10 according to the first embodiment, the printed substrate 110 according to this second embodiment as well can be applied to an amplification device, a distribution device, a composition device, a switchover device, a signal reception device, and a signal transmission device in a communication system, to a mobile station device and a base station device in a mobile communication system which incorporates said printed substrate, and to a wireless communication device which incorporates said printed substrate.

FIG. 10 is a structural figure showing an amplification device 20 in a communication system which comprises a printed substrate 110 according to an embodiment of the present invention; FIG. 11 is a structural view of a communication system 25 which comprises the amplification device 20 shown in FIG. 10; FIGS. 12 and 13 are structural figures showing a distribution device 30 in a communication system which comprises a printed substrate 110 according to an embodiment of the present invention; FIG. 14 is a structural view of a communication system 35 which comprises the distribution device 30 shown in FIG. 12 or FIG. 13; FIGS. 15 and 16 are structural figures showing a composition device 40 in a communication system which comprises a printed substrate 110 according to an embodiment of the present invention; FIG. 17 is a structural view of a communication system 45 which comprises the composition device 40 shown in FIG. 15 or FIG. 16; FIG. 18 is a structural figure showing a switchover device 50 in a communication system which comprises a printed substrate 110 according to an embodiment of the present invention; FIGS. 19 and 20 are structural figures showing a signal reception device 60 in a communication system which comprises a printed substrate 110 according to an embodiment of the present invention; FIGS. 21 and 22 are structural figures showing a signal transmission device 70 in a communication system which comprises a printed substrate 10 according to an embodiment of the present invention; and FIG. 23 is a structural figure showing a wireless communication device 80 which comprises a printed substrate 110 according to an embodiment of the present invention.

The amplification device, the distribution device, the composition device, the switchover device, the signal reception device, and the signal transmission device in a communication system which is provided with the printed substrate 110 according to the second embodiment, and the mobile station device and the base station device in a mobile communication system which is provided with said printed substrate, and also the wireless communication device which is provided with said printed substrate, all provide the same operational benefits as in the case of the printed substrate 10 which constituted the first embodiment.

The Third Embodiment

Figure 29:
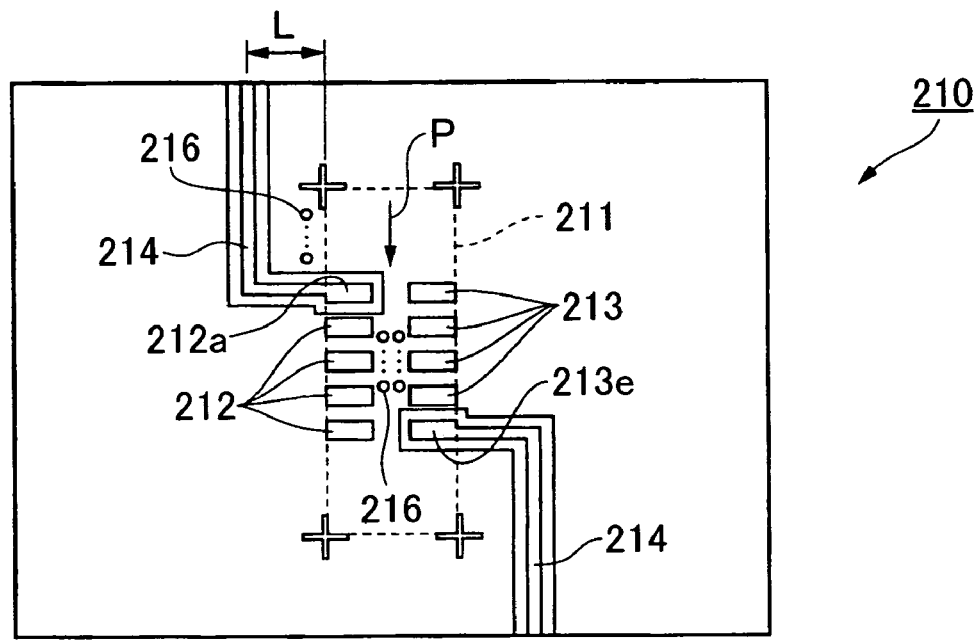
FIG. 29 is a plan view of a printed substrate according to an embodiment of the present invention.

In the following, a third embodiment of the present invention will be explained with reference to the appended drawings. FIG. 29 is a plan view of a printed substrate (an electronic component) 210 according to a third embodiment of the present invention.

The printed substrate 210 according to the third embodiment is one which is equipped with a SAW filter which includes, for example, langasite ($La_3Ga_5SiO_{14}$) as its piezoelectric element, and, as shown in FIG. 29, it comprises, in a fitting region 211 for an SAW filter which is for example shaped as a rectangle or the like as seen in plan view, a plurality of pairs (for example 5 pairs) of terminal electrodes which are exposed at their two mutually opposing long sides, in other words input side terminal electrodes 212, . . . , 212 and output side terminal electrodes 213, . . . , 213 which constitute pairs.

It should be understood that, with these terminal electrodes 212, . . . , 212 and 213, . . . , 213, only one pair of an input side terminal electrode 212 and an output side terminal electrode 213 (for example the input side terminal electrode 212a and the output side terminal electrode 213e shown in FIG. 29) which are opposed in, for example, the diagonal direction are connected to the input terminal and the output terminal of the SAW filter, while the other terminal electrodes 212, . . . , 212 and 213, . . . , 213 are connected to ground. In other words, the propagation direction P of the surface elastic wave in the SAW filter is made to be, for example, the direction parallel to the long side.

Micro strip lines 214, 214 are connected to the input side terminal electrode 212a and the output side terminal electrode 213e which are connected to the input terminal and to the output terminal of the SAW filter.

The micro strip lines 214, 214 which are connected to the terminal electrodes 212a, 213e are bent into, for example, letter "L" shapes, and they are provided at positions which are separated by just a predetermined distance #L (for example 10 mm or the like) from the fitting region 211 of the SAW filter (in other words, at elbow positions), so as to extend in mutually opposite directions, and along directions which are parallel to the propagation direction P of the surface elastic wave within the SAW filter.

It should be understood that, in the following, the distances from the fitting region 211 of the SAW filter to the elbow positions are taken as being the distances L of the micro strip lines.

Furthermore, in the fitting region 211 of the SAW filter, there are provided a plurality of through holes 216, . . . 216 of a predetermined diameter (for example, of diameter 0.3 to 0.5 mm or the like) between adjoining ones of the terminal electrodes 212, 212 and 213, 213 and between opposing terminal electrodes 212, 213; and an electrically conductive material is provided within each of these through holes 216, for electrically connecting together the surface of the printed substrate 210 and its rear surface, which is connected to ground.

Here, the through holes 216, . . . , 16 which are provided in the vicinity of the input side terminal electrode 212a and the output side terminal electrode 213e which are connected to the input terminal and to the output terminal of the SAW filter are set to have, for example, diameters of 0.3 to 0.4 mm, while the through holes 216, . . . , 216 which are provided at portions other than the vicinity of these terminal electrodes 12a, 213e are set to have, for example, diameters of 0.5 mm.

Furthermore, upon the portions of the printed substrate 210 other than the fitting region 211 for the SAW filter, there are provided a plurality of through holes 216, . . . 216 of a predetermined diameter (for example, of diameter 0.4 to 0.5 mm or the like) in a region which is within a predetermined distance from the fitting region 211 for the SAW filter (for example, 1.5 mm or the like).

It should be understood that, in FIG. 29, only an appropriate portion of the through holes 216, . . . , 216 among the plurality of through holes 216, . . . , 216 are shown.

The printed substrate 210 according to the third embodiment has the above described structure.

When a SAW filter (not shown in the figures) is fitted to this printed substrate 210, and an input signal is transmitted through the SAW filter via the input side terminal electrode 212a and the output side terminal electrode 213e, by providing the plurality of through holes 216, . . . , 216 of predetermined sizes in predetermined positions within the fitting region 211 for the SAW filter and outside this fitting region 211, then it is possible to prevent the input signal which is inputted, for example, from the input side terminal electrode 212a from being undesirably transmitted directly to the output side terminal electrode 213e.

In other words, after the input signal which is inputted from the input side terminal electrode 212a has been transmitted through the SAW filter from the input terminal of the SAW filter to its output terminal, then, in order for this signal to arrive at the output side terminal electrode 213e, it is arranged for the desired band transmission processing to be performed within the SAW filter.

By doing this, it is possible to prevent deterioration of the attenuation characteristic of the SAW filter which is fitted to the printed substrate 210.

As described above, according to the printed substrate 210 according to the third embodiment, it is possible to prevent deterioration of the attenuation characteristic of the SAW filter which is fitted, and, even in the case of a SAW filter which includes, for example, langasite as its piezoelectric element, it is possible reliably to obtain the desired attenuation characteristic.

In the following, an example of the test results for the attenuation characteristic when a SAW filter which includes langasite as its piezoelectric element is fitted to the printed substrate 210 according to the third embodiment will be explained while referring to the appended drawings.

FIGS. 30 through 33 are schematic views showing pluralities of through holes 216, . . . , 216 which are provided to printed substrates 210 according to a fifth through an eighth embodiment and a fifth comparison example.

Figure 30:
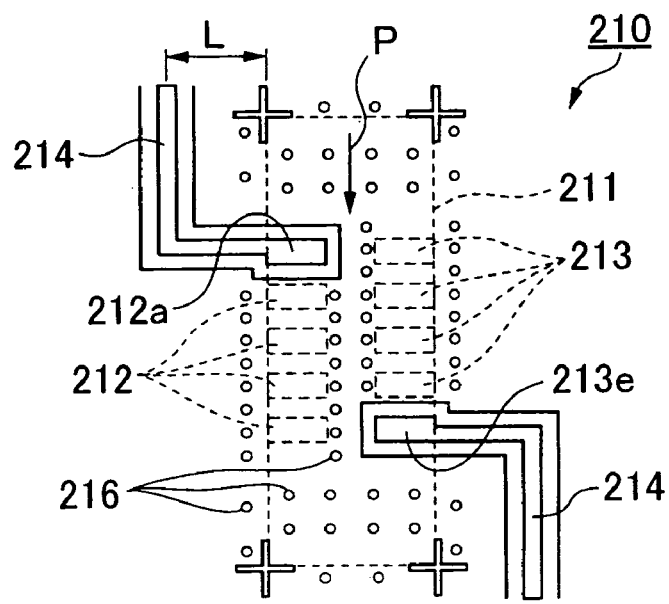
FIG. 30 is a schematic view showing a plurality of through holes which are provided in a printed substrate according to a fifth embodiment.

It should be understood that, in the following, as shown in FIG. 30, a printed substrate 210 which was provided with a plurality of through holes 216, . . . , 216 within the fitting region 211 for the SAW filter, and in regions within a predetermined distance from the fitting region 211 for the SAW filter, was taken as the fifth embodiment.

Figure 31:
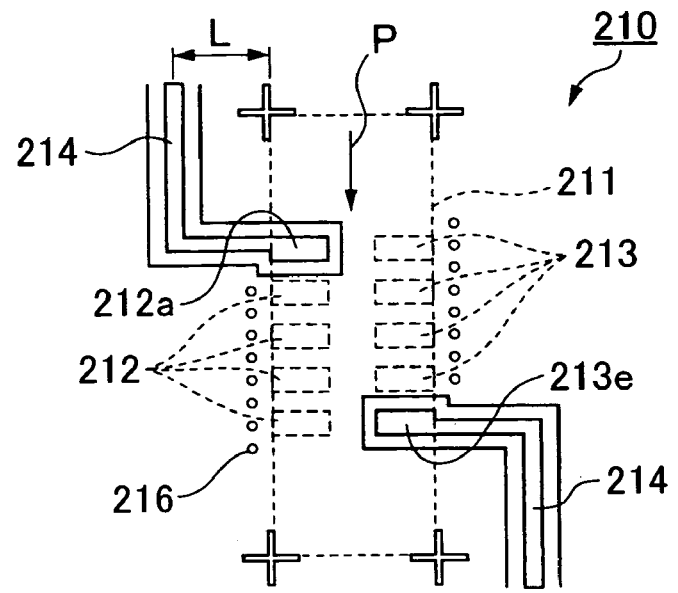
FIG. 31 is a schematic view showing a plurality of through holes which are provided in a printed substrate according to a sixth embodiment.

Furthermore, as shown in FIG. 31, a printed substrate 210 which was not provided with any through holes 216 within the fitting region 211 for the SAW filter, but which was provided with a plurality of through holes 216, . . . , 216 only in the vicinities of the terminal electrodes 212, . . . , 212 and 213, ..., 213 in regions within a predetermined distance from the fitting region 211 for the SAW filter, was taken as the sixth embodiment.

Figure 32:
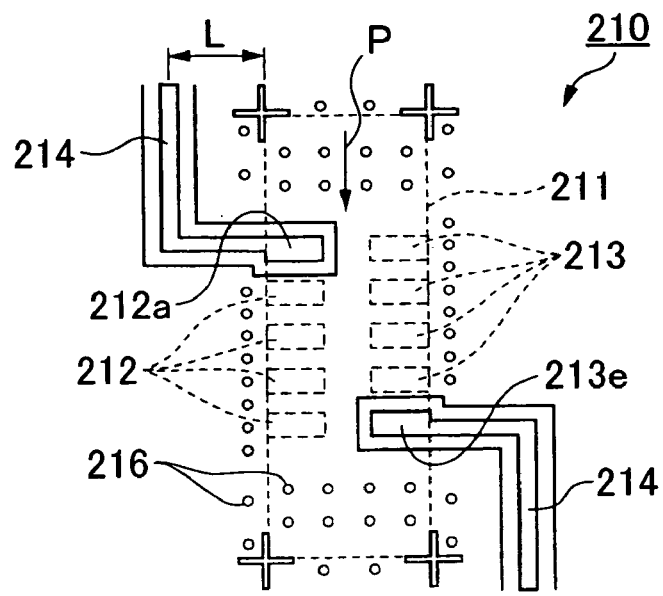
FIG. 32 is a schematic view showing a plurality of through holes which are provided in a printed substrate according to a seventh embodiment.

Furthermore, as shown in FIG. 32, a printed substrate 210 in which, within the fitting region 211 for the SAW filter, a plurality of through holes 216, ..., 216 were provided only in regions which were separated from the terminal electrodes 212, ..., 212 and 213, ..., 213, while, in regions within a predetermined distance from the fitting region 211 for the SAW filter, a plurality of through holes 216, ..., 216 were provided in regions in the vicinity of the terminal electrodes 212, ..., 212 and 213, ..., 213, was taken as the seventh embodiment.

Figure 33:
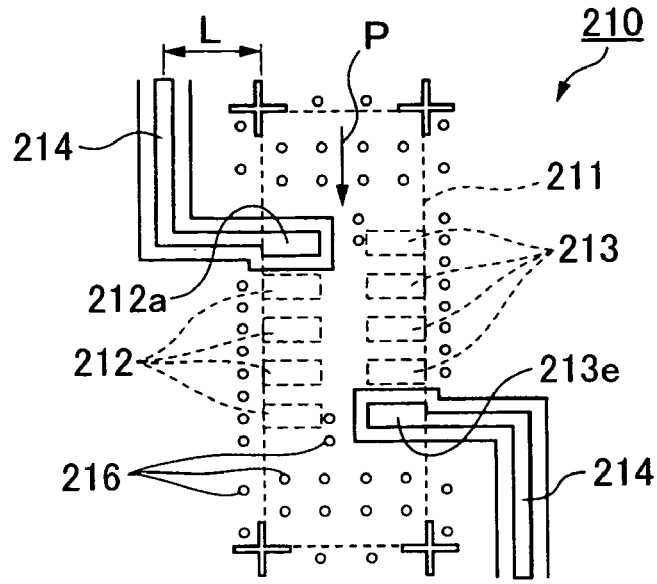
FIG. 33 is a schematic view showing a plurality of through holes which are provided in a printed substrate according to an eighth embodiment.

Furthermore, as shown in FIG. 33, a printed substrate 210 in which, within the fitting region 211 for the SAW filter, a plurality of through holes 216, ..., 216 were provided in a region which was separated from the terminal electrodes 212, ..., 212 and 213, ..., 213 and in the vicinity of the input side terminal electrode 212a and the output side terminal electrode 213e, while, in regions within a predetermined distance (for example, 1.5 mm) from the fitting region 211 for the SAW filter, a plurality of through holes 216, ..., 216 were provided in regions in the vicinity of the terminal electrodes 212, 212 and 213, ..., 213, was taken as the eighth embodiment.

It should be understood that, in the fifth through the eighth embodiment, with regard to the through holes 216, ..., 216 in the vicinity of the terminal electrodes 212, ..., 212 and 213, ..., 213 within the fitting region 211 for the SAW filter, the diameter was set to 0.3 to 0.4 mm; while, with regard to the through holes 216, ..., 216 in the region which was separated from the terminal electrodes 212, ..., 212 and 213, ..., 213 within the fitting region 211 for the SAW filter, the diameter was set to 0.5 mm.

Furthermore, with regard to the through holes 216, ..., 216 in the region which was within the predetermined distance of the fitting region 211 for the SAW filter, the diameter was set to 0.4 to 0.5 mm.

Figure 34:
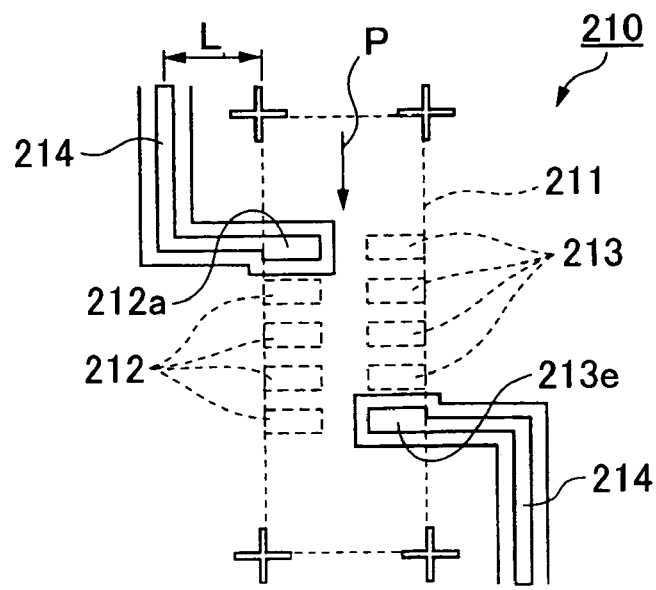
FIG. 34 is a schematic view showing a plurality of through holes which are provided in a printed substrate according to a fifth comparison example.

Furthermore, as shown in FIG. 34, a printed substrate 210 in which no through holes 216 were provided in regions within the fitting region 211 for the SAW filter and outside this fitting region 211 was taken as the fifth comparison example.

In the following, the manner will be explained in which the attenuation characteristic was tested when a SAW filter was fitted to the printed substrates of the fifth through the eighth embodiments and the fifth comparison example.

First, as shown in the Table 3 given below, for the fifth through the eighth embodiments, a plurality of printed substrates were manufactured with the through holes 216, ..., 216 of a predetermined size being provided in different positions.

TABLE 3

| THROUGH HOLE PATTERN | THROUGH HOLES | ATTENUATION |
|---|---|---|
| COMPARISON EXAMPLE 5 | φ0.3~0.5 | 40 dB |
| EMBODIMENT 5 | | 57 dB |
| EMBODIMENT 6 | | 59 dB |
| EMBODIMENT 7 | | 58 dB |
| EMBODIMENT 8 | | 65 dB |

And, solder was adhered in predetermined positions upon each of the printed substrates, and the SAW filters were mounted upon this solder, and the SAW filters and the printed substrates were joined together by heating them up to, for example, 220° C. And the attenuation characteristic of the SAW filters was measured.

As shown in Table 3, it will be understood that, by comparison to the fifth comparison example in which no through holes 216 were formed, the attenuation characteristic is enhanced for the fifth through the eighth embodiments, in which a plurality of through holes 216, ..., 216 were provided in a region within the fitting region 211 of the SAW filter, or within a predetermined distance from the fitting region 211 for the SAW filter.

In particular, it will be understood that the attenuation characteristic is enhanced by yet a further level for the eighth embodiments, in which a plurality of through holes 216, ..., 216 were provided in the vicinity of the input side terminal electrode 212a and the output side terminal electrode 213e within the fitting region 211 for the SAW filter.

In other words, it will be understood that the attenuation characteristic attained its maximum value (for example, 65 dB) for the printed substrate 210 in which: the length L of the two micro strip lines 214, 214 was less than or equal to 10 mm and the micro strip lines extended in a direction which was orthogonal with respect to the direction of propagation P of the surface elastic wave in the SAW filter; in which, within the fitting region 211 for the SAW filter, a plurality of through holes 216, ..., 216 of a predetermined size were provided in a region which was separated from the terminal electrodes 212, ..., 212 and 213, ..., 213, and in the vicinity of the input side terminal electrode 212a and the output side terminal electrode 213e; and in which, in a region within a predetermined distance of the fitting region 211 for the SAW filter, a plurality of through holes 216, ..., 216 of a predetermined size were provided in the vicinity of the input side terminal electrode 212a and the output side terminal electrode 213e.

It should be understood that, in the above described third embodiment, an attenuation characteristic of the desired high value (for example, 70 dB) which is peculiar to, for example, langasite or the like can be obtained by providing a slit which consists of a through hole which extends in, for example, a direction (for example, the orthogonal direction) which intersects the direction of propagation P of the surface elastic wave within the fitting region 211 of the SAW filter, for example.

It should be understood that, as compared to the attenuation characteristic of a SAW filter which includes, for example, quartz as its piezoelectric element (for example, 30 to 40 dB or the like), according to the printed substrate 210 according to the above described third embodiment, as for example in the figure shown in FIG. 9 of the frequency characteristic of a SAW filter, it is possible to take advantage efficiently of the higher attenuation characteristic like the attenuation characteristic of a SAW filter which includes, for example, langasite ($La_3Ga_5SiO_{14}$) as its piezoelectric element (for example, 60 to 70 dB or the like).

Just like the printed substrate 10 according to the first embodiment, the printed substrate 210 according to this third embodiment as well can be applied to an amplification device, a distribution device, a composition device, a switchover device, a signal reception device, and a signal transmission device in a communication system, to a mobile station device and a base station device in a mobile communication system which incorporates said printed substrate, and to a wireless communication device which incorporates said printed substrate.

FIG. 10 is a structural figure showing an amplification device 20 in a communication system which comprises a printed substrate 210 according to an embodiment of the present invention; FIG. 11 is a structural view of a communication system 25 which comprises the amplification device 20 shown in FIG. 10; FIGS. 12 and 13 are structural figures showing a distribution device 30 in a communication system which comprises a printed substrate 210 according to an embodiment of the present invention; FIG. 14 is a structural view of a communication system 35 which comprises the distribution device 30 shown in FIG. 12 or FIG. 13; FIGS. 15 and 16 are structural figures showing a composition device 40 in a communication system which comprises a printed substrate 210 according to an embodiment of the present invention; FIG. 17 is a structural view of a communication system 45 which comprises the composition device 40 shown in FIG. 15 or FIG. 16; FIG. 18 is a structural figure showing a switchover device 50 in a communication system which comprises a printed substrate 210 according to an embodiment of the present invention; FIGS. 19 and 20 are structural figures showing a signal reception device 60 in a communication system which comprises a printed substrate 210 according to an embodiment of the present invention; FIGS. 21 and 22 are structural figures showing a signal transmission device 70 in a communication system which comprises a printed substrate 210 according to an embodiment of the present invention; and FIG. 23 is a structural figure showing a wireless communication device 80 which comprises a printed substrate 210 according to an embodiment of the present invention.

The amplification device, the distribution device, the composition device, the switchover device, the signal reception device, and the signal transmission device in a communication system which is provided with the printed substrate 210 according to the third embodiment, and the mobile station device and the base station device in a mobile communication system which is provided with said printed substrate, and also the wireless communication device which is provided with said printed substrate, all provide the same operational benefits as in the case of the printed substrate 10 which constituted the first embodiment.

The Fourth Embodiment

Figure 35:
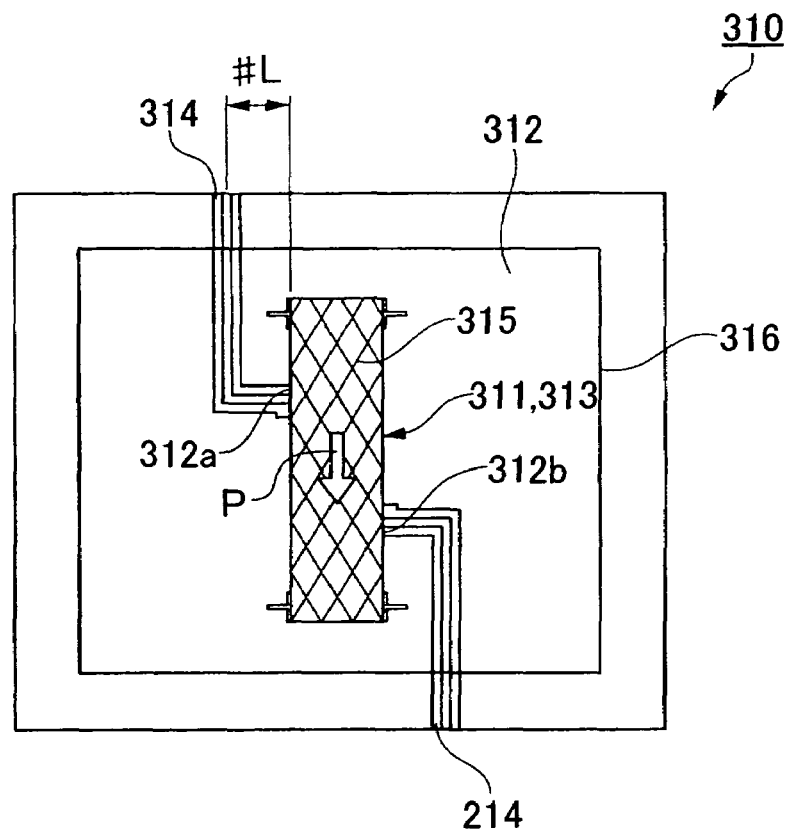
FIG. 35 is a plan view of an electronic component which comprises a shield structure according to an embodiment of the present invention.
Figure 36:
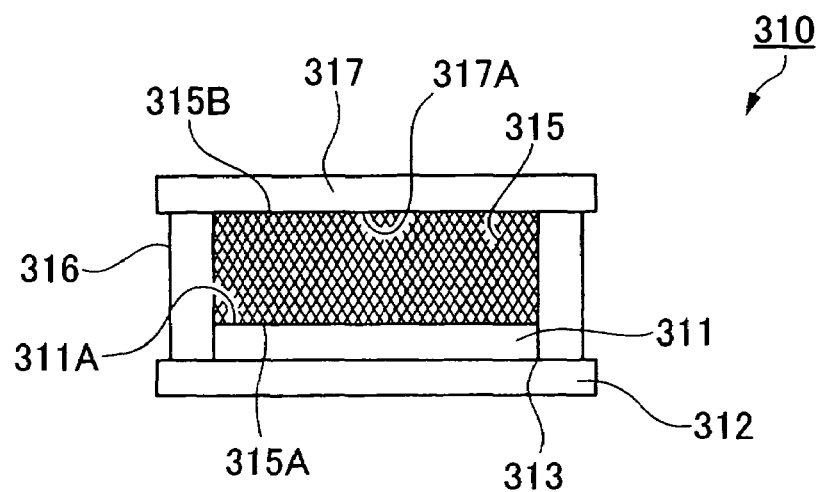
FIG. 36 is a side view of the electronic component comprising a shield structure shown in FIG. 35.
Figure 37A:
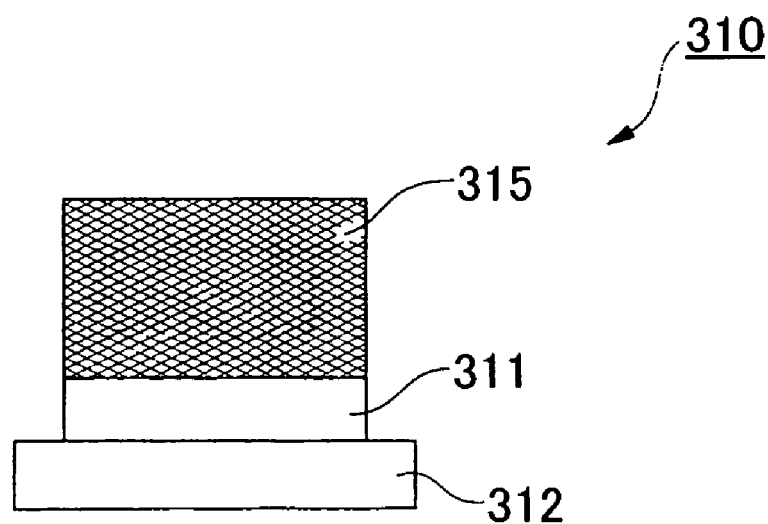
FIG. 37A is a schematic view showing the natural state of a protective member for the electronic component which comprises a shield structure shown in FIG. 1.
Figure 37B:
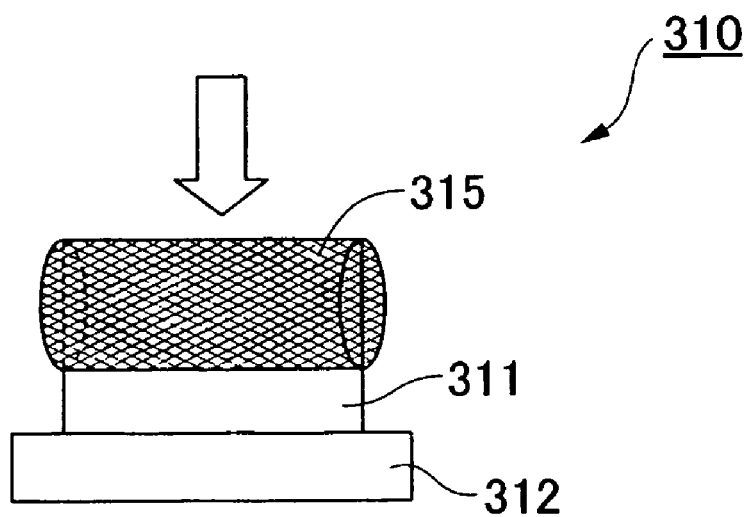
FIG. 37B is a schematic view showing an example of an elastically deformed state of the protective member for the electronic component which comprises a shield structure shown in FIG. 1.

In the following, an electronic component which comprises a shield structure according to a fourth embodiment of the present invention will be explained with reference to the appended drawings. FIG. 35 is a plan view of an electronic component 310 which comprises a shield structure according to the fourth embodiment of the present invention; FIG. 36 is a side view of the electronic component 310 comprising a shield structure shown in FIG. 35; FIG. 37A is a schematic view showing the natural state of a protective member 315 for the electronic component 310 comprising a shield structure shown in FIG. 35; and FIG. 37B is a schematic view showing an example of an elastically deformed state of the protective member 315 for the electronic component 310 comprising a shield structure shown in FIG. 35.

The electronic component 310 comprising a shield structure according to the fourth embodiment is one which is equipped with a SAW filter 311 which includes, for example, langasite ($La_3Ga_5SiO_{14}$) as its piezoelectric element, and, as shown in FIG. 35, it comprises, in a fitting region 313 upon a printed substrate 312 which is for example shaped as a rectangle or the like as seen in plan view, a plurality of pairs of terminal electrodes which are exposed at their two mutually opposing long sides, in other words input side terminal electrodes 212, ..., 212 and output side terminal electrodes 213, 213 which constitute pairs.

It should be understood that, with these terminal electrodes, only, for example, the one pair consisting of the input side terminal electrode 312a and the output side terminal electrode 313b which are opposed in, for example, the diagonal direction are connected to the input terminal and the output terminal of the SAW filter 311, while the other terminal electrodes are connected to ground. In other words, the transmission direction P of the frequency signal which is inputted into the SAW filter 311 is made to be, for example, the direction parallel to the long side.

Micro strip lines 314, 314 are connected to the input side terminal electrode 312a and the output side terminal electrode 313b which are connected to the input terminal and to the output terminal of the SAW filter.

The micro strip lines 314, 314 which are connected to the terminal electrodes 312a, 313b are bent into, for example, letter "L" shapes, and they are provided at positions which are separated by just a predetermined distance #L (for example 10 mm or the like) from the fitting region 311 of the SAW filter (in other words, at elbow positions), so as to extend in mutually opposite directions, and along directions which are parallel to the transmission direction P of the frequency signal within the SAW filter 311.

A protective member 315 which has a surface which is coated with, for example, a conductive sheet or the like is carried upon the surface 311A of the SAW filter 311 which has been mounted in the fitting region 313 upon the printed substrate 312. Here, within the conductive surface of the protective member 315, by surface contact with the surface 311A of the SAW filter 311, the size of a conductive coating surface 315A of the protective member which covers this surface 311A is set so as to be the same as the size of the surface 311A of the SAW filter 311, or to be smaller than the size thereof.

For example, if the size of the surface 311A of the SAW filter 311 is 17 mm vertical by 6 mm horizontal, then the size of the conductive coating surface 315A of the protective member 315 which covers this surface 311A may be set so as to be less than or equal to 17 mm vertical by about (6±1) mm horizontal.

Furthermore, a shield frame member 316 which is shaped as a frame and which is made from a metal (for example, from copper or the like) is provided so as to surround the periphery of the fitting region 313 for the SAW filter 311, and moreover a shield lid member 317 which is shaped as a lid and which is made from a metal (for example, from copper or the like) is provided so as to be sandwiched from both sides by the printed substrate 312.

And the surface (a conductive coating surface) 315B of the protective member 315 which is carried upon the surface 311A of the SAW filter 311 is set so as to be in surface contact with the inner surface 317A of the shield lid member 317. In other words, the protective member 315 is arranged so as to be sandwiched from both sides by the surface 311A of the SAW filter 311 and by the inner surface 317A of the shield lid member 317.

Here, for example, if the height of the shield frame member 316 by which it projects from above the surface of the printed substrate 312 is 7 mm, then the thickness of the protective member 315, in other words the distance between the one conductive coating surface 315A of the protective member 315 and the other conductive coating surface 315B thereof may be set so as to be about 5.0 mm to 6.0 mm.

It should be understood that the protective member 315 is made so as to be elastically deformable; and the thickness of the protective member 315 in its state in which is has been elastically deformed by being sandwiched between the surface 311A of the SAW filter 311 and the inner surface 317A of the shield lid member 31 may desirably, for example, be set so as to be 50% to 80% of its thickness in its natural state.

In other words, it is possible to prevent deviation of the position of the protective member 315 by arranging for the protective member 315 to be squeezed by just 20% to 50% in the thickness direction as compared to its natural state, and it is possible to obtain the desired attenuation characteristic for the SAW filter 311 in a stable manner with good repeatability.

Here when, as for example shown in FIG. 37A, a load due to the shield lid member 317 or the like acts from above with respect to the protective member 315 which is carried upon the surface 311A of the SAW filter 311, as for example shown in FIG. 37B, the protective member 315 which has been elastically deformed does not sink downwards lower than the surface 311A of the SAW filter 311, and moreover it is set so that no portion which projects from above the surface 311A of the SAW filter 311 towards the outside is created.

It should be understood that, within the fitting region 313 for the SAW filter 311, a plurality of through holes (not shown in the figures) of a predetermined diameter (for example, of a diameter of 0.3 mm or the like) are provided between neighboring ones of the terminal electrodes and the opposing terminal electrodes, and, within each of these through holes, electrically conductive material is provided in order electrically to connect together the surface of the printed substrate 312 and the rear surface thereof which is connected to ground. Furthermore, on the printed substrate 312 outside the fitting region 313 for the SAW filter 311, there are provided a plurality of through holes (not shown in the figures) of a predetermined diameter (for example, of a diameter of 0.5 mm or the like) positioned with a predetermined interval between them (for example, 2 to 3 mm or the like).

The electronic component 310 comprising a shield structure according to the fourth embodiment has the above described structure.

When, with this electronic component 310 comprising a shield structure, a frequency signal is transmitted through the SAW filter 311 via the input side terminal electrode 312a and the output side terminal electrode 312b, by covering the surface 311A of the SAW filter 311 with the protective member 315 which comprises the electrically conductive coating surface 315A whose size is equal to, or is less than, that of this surface 311A, along with it being possible to prevent the frequency signal which is inputted, for example, from the input side terminal electrode 312a from being undesirably directly transmitted to the output side terminal electrode 312b, also it is possible to suppress the influence of electromagnetic waves or of noise from the outside.

In other words, after the frequency signal which is inputted from the input side terminal electrode 312a has been transmitted within the SAW filter 311 from the input terminal of the SAW filter 311 towards its output terminal, the desired band transmission processing is performed upon it within the SAW filter 311 in the process of its reaching the output side terminal electrode 312b.

Due to this, it is possible to prevent deterioration of the attenuation characteristic of the SAW filter 311 when covering the surface 311A of the SAW filter 311 with the protective member 315.

As has been described above, according to the electronic component 310 comprising a shield structure according to the fourth embodiment, it is possible to prevent deterioration of the attenuation characteristic of the SAW filter 311, and it is possible reliably to obtain the desired attenuation characteristic, even in the case of a SAW filter 311 which includes, for example, langasite as its piezoelectric element.

In the following, an example of the test results for the attenuation characteristic when a SAW filter 311 which includes langasite as its piezoelectric element is fitted to the electronic component 310 comprising a shield structure according to the fourth embodiment will be explained while referring to the appended drawings.

Figure 38:
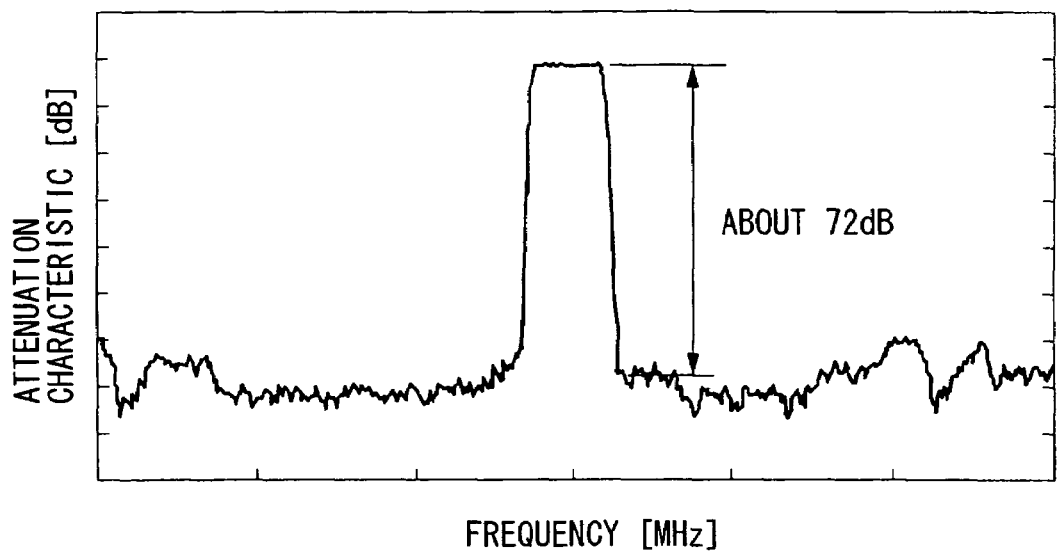
FIG. 38 is a graphic view showing the attenuation characteristic of a SAW filter in a sixth comparison example with respect to this embodiment.
Figure 39:
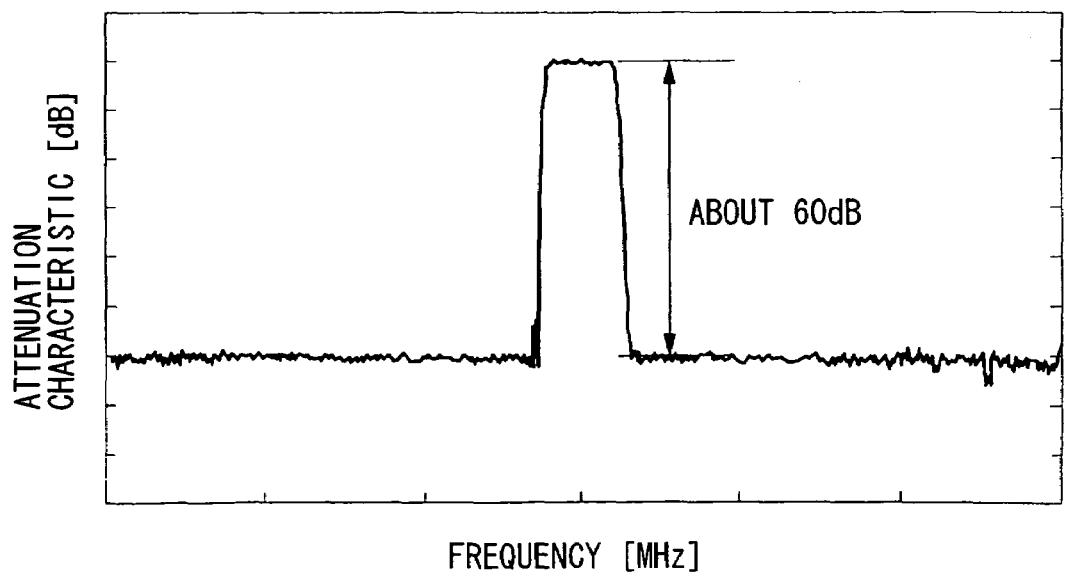
FIG. 39 is a graphic view showing the attenuation characteristic of a SAW filter in a seventh comparison example with respect to this embodiment.
Figure 40:
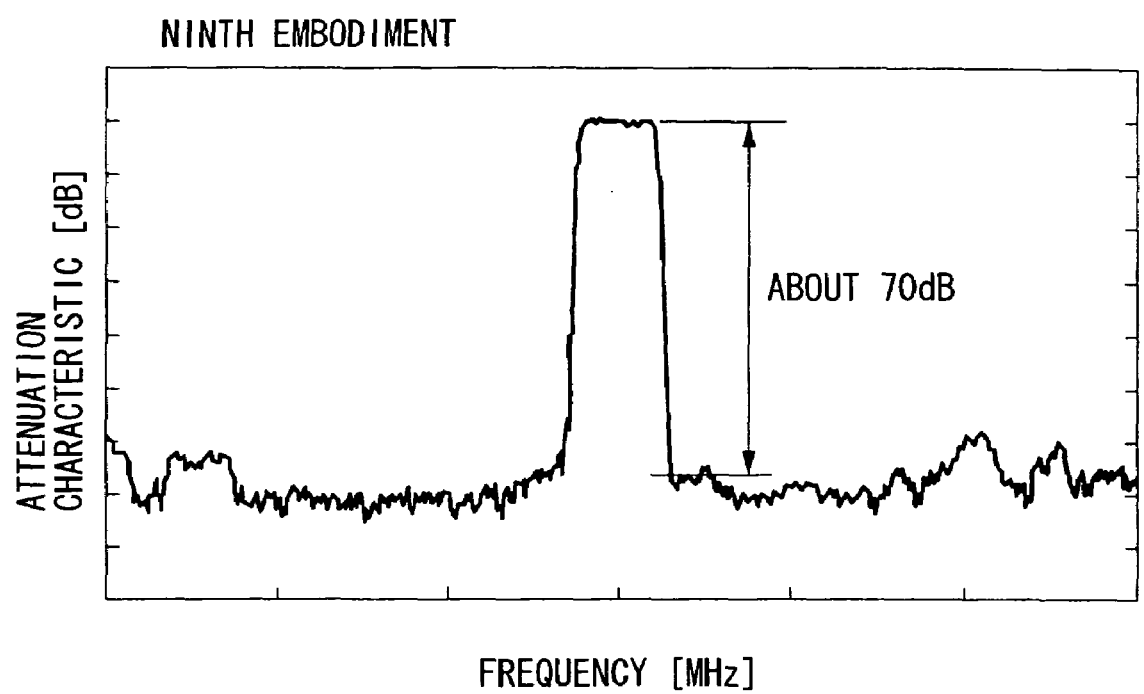
FIG. 40 is a graphic view showing the attenuation characteristic of a SAW filter in a ninth embodiment of this embodiment.
Figure 41A:
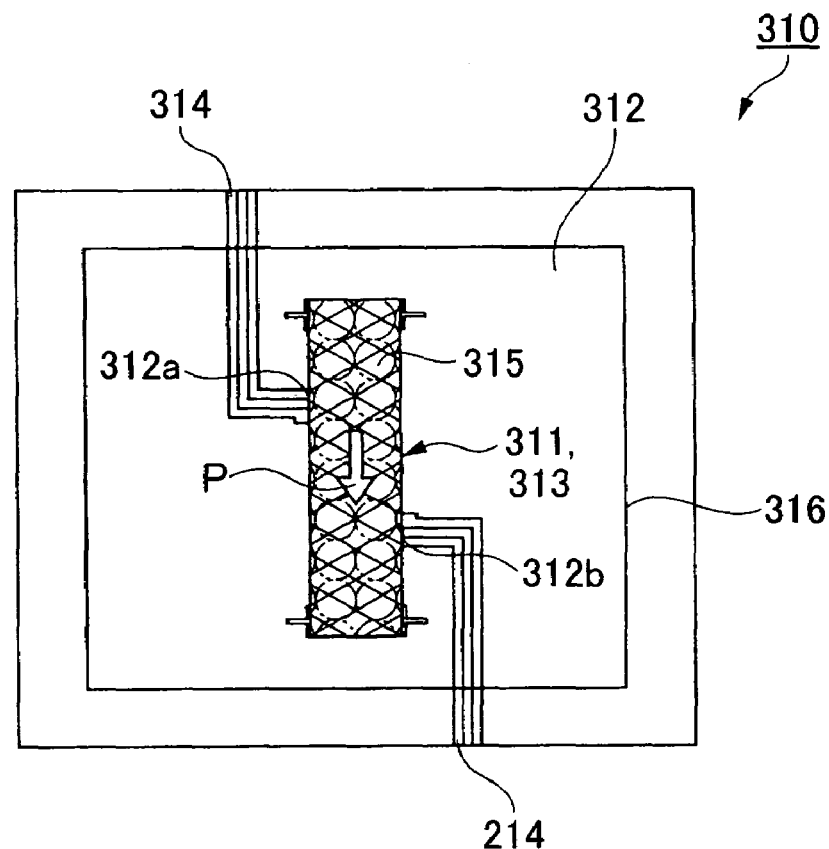
FIG. 41A is a plan view of an electronic component which comprises a shield structure according to a tenth embodiment of this embodiment.
Figure 41B:
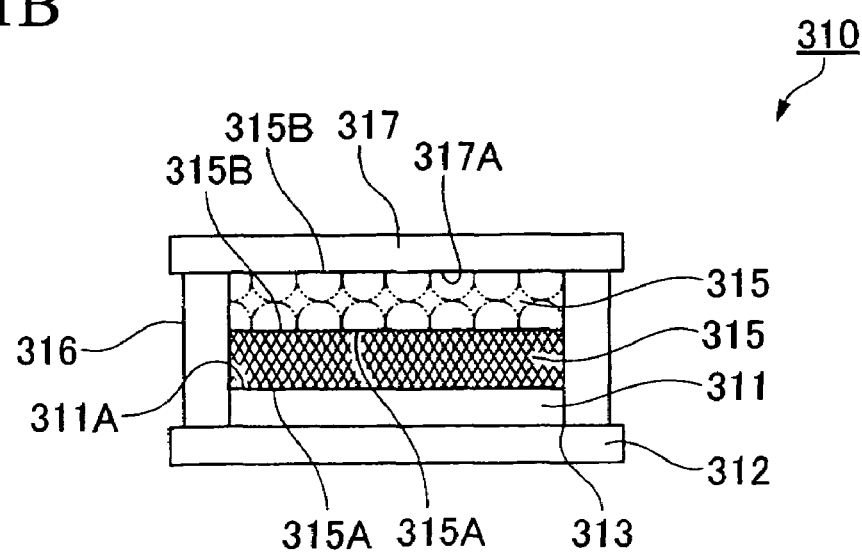
FIG. 41B is a side view of this electronic component which comprises a shield structure shown in FIG. 41A.
Figure 42:
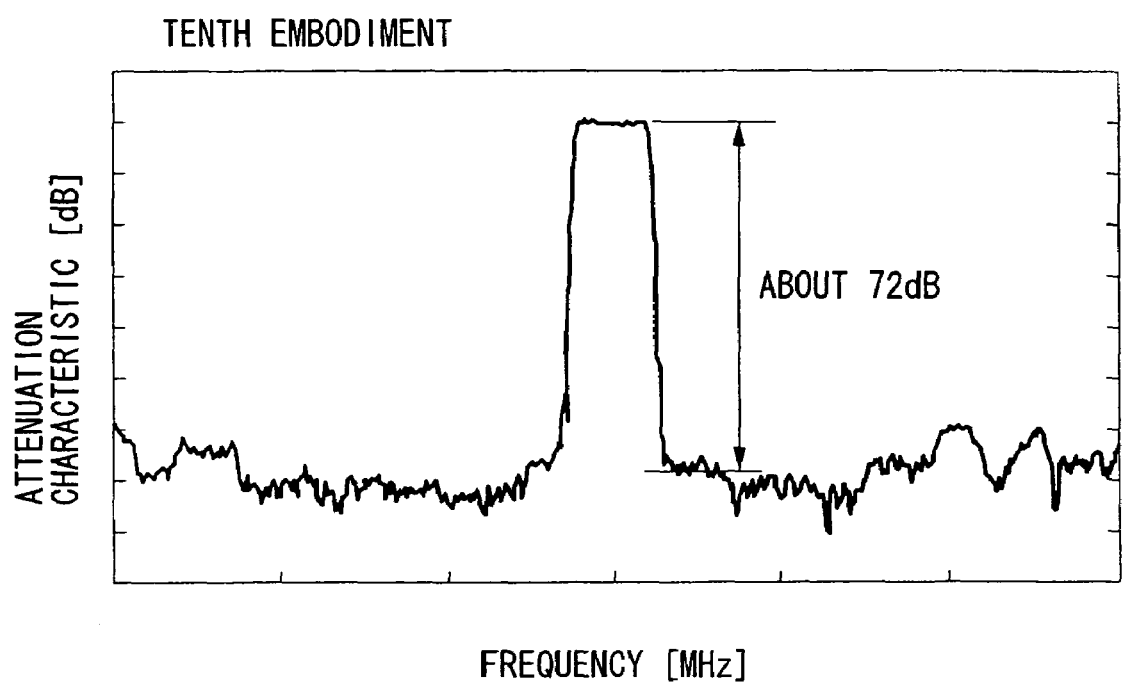
FIG. 42 is a graphic view showing the attenuation characteristic of a SAW filter in a tenth embodiment of this embodiment.
Figure 43A:
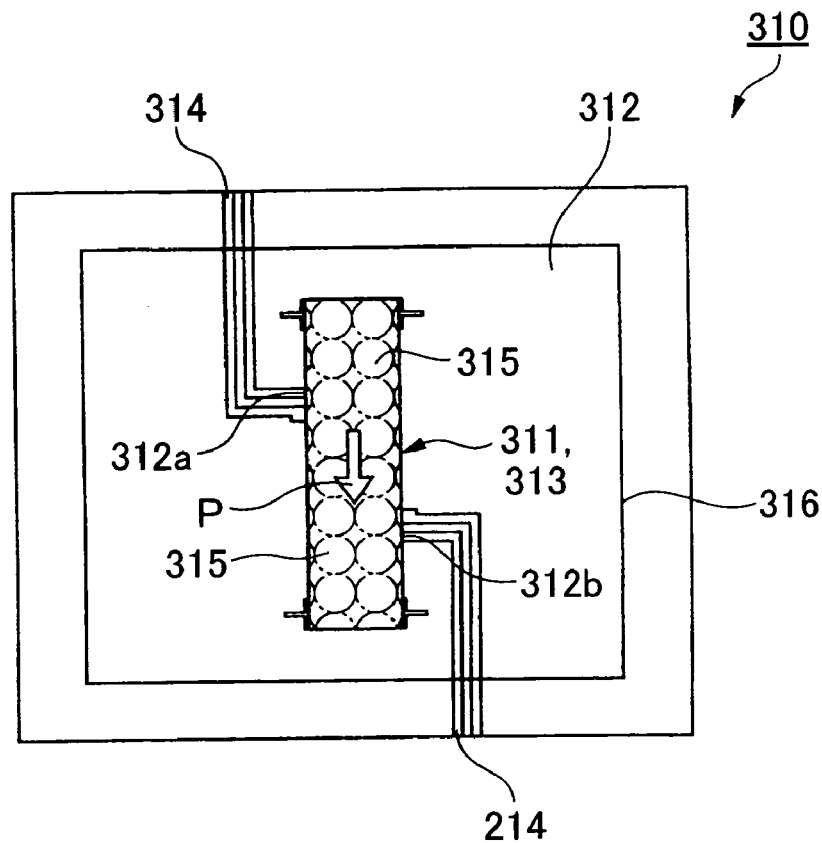
FIG. 43A is a plan view of an electronic component which comprises a shield structure according to an eleventh embodiment of this embodiment.
Figure 43B:
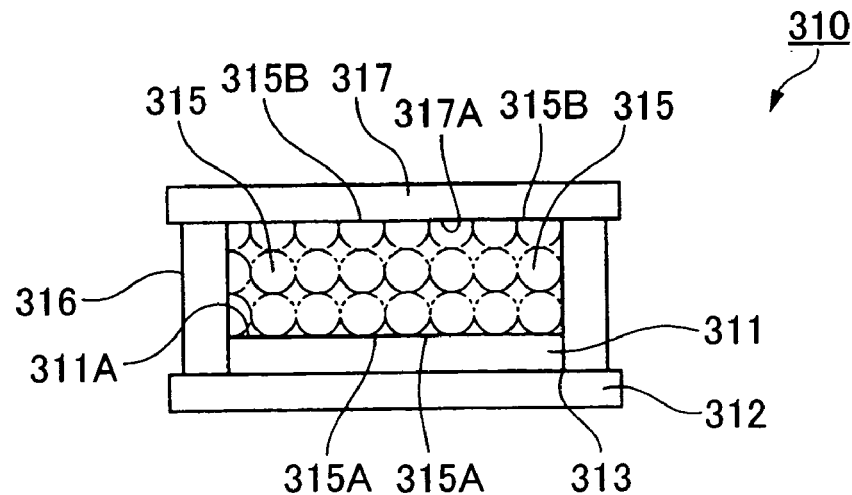
FIG. 43B is a side view of this electronic component which comprises a shield structure shown in FIG. 43A.
Figure 44:
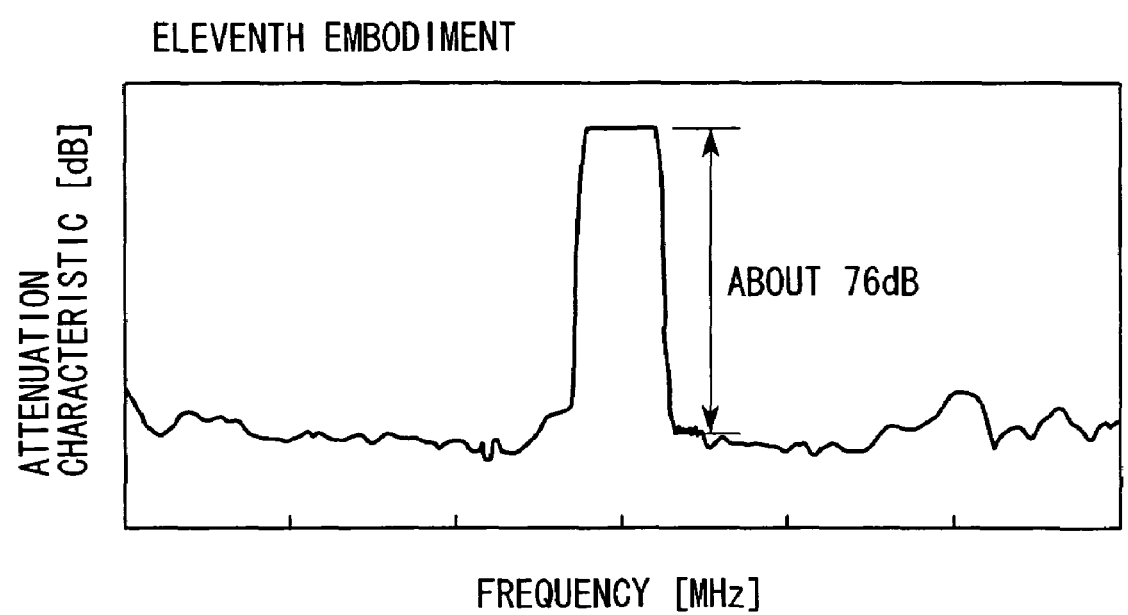
FIG. 44 is a graphic view showing the attenuation characteristic of a SAW filter in this eleventh embodiment of this embodiment.
Figure 45A:
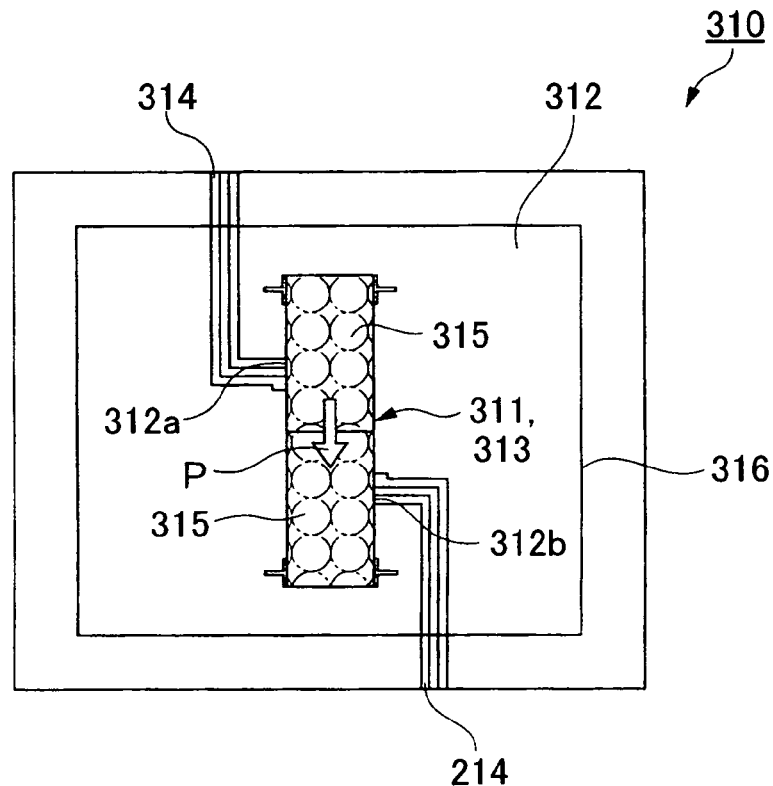
FIG. 45A is a plan view of an electronic component which comprises a shield structure according to a twelfth embodiment of this embodiment.
Figure 45B:
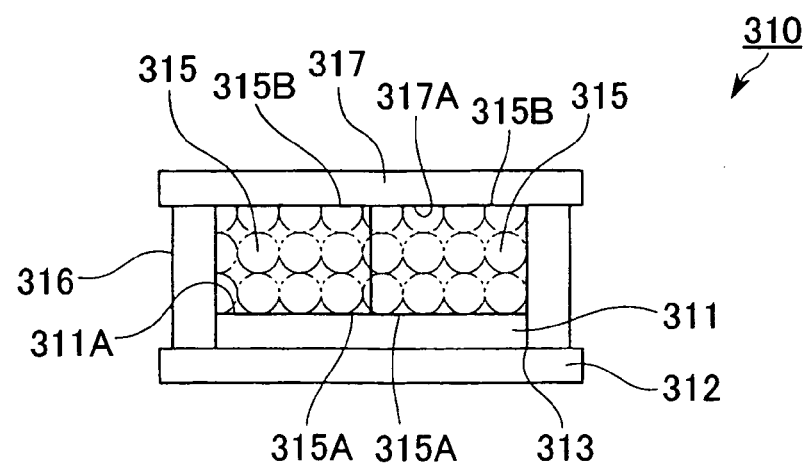
FIG. 45B is a side view of this electronic component which comprises a shield structure shown in FIG. 45A.
Figure 46:
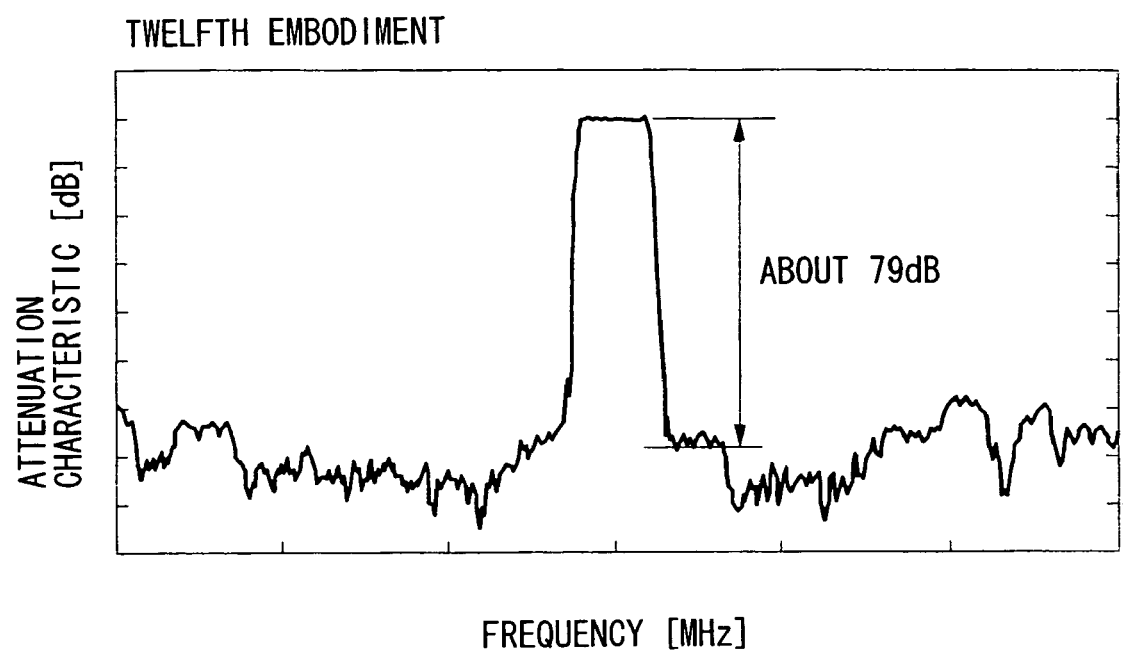
FIG. 46 is a graphic view showing the attenuation characteristic of a SAW filter in this twelfth embodiment of this embodiment.
Figure 47A:
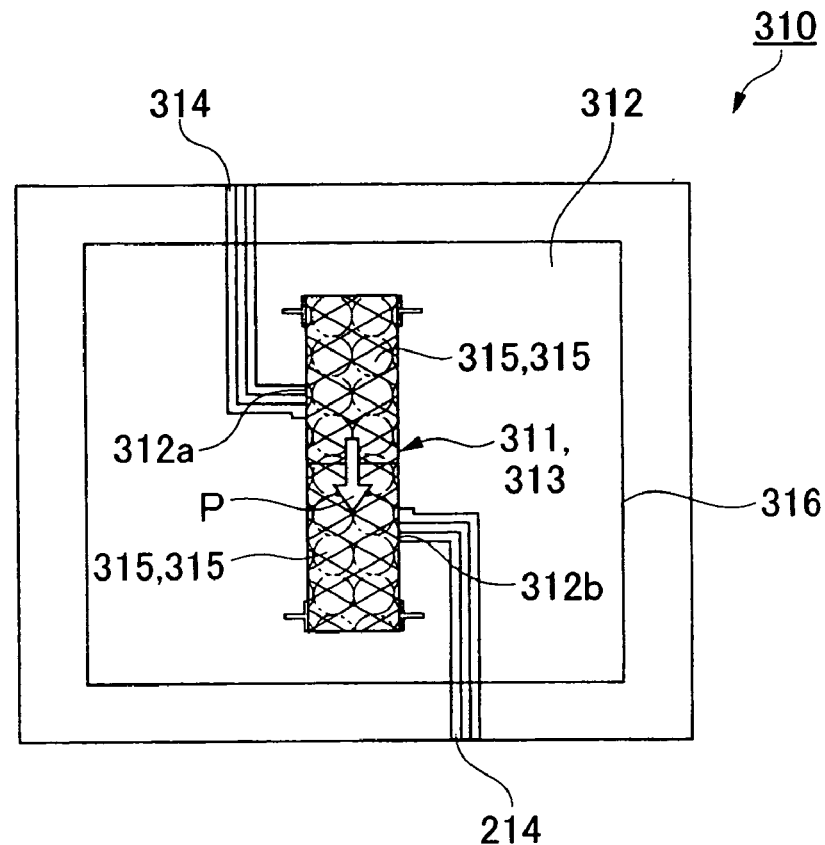
FIG. 47A is a plan view of an electronic component which comprises a shield structure according to a thirteenth embodiment of this embodiment.
Figure 47B:
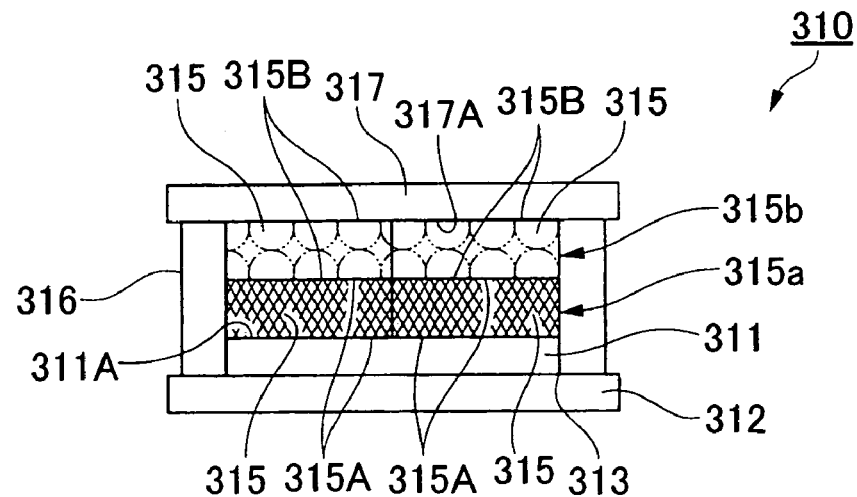
FIG. 47B is a side view of this electronic component which comprises a shield structure shown in FIG. 47A.
Figure 48:
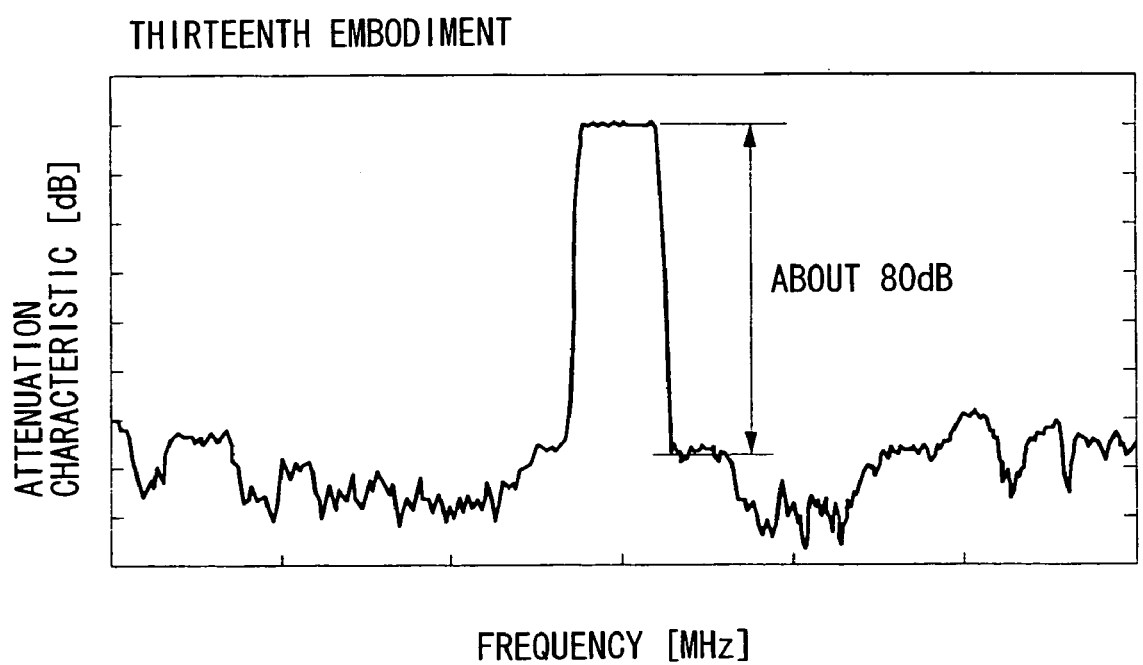
FIG. 48 is a graphic view showing the attenuation characteristic of a SAW filter in this thirteenth embodiment.

FIG. 38 is a graphic view showing the attenuation characteristic of a SAW filter 311 in a sixth comparison example with respect to the fourth embodiment; FIG. 39 is a graphic view showing the attenuation characteristic of a SAW filter 311 in a seventh comparison example with respect to this embodiment; FIG. 40 is a graphic view showing the attenuation characteristic of a SAW filter 311 in a ninth embodiment of a ninth embodiment; FIG. 41A is a plan view of an electronic component 310 which comprises a shield structure according to a tenth embodiment of this embodiment; FIG. 41B is a side view of this electronic component 310 which comprises the shield structure shown in FIG. 41A; FIG. 42 is a graphic view showing the attenuation characteristic of a SAW filter 311 in a tenth embodiment of this embodiment; FIG. 43A is a plan view of an electronic component 310 which comprises a shield structure according to an eleventh embodiment of this embodiment; FIG. 43B is a side view of this electronic component 310 which comprises the shield structure shown in FIG. 43A; FIG. 44 is a graphic view showing the attenuation characteristic of a SAW filter 311 in this eleventh embodiment of this embodiment; FIG. 45A is a plan view of an electronic component 310 which comprises a shield structure according to a twelfth embodiment of this embodiment; FIG. 45B is a side view of this electronic component 310 which comprises the shield structure shown in FIG. 45A; FIG. 46 is a graphic view showing the attenuation characteristic of a SAW filter 311 in this twelfth embodiment of this embodiment; FIG. 47A is a plan view of an electronic component 310 which comprises a shield structure according to a thirteenth embodiment of this embodiment; FIG. 47B is a side view of this electronic component 310 which comprises the shield structure shown in FIG. 47A; and FIG. 48 is a graphic view showing the attenuation characteristic of a SAW filter 311 in a thirteenth embodiment of this embodiment.

It should be understood that, in the following, as shown in FIGS. 35 and 36, an electronic component 310 comprising a shield structure, in which the axial line direction of the protective member 315 which is made from an electrically conductive sheet and which, in its natural state, is formed as having an external appearance of, for example, roughly a circular pillar shape, is arranged so as to be parallel to the direction of transmission P of the frequency signal within the SAW filter 311, and which, in its state of being elastically deformed so as to be sandwiched from both sides by the surface 311A of the SAW filter 311 and the inner surface 317A of the shield lid member 317, is taken as being the ninth embodiment.

Furthermore, as shown in FIGS. 41A and B, an electronic component 310 comprising a shield structure, in which the axial line directions of two protective members 315, 315 which are made from electrically conductive sheets and which, in their natural states, are formed as having an external appearance of, for example, roughly a circular pillar shape, are arranged so as to be parallel to the direction of transmission P of the frequency signal within the SAW filter 311, with these two protective members 315, 315 being superimposed in the thickness direction, and which, in its state of being elastically deformed so as to be sandwiched from both sides by the surface 311A of the SAW filter 311 and the inner surface 317A of the shield lid member 317, is taken as being the tenth embodiment.

Furthermore, as shown in FIGS. 43A and B, an electronic component 310 comprising a shield structure, in which the axial line direction of a single protective member 315 which is made from an electrically conductive sheet and which, in its natural state, is formed as having an external appearance of, for example, roughly a circular pillar shape, is arranged so as to be parallel to the direction of transmission P of the frequency signal within the SAW filter 311, and furthermore, which, in its state of being elastically deformed so as to be sandwiched from both sides by the surface 311A of the SAW filter 311 and the inner surface 317A of the shield lid member 317, is taken as being the eleventh embodiment.

Furthermore, as shown in FIGS. 45A and B, an electronic component 310 comprising a shield structure, in which the axial line directions of two protective members 315, 315 which are made from electrically conductive sheets and which, in their natural states, are formed as having an external appearance of, for example, roughly a circular pillar shape, are arranged so as to be orthogonal to the direction of transmission P of the frequency signal within the SAW filter 311, with these two protective members 315, 315 being arranged so as to be adjacent along the direction of transmission P, and which, in its state of being elastically deformed so as to be sandwiched from both sides by the surface 311A of the SAW filter 311 and the inner surface 317A of the shield lid member 317, is taken as being the twelfth embodiment.

Furthermore, as shown in FIGS. 47A and B, an electronic component 310 comprising a shield structure, in which the axial line directions of two protective members 315, 315 which are made from electrically conductive sheets and which, in their natural states, are formed as having an external appearance of, for example, roughly a circular pillar shape, are arranged so as to be orthogonal to the direction of transmission P of the frequency signal within the SAW filter 311, with these two protective members 315, 315 being arranged so as to be adjacent along the direction of transmission P, with a first layer 315a and a second layer 315b which is made in the same manner as this first layer 315a and which is arranged so as to be superimposed in the thickness direction with respect to the first layer 315a, and which, in its state of being elastically deformed so as to be sandwiched from both sides by the surface 311A of the SAW filter 311 and the inner surface 317A of the shield lid member 317, is taken as being the thirteenth embodiment.

Furthermore, in the electronic component 310 comprising a shield structure according to the ninth embodiment described above, an electronic component which comprises a shield structure in the state with the protective member 315, the shield frame member 316, and the shield lid member 317 omitted, is taken as the sixth comparison example.

Furthermore, in the electronic component 310 comprising a shield structure according to the ninth embodiment described above, an electronic component which comprises a shield structure in the state with the protective member 315 omitted, is taken as the seventh comparison example.

In the following, the manner will be explained in which the attenuation characteristic was tested for a SAW filter 311 of an electronic component which comprised a shield structure of the thirteenth embodiments and the sixth and seventh comparison examples.

First, solder was adhered in predetermined positions upon each of the printed substrates 312, and the SAW filters 311 were mounted upon this solder, and the SAW filters 311 and the printed substrates 312 were joined together by heating them up to, for example, 230° C.

And the single protective member 315, or the two protective members 315, 315, are made so that the electrically conductive coating surface 315A of the protective member 315, or the electrically conductive coating surfaces 315A, 315A of two mutually adjoining such protective members 315, 315, which is/are carried upon the surface 311A of the SAW filter 311, is/are made to be of the same size as the surface 311A of the SAW filter 311, or is/are made to be smaller than said surface, For example, if the size of the surface 311A of the SAW filter 311 is 17 mm vertically by 6 mm horizontally, then the size of a one of the electrically conductive coating surfaces 315A of a protective member 315 which covers over this surface 311A may be set so as to be less than or equal to 17 mm vertically by about (6±1) mm horizontally.

And, the protective member 315 is set so that it is elastically deformed so that it is squeezed down by just 20% to 50% in the thickness direction as compared with its natural state, and so that it is sandwiched from both sides by the surface 311A of the SAW filter 311 and the inner surface 317A of the shield lid member 317, so that the other electrically conductive coating surface 315B of the protective member 315 comes into surface contact with the inner surface 317A of the shield lid member 317.

For example, if the height of the shield frame member 316 by which it projects up from the surface of the printed substrate 312 is 7 mm, then the thickness of the protective member 315, in other words the distance between the one electrically conductive coating surface 315A of the protective member 315 and its other electrically conductive coating surface 315B, is set so as to be about 5.0 mm to 6.0 mm.

And the attenuation characteristics of the SAW filters 311 were measured.

The test results are explained below.

With regard to the attenuation characteristic (about 72 dB) of the sixth comparison example in its state shown in FIG. 38 with the protective member 315, the shield frame member 316, and the shield lid member 317 omitted: as shown in FIG. 39, with the seventh comparison example in which the protective member 315 was omitted and the shield frame member 316 and the shield lid member 317 were provided so as to surround the periphery of the SAW filter, the attenuation characteristic deteriorated to about 60 dB.

Furthermore it will be understood that the attenuation characteristic of the ninth embodiment (about 70 dB) and the attenuation characteristic of the tenth embodiment (about 72 dB), in which the axial line directions of the protective member(s) 315 of roughly circular cylindrical form were arranged so as to be parallel with respect to the direction of transmission P of the frequency signal within the SAW filter 311, were almost the same as the attenuation characteristic of the sixth comparison example (about 72 dB).

And it will be understood that the attenuation characteristic of the eleventh embodiment (about 76 dB), the attenuation characteristic of the twelfth embodiment (about 79 dB), and the attenuation characteristic of the thirteenth embodiment (about 80 dB), in which the axial line directions of the protective member(s) 315 of roughly circular cylindrical form were arranged so as to be orthogonal with respect to the direction of transmission P of the frequency signal within the SAW filter 311, were enhanced as compared to those of the ninth and the tenth embodiment.

Due to this, by changing the shape and the size of the protective member 315, it is possible, for example, to change the vibrational pattern and the like of the flow of electrical current in the printed substrate 312, and it is possible efficiently and moreover stably to take advantage of a higher attenuation characteristic such as the attenuation characteristic of a SAW filter 311 which incorporates, for example, langasite ($La_3Ga_5SiO_{14}$) as its piezoelectric element (for example, 60 to 70 dB or the like), as compared to the attenuation characteristic of a SAW filter which incorporates, for example, quartz as its piezoelectric element (for example, 30 to 40 dB or the like).

And, by efficiently and moreover stably utilizing a SAW filter 311 which incorporates langasite as its piezoelectric element and which has a high attenuation characteristic, along with reducing the number of the SAW filters 311 which are required, it is also possible to ensure the desired out of band attenuation amount.

Figure 49:
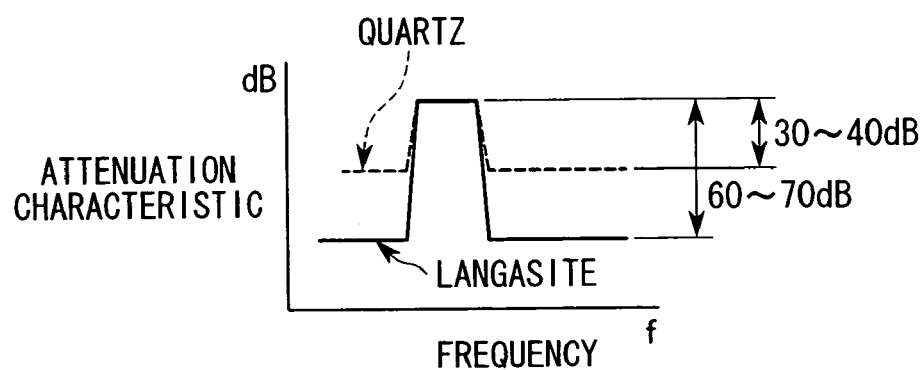
FIG. 49 is a figure showing the attenuation characteristic of a SAW filter.

It should be understood that, according to the electronic component 310 according to the above described fourth embodiment, as in the figure for the frequency characteristic of the SAW filter as for example shown in FIG. 49, it is possible efficiently to take advantage of a higher attenuation characteristic such as the attenuation characteristic of a SAW filter 311 which incorporates, for example, langasite ($La_3Ga_5SiO_{14}$) as its piezoelectric element (for example, 60 to 70 dB or the like), as compared to the attenuation characteristic of a SAW filter which incorporates, for example, quartz as its piezoelectric element (for example, 30 to 40 dB or the like).

Furthermore, if the electronic component 310 which comprises a shield structure according to the fourth embodiment is incorporated in, for example, a mobile station device or a base station device of a mobile communication system, or in an amplification device, a distribution device, a composition device, a switchover device, a signal reception device, or a signal transmission device or the like in a communication system, or in a wireless communication device or the like, then it becomes possible to increase the compactness and the lightness of the device, and it is possible to obtain the desired out of band attenuation amount characteristic for a signal which is received, it is possible to suppress crosstalk due to interference, and it is possible to suppress spurious signal transmission in a signal which is transmitted.

In the following, an amplification device, a distribution device, a composition device, a switchover device, a signal reception device, and a signal transmission device which incorporate an electronic component according to the fourth embodiment of the present invention, a mobile station device and a base station device in a mobile communication system which incorporate said electronic component, and a wireless communication device which incorporates said electronic component, will be explained with reference to the appended drawings.

Figure 50:
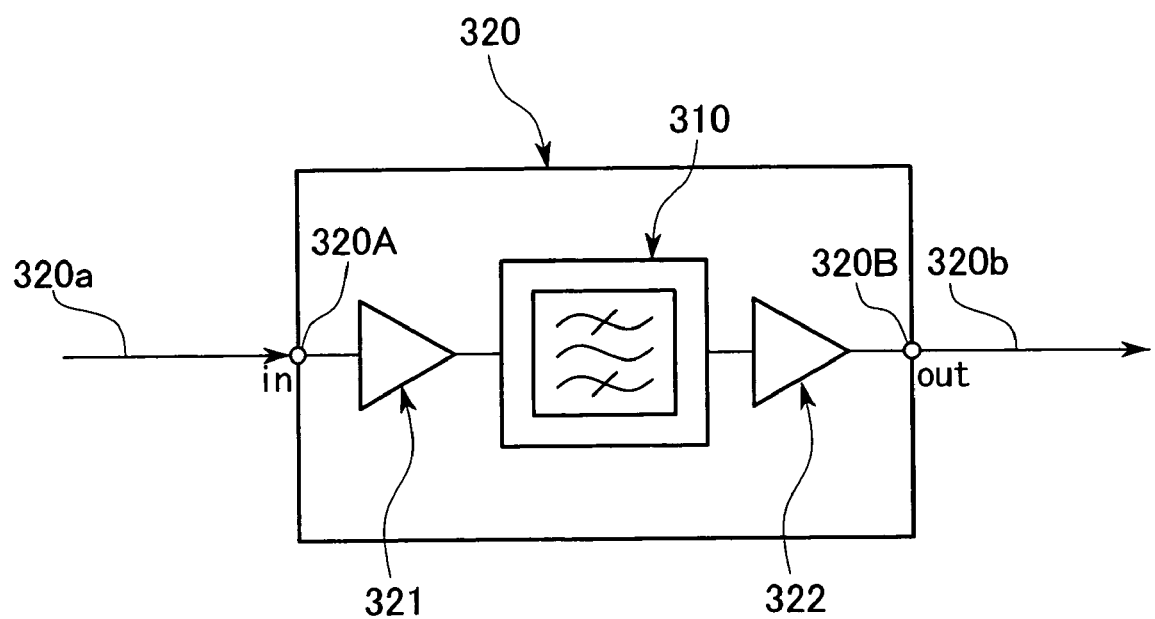
FIG. 50 is a structural figure showing an amplification device in a communication system which comprises an electronic component according to an embodiment of the present invention.
Figure 51:
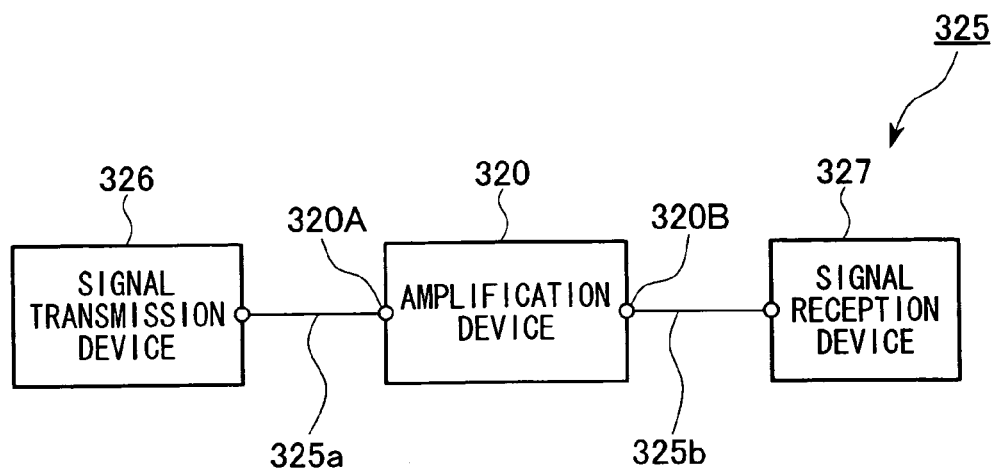
FIG. 51 is a structural figure showing a communication system which comprises the amplification device shown in FIG. 50.
Figure 52:
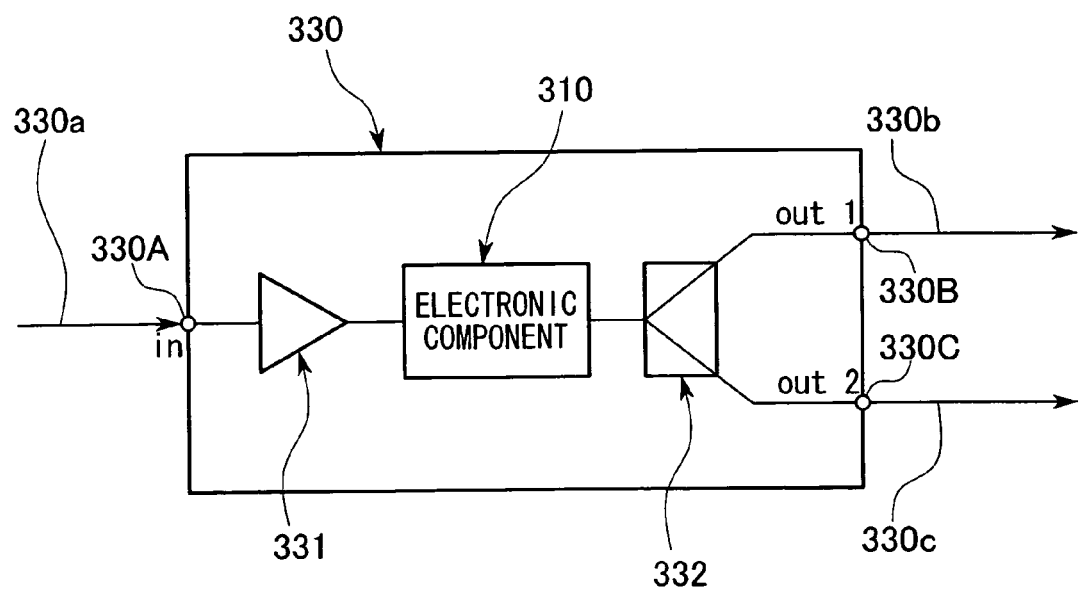
FIG. 52 is a structural figure showing a distribution device in a communication system which comprises an electronic component according to an embodiment of the present invention.
Figure 53:
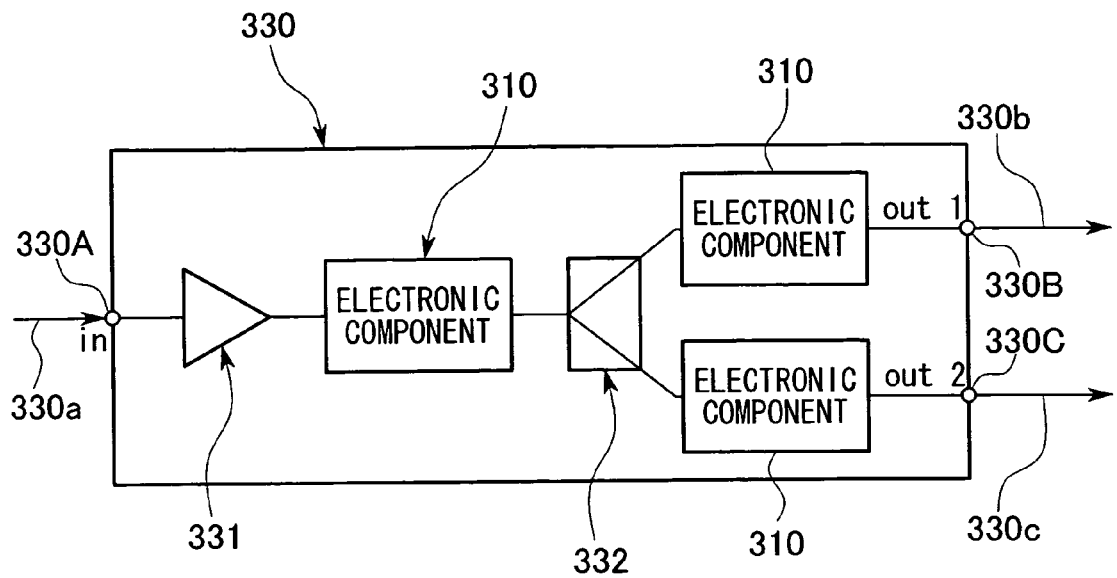
FIG. 53 is a structural figure showing a distribution device in a communication system which comprises an electronic component according to an embodiment of the present invention.
Figure 54:
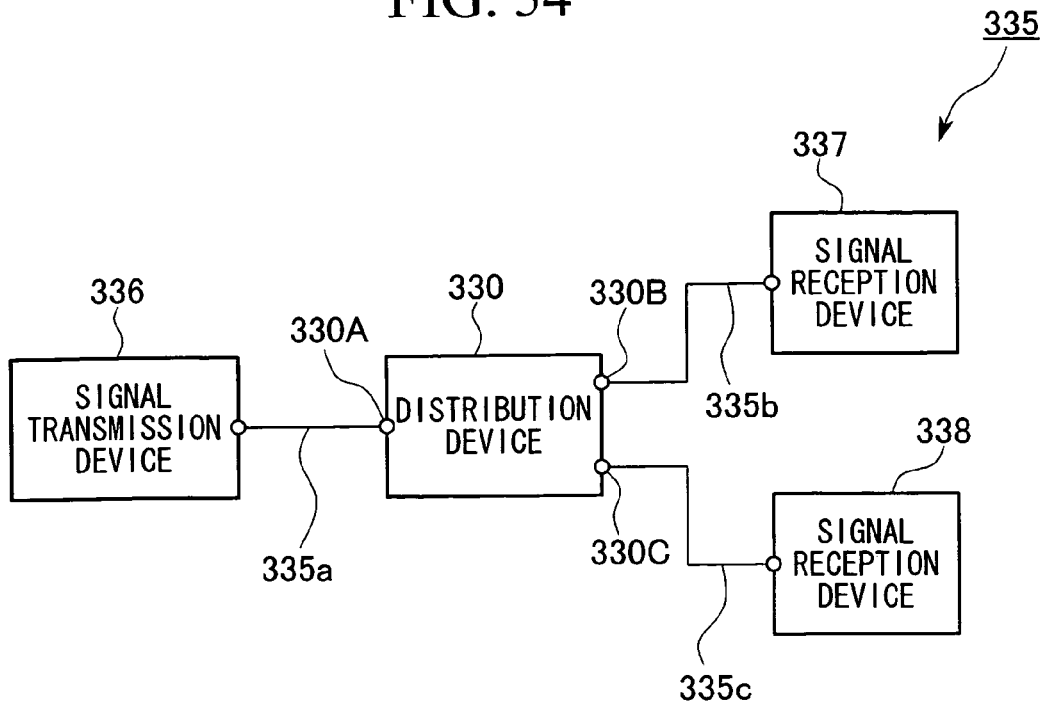
FIG. 54 is a structural figure of the communication system which comprises a distribution device shown in FIG. 52 or FIG. 53.
Figure 55:
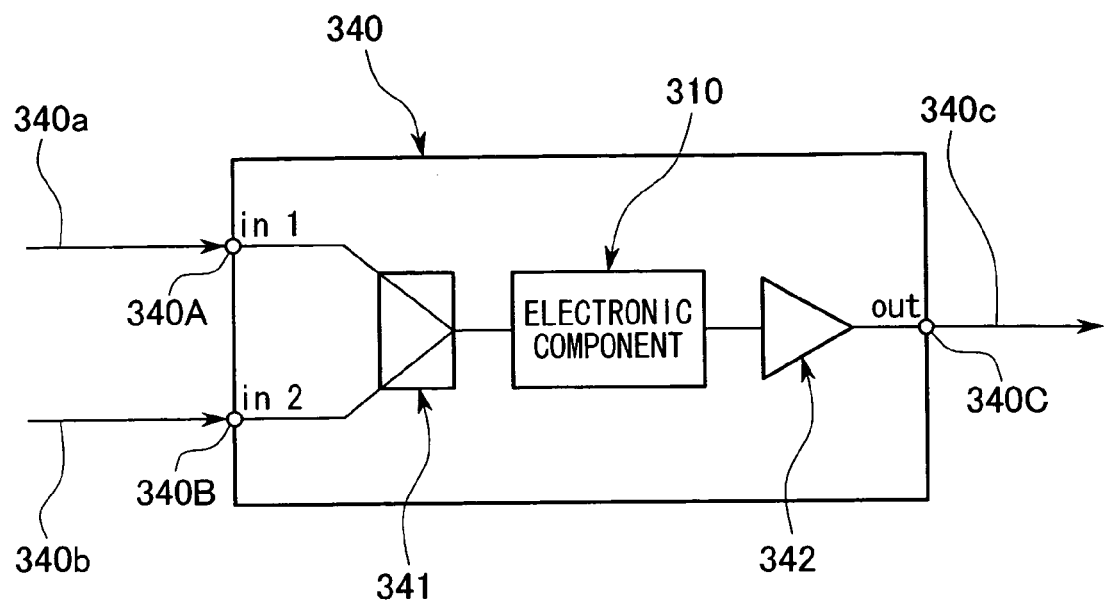
FIG. 55 is a structural figure showing a composition device in a communication system which comprises an electronic component according to an embodiment of the present invention.
Figure 56:
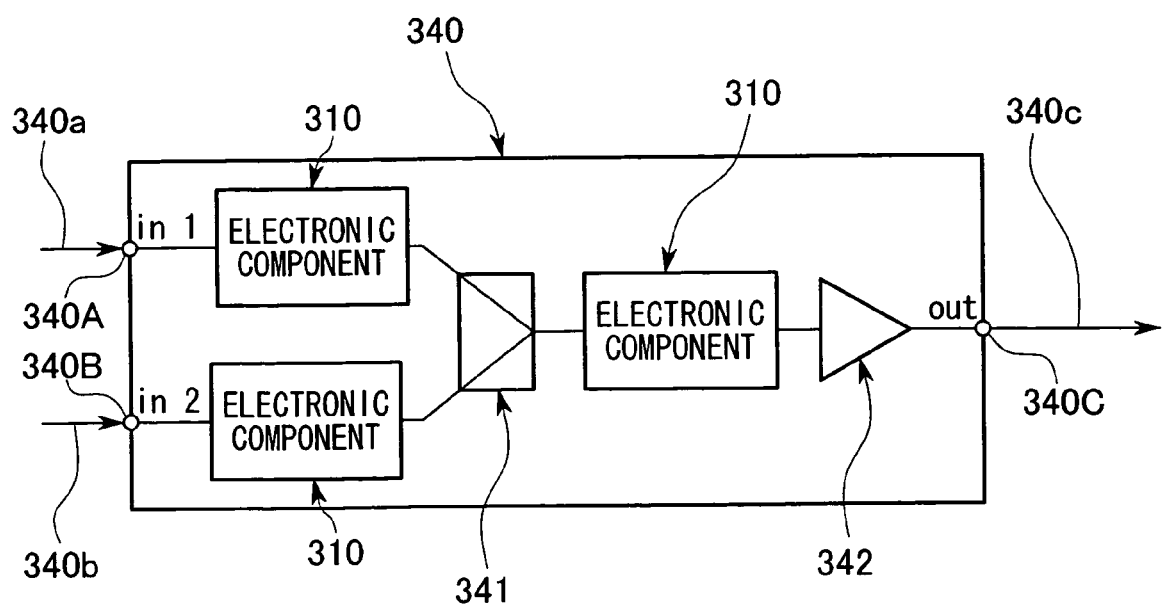
FIG. 56 is a structural figure showing a composition device in a communication system which comprises an electronic component according to an embodiment of the present invention.
Figure 57:
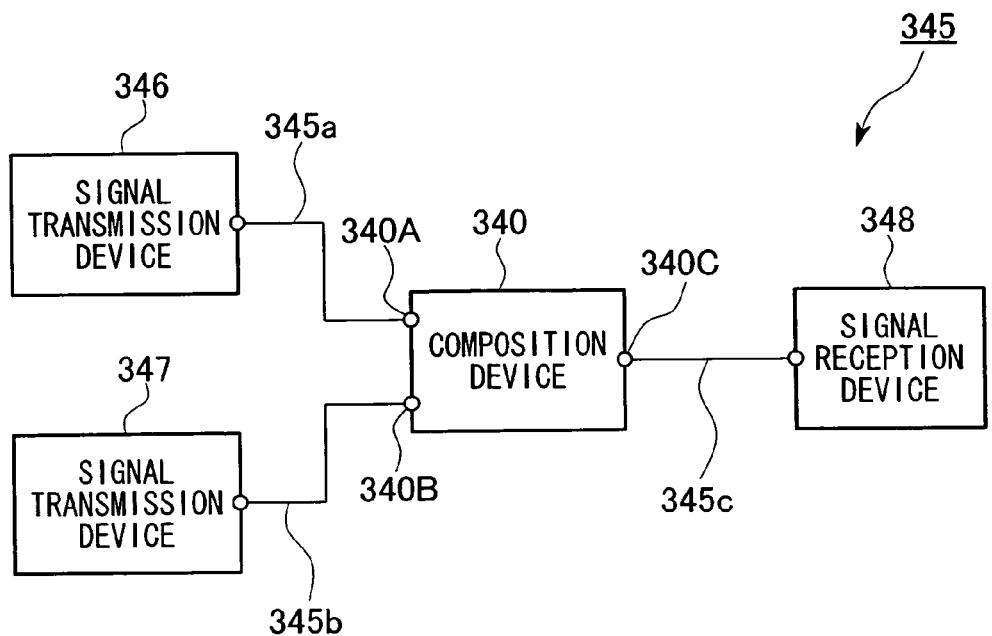
FIG. 57 is a structural figure of the communication system which comprises a composition device shown in FIG. 55 or FIG. 56.
Figure 58:
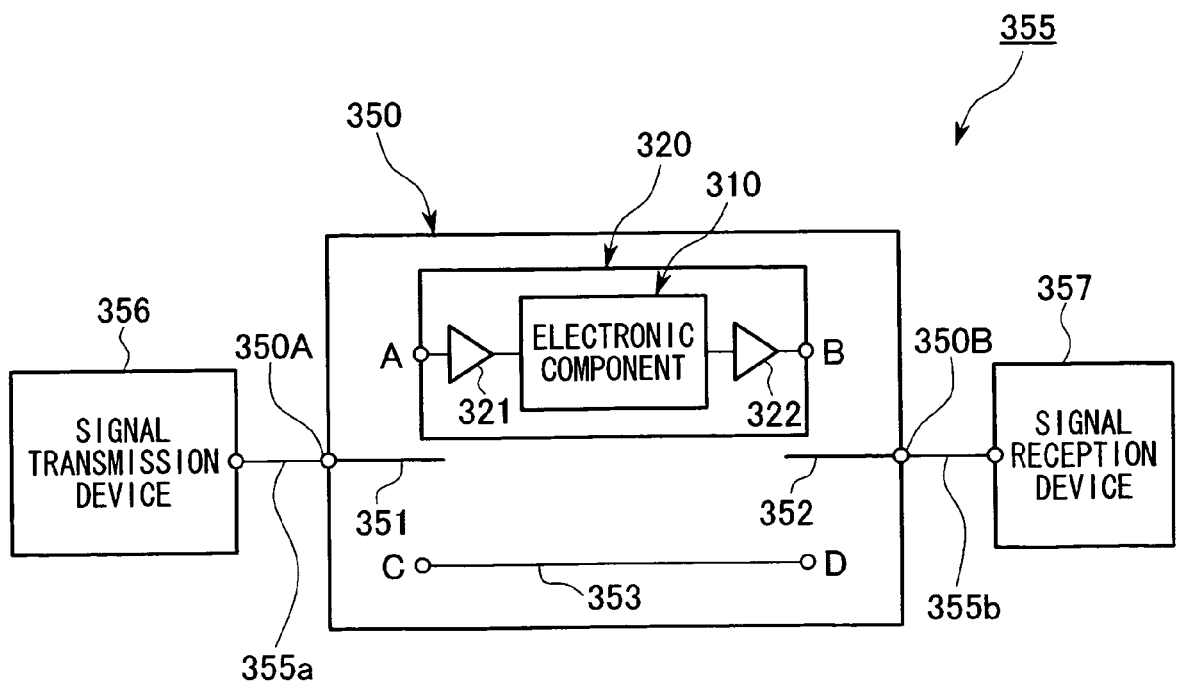
FIG. 58 is a structural figure showing a switchover device in a communication system which comprises an electronic component according to an embodiment of the present invention.
Figure 59:
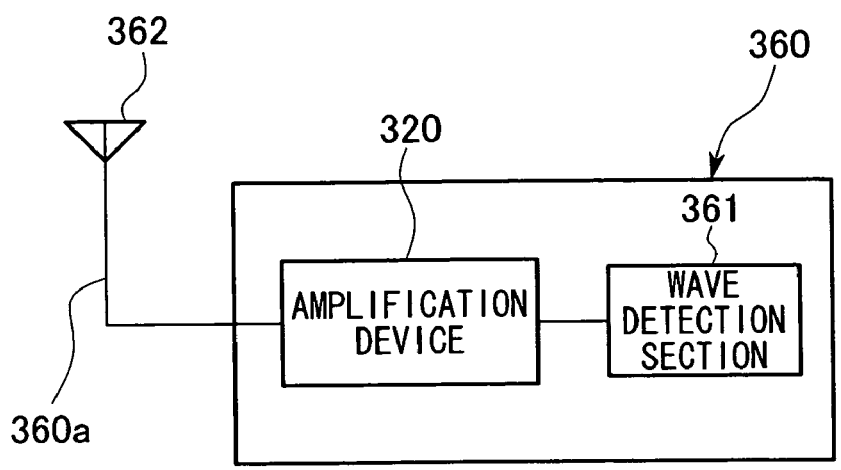
FIG. 59 is a structural figure showing a signal reception device in a communication system which comprises an electronic component according to an embodiment of the present invention.
Figure 60:
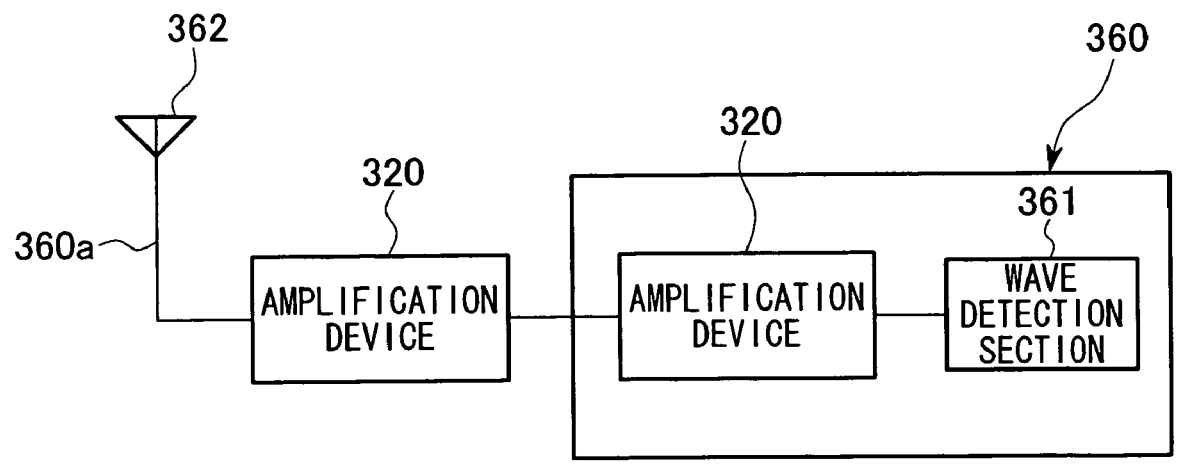
FIG. 60 is a structural figure showing a signal reception device in a communication system which comprises an electronic component according to an embodiment of the present invention.
Figure 61:
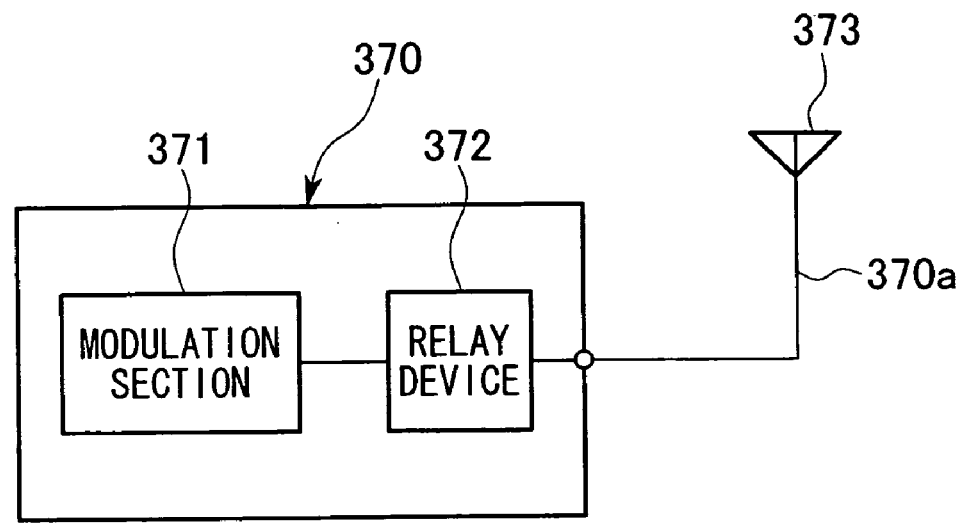
FIG. 61 is a structural figure showing a signal transmission device in a communication system which comprises an electronic component according to an embodiment of the present invention.
Figure 62:
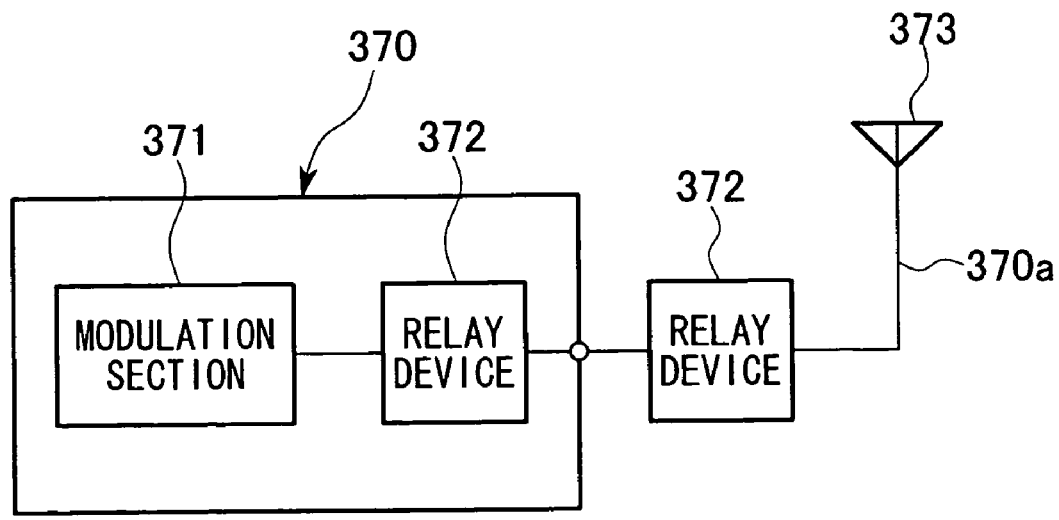
FIG. 62 is a structural figure showing a signal transmission device in a communication system which comprises an electronic component according to an embodiment of the present invention.

FIG. 50 is a structural figure showing an amplification device 320 in a communication system which comprises an electronic component 310 according to the fourth embodiment of the present invention; FIG. 51 is a structural figure showing a communication system 325 which comprises the amplification device 320 shown in FIG. 50; FIG. 52 and FIG. 53 are structural figures showing a distribution device 330 in a communication system which comprises an electronic component 310 according to the fourth embodiment of the present invention; FIG. 54 is a structural figure of the communication system 335 which comprises the distribution device 330 shown in FIG. 52 or FIG. 53; FIGS. 55 and 56 are structural figures showing a composition device 340 in a communication system which comprises an electronic component 310 according to the fourth embodiment of the present invention; FIG. 57 is a structural figure of the communication system 345 which comprises the composition device 340 shown in FIG. 55 or FIG. 56; FIG. 58 is a structural figure showing a switchover device 350 in a communication system which comprises the electronic component 310 according to the fourth embodiment of the present invention; FIGS. 59 and 60 are structural figures showing a signal reception device 360 in a communication system which comprises the electronic component 310 according to the fourth embodiment of the present invention; FIGS. 61 and 62 are structural figures showing a signal transmission device 370 in a communication system which comprises the electronic component 310 according to the fourth embodiment of the present invention; and FIG. 63 is a structural figure showing a wireless communication device 380 which comprises the electronic component 310 according to the fourth embodiment of the present invention.

The amplification device 320 in a communication system which comprises an electronic component 310 according to the fourth embodiment, as shown for example in FIG. 50, comprises: an amplifier 321 which is connected via an input terminal 320A to a transmission line 320a for an input signal; an electronic component 310 which is connected to this amplifier 321 and which is equipped with a SAW filter 311 which comprises, for example, langasite as its piezoelectric element; and an amplifier 322 which outputs a signal which has been outputted from the electronic component 310 via an output terminal 320B to a transmission line 320b.

According to the amplification device 320 of the above described structure, even if noise has been mixed in with the input signal in the transmission line 320a, it is possible to amplify only the desired signal and to transmit it to the transmission line 320b. Moreover, by mounting a SAW filter which utilizes langasite as its piezoelectric element to the electronic component 310, it is possible to obtain a higher elimination performance for the interfering waves, as compared to the case of mounting a SAW filter which utilizes, for example, quartz as its piezoelectric element.

If, for example, it is necessary to provide 60 dB or greater as an out of band attenuation amount, then, with a SAW filter which includes quartz as its piezoelectric element, it is necessary to construct the SAW filter in two stages. However, with a SAW filter 311 which includes langasite as its piezoelectric element, it is possible to ensure the desired out of band attenuation amount with only the single SAW filter 311. By doing this, it becomes possible to make the device more compact and lighter in weight.

It should be understood that, with this amplification device 320, it will be acceptable to dispose the amplifiers 321 and 322 within the electronic component 310. Furthermore, the number of the amplifiers is not limited to two; it would also be acceptable to provide any appropriate number of amplifiers.

Yet further, it is possible to apply this amplification device 320 effectively to the case of amplification, or the like, in a location in the surroundings of which the noise is relatively low, such as for example indoors or in a room which is sheltered or the like, of a signal which has arrived by transmission from a location in the surroundings of which the noise is relatively great, such as for example the outdoors or the like.

For example, with the communication system 325 shown in FIG. 51, after noise or the like which has been mixed in in a transmission line 325a has been eliminated in the amplification device 320 from a signal which has been inputted from a signal transmission device 326 via a transmission line 325a, only the desired signal is amplified by the amplification device 320. And this signal which has been amplified by the amplification device 320 is transmitted to a signal reception device 327 via a transmission line 325b.

A distribution device 330 in a communication system which is equipped with an electronic component 310 according to the fourth embodiment, as shown for example in FIG. 52, comprises: an amplifier 331 which is connected via an input terminal 330A to a transmission line 330a for an input signal; an electronic component 310 to which is mounted a SAW filter 311 which is equipped with, for example, langasite as its piezoelectric element, and which is connected to this amplifier 331; and a distribution device 332 which distributes the signal which is outputted from the electronic component 310, and which outputs it via output terminals 330B and 330C to two transmission lines 330b and 330c.

According to the distribution device 330 of the above described structure, even if noise is mixed in with the input signal in the transmission line 330a, it is possible to distribute only the desired signal and to transmit it to either one of the transmission lines 330b or 330c.

It should be understood that, in this distribution device 330, it will be acceptable to arrange the amplifier 331 and the distribution device 332 within the printed substrate 310. Furthermore, the number of amplifiers is not limited to one; any appropriate number of amplifiers may be provided.

It should be understood that this distribution device 330 in a communication system which incorporates the electronic component 310 of the fourth embodiment, as for example shown in FIG. 53, after having further inputted the signals which have been distributed by the distribution device 332 to electronic components 310, 310, may also output them to two transmission lines 330b and 330c via the output terminals 330B and 330C. In this case, furthermore, it will be acceptable to output the signals which have been outputted from the electronic components 310, 310 after distribution to the output terminals 330B and 330C via amplifiers.

In the communication system 335 which is shown, for example, in FIG. 54, a signal which has been inputted to the distribution device 330 via a transmission line 335a from a signal transmission device 336 is distributed into, for example, two signals by the distribution device 330, and each of these signals is transmitted to one of two signal reception devices 337, 338 via a transmission line 335b, 335c.

Here, the distribution device 330 is not limited to two input signals; it will also be acceptable for it to perform distribution in any appropriate number.

A composition device 340 in a communication system which incorporates an electronic component 310 according to the fourth embodiment, as for example shown in FIG. 55, comprises: a composition section 341 which is connected to a transmission line 340a for an input signal via an input terminal 340A and to a transmission line 340b for an input signal via an input terminal 340B, and which combines the two signals which are inputted; an electronic component 310 which is connected to this composition section 341 and which is equipped with a SAW filter 311 which comprises, for example, langasite as its piezoelectric element; and an amplifier 342 which amplifies the signal which is outputted from the electronic component 310, and which outputs it via an output terminal 340C to a transmission line 340c.

According to the composition device 340 of the above described structure, even if noise is mixed in with the input signals in the transmission line 340a and in the transmission line 340b, it is possible to combine only the desired signals and to transmit the combination to the transmission line 340c.

It should be understood that, in this composition device 340, it would also be acceptable to dispose the composition section 341 and the amplifier 342 within the electronic component 310. Furthermore, in this composition device 340, it would also be acceptable to omit the amplifier 342.

It should be understood that, with the composition device 340 in a communication system which comprises the electronic component 310 according to the fourth embodiment, as for example shown in FIG. 56, it would also be acceptable to perform the composition of signals which have been outputted from an electronic component 310 which is connected to the transmission line 340a for a signal which is inputted via the input terminal 340A, and from a electronic component 310 which is connected to the transmission line 340b for a signal which is inputted via the input terminal 340B, with the composition section 341. In this case, the signal which has been outputted from the composition section 341 may be transmitted to a transmission line 340c, not via any electronic component 310.

For example, with the communication system 345 shown in FIG. 57, a signal which has been inputted via a transmission line 345a from a signal transmission device 346 and a signal which has been inputted via a transmission line 345b from a signal transmission device 347 are combined by a composition device 340, and are transmitted to a signal reception device 348.

Here, the composition device 340 is not limited to two signals which are inputted; it will also be acceptable for it to combine any appropriate number of input signals.

A switchover device 350 in a communication system which comprises the electronic component 310 according to the fourth embodiment, as for example shown in FIG. 58, is disposed in a communication system 355 which comprises a signal transmission device 356 and a signal reception device 357, and is connected via an input terminal 350A to a transmission line 355a for the input signal, and comprises: an input side switch 351 which changes over the transmission circuit for the input signal to one or the other of the amplification device 320 or the transmission line 353, and an output side switch 352 which outputs a signal which is outputted from one or the other of the amplification device 320 or the transmission line 353 to a transmission line 355b via an output terminal 350B.

According to the switchover device 350 of the above described structure, in a case such as, for example, if the noise which is mixed in with the input signal in the transmission line 355a is high or the like, then, if it is desired to limit the band of the input signal so as to cause only the desired signal to be transmitted, then the input terminal 350A and the amplification device 320 are connected together by the input side switch 351, and the output terminal 350B and the amplification device 320 are connected together by the output side switch 352. On the other hand, if band limitation is not required, then the input terminal 350A and the transmission line 353 are connected together by the input side switch 351, and the output terminal 350B and the transmission line 353 are connected together by the output side switch 352.

It should be understood that, in this switchover device 350, it would also be acceptable to dispose the amplifiers 321 and 322 of the amplification device 320, and the switches 351 and 352 and the transmission line 353, within the electronic component 310 of the amplification device 320.

A signal reception device 360 in a communication system which comprises the electronic component 310 according to the fourth embodiment is included in a mobile station device or a base station device or a wireless communication device or the like in a mobile communication system which comprises, for example, a signal transmission device and an antenna and the like, and, as for example shown in FIG. 59, comprises an amplification device 320 which is connected via a line 360a to an antenna 362, and a wave detection section 361.

According to the signal reception device 360 of the above described structure, even if for example an interference signal or the like is mixed in with a signal which is received via the antenna 362, it is possible to extract only the desired signal.

It should be understood that, with a mobile station device or a base station device or a wireless communication device or the like in a mobile communication system which is provided with this signal reception device 360, as for example shown in FIG. 60, it would also be acceptable to include an amplification device 320 between the antenna 362 and the signal reception device 360.

A signal transmission device 370 in a communication system which comprises the electronic component 310 according to the fourth embodiment is included in a mobile station device or a base station device or a wireless communication device or the like in a mobile communication system which comprises, for example, a signal reception device and an antenna and the like, and, as for example shown in FIG. 61, comprises a modulation section 371 and a relay device 372 which includes the electronic component 310 and which relays the signal which is outputted from the modulation section 371; and the signal which is outputted from the relay device 372 is transmitted to an antenna 373 via a line 370a.

According to the signal transmission device 370 of the above described structure, it is possible to suppress spurious signal transmission for the signal which is transmitted via the antenna 373.

It should be understood that, with a mobile station device or a base station device or a wireless communication device or the like in a mobile communication system which is provided with this signal transmission device 370, as for example shown in FIG. 62, it would also be acceptable to include a relay device 372 between the antenna 73 and the signal transmission device 370.

A wireless communication device 380 in a communication system which comprises the electronic component 310 according to the fourth embodiment is one which constitutes a mobile station device or a base station device or a wireless communication device or the like in a mobile communication system which comprises, for example, a signal transmission device and a signal reception device and an antenna and the like, and, as for example shown in FIG. 63, comprises a distribution device 330 which is connected to an antenna 381 via a line 380a, and to a distribution device 30 via a line 380b and a line 380c, and which comprises, for example two signal reception devices 382a and 382b.

Furthermore, these two signal reception devices 382a and 382b may have, for example, the same structure; for example, the signal reception device 382a may comprise an amplification device 320 which is connected to the line 380b, a frequency change section 383 which is connected to this amplification device 320, and a wave detection section 361 to which is inputted the signal which is outputted from the frequency change section 383, via the amplification device 320.

According to the wireless communication device 380 of the above described structure, even if it is the case that, for example, an interference signal or the like is mixed into the signal which is being received via the antenna 381, it is still possible to extract only the desired signal by itself. Furthermore, it is possible to suppress spurious signal transmission for a signal which is being transmitted via the antenna 381.

As has been described above, the electronic component 310 according to the fourth embodiment may be incorporated in, for example, an amplification device 320, a distribution device 330, a composition device 340, a switchover device 350, a signal reception device 360, a signal transmission device 370, or the like; and if, for example, any of these devices 320, . . . , 370, or indeed the electronic component 310 itself, is incorporated in a mobile station device or a base station device of, for example, a mobile communication system, then it is possible to obtain the desired out of band attenuation amount characteristic for the signal which is received, it is possible to suppress crosstalk due to interference, and it is possible to suppress spurious signal transmission in a signal which is being transmitted.

Furthermore, by fitting a SAW filter 311 which comprises langasite as its piezoelectric element to the electronic component 310, along with reducing the amount of SAW filters which are required, it is also possible to ensure the desired out of band attenuation amount, so that it becomes possible to reduce the size of the device and to increase its lightness.

INDUSTRIAL APPLICABILITY

As has been explained above, according to the printed substrate of the first invention, it is possible to suppress undesirable transmission of the input signal which is inputted from the input side terminal electrode directly to the output side terminal electrode, for example by propagation or the like upon the printed substrate or the like, and it is possible to establish reliable propagation within the filter, and it is possible to prevent deterioration of the attenuation characteristic of the filter with respect to the input signal which is inputted to the filter.

Furthermore, according to the printed substrate of the second invention, it is possible to suppress the undesirable propagation of the input signal along the slit, and it is possible to establish reliable propagation within the filter, so that it is possible to prevent deterioration of the attenuation characteristic of the filter with respect to the input signal.

Furthermore, according to the printed substrate of the third invention, it is possible to prevent deterioration of the attenuation characteristic of the filter with respect to the signal which is inputted to the filter.

Furthermore, according to the printed substrate of the fourth invention, it is possible to suppress the undesirable propagation of the input signal which is inputted to the filter, such as for example over the printed substrate or the like, and it is possible reliably to prevent deterioration of the attenuation characteristic of the filter with respect to the signal which is inputted to the filter, at a yet higher level.

Furthermore, according to the printed substrate of the fifth invention, it is possible to prevent deterioration of the attenuation characteristic of the filter with respect to the input signal; and, as compared to a SAW filter which utilizes, for example, quartz or the like as its piezoelectric element, it is possible reliably to obtain the desired attenuation characteristic.

Furthermore, according to the amplification device in a communication system of the sixth invention, it is possible to amplify and to transmit only the desired signal Furthermore, according to the distribution device in a communication system of the seventh invention, it is possible to distribute only the desired signal.

Furthermore, according to the composition device in a communication system of the eighth invention, it is possible to combine and to transmit only the desired signal, even if noise is mixed in with the input signal.

Furthermore, according to the switchover device in a communication system of the ninth invention, it is possible to perform switching over such as, for example, either executing band limitation upon the input signal, or not; so that it becomes possible to perform many types of processing.

Furthermore, according to the signal reception device in a communication system of the tenth invention, it is possible to extract only the desired signal from the signal which is received, even if, for example, an interference signal or the like is mixed thereinto.

Furthermore, according to the signal transmission device in a communication system of the eleventh invention, it is possible to suppress spurious signal transmission in the signal which is transmitted.

Furthermore, according to the mobile station device in a mobile communication system of the twelfth invention, even if for example an interference signal or the like is mixed in with the signal which is received, it is possible to extract only the desired signal. Furthermore, it is possible to suppress spurious signal transmission in the signal which is transmitted.

Furthermore, according to the base station device in a mobile communication system of the thirteenth invention, even if for example an interference signal or the like is mixed in with the signal which is received, it is possible to extract only the desired signal. Furthermore, it is possible to suppress spurious signal transmission in the signal which is transmitted.

Furthermore, according to the wireless communication device of the fourteenth invention, even if for example an interference signal or the like is mixed in with the signal which is received, it is possible to extract only the desired signal. Furthermore, it is possible to suppress spurious signal transmission in the signal which is transmitted.

Furthermore, as has been explained above, according to the printed substrate of the fifteenth invention, it is possible to suppress undesirable propagation of the input signal which is inputted to the filter, such as for example over the printed substrate or the like, and it is possible to establish reliable propagation within the filter, so that it is possible to prevent deterioration of the attenuation characteristic of the filter with respect to the input signal which is inputted into the filter.

Furthermore, according to the printed substrate of the sixteenth invention, it is possible to suppress undesirable propagation of the input signal which is inputted from the input side terminal electrode directly to the output side terminal electrode, and it is possible to establish reliable propagation within the filter, so that it is possible to prevent deterioration of the attenuation characteristic of the filter with respect to the input signal which is inputted from the input side terminal electrode.

Furthermore, according to the printed substrate of the seventeenth invention, if the predetermined distance from the fitting region of the filter exceeds 10 mm, then there is a fear that the attenuation characteristic of the filter will deteriorate, for example to about 20 dB; while, by contrast to this, by setting the elbow position to within 10 mm which is the predetermined distance from the fitting region of the filter, it is possible to obtain the desired attenuation characteristic for the input signal.

Furthermore, according to the printed substrate of the eighteenth invention, it is possible to prevent deterioration of the attenuation characteristic of the filter with respect to the input signal; and, as compared to a SAW filter which utilizes, for example, quartz or the like as its piezoelectric element, it is possible reliably to obtain a higher desired attenuation characteristic.

Furthermore, according to the amplification device in a communication system of the nineteenth invention, even if noise is mixed in with the input signal, it is possible to amplify and to transmit only the desired signal.

Furthermore, according to the distribution device in a communication system of the twentieth invention, even if noise is mixed in with the input signal, it is possible to distribute and to transmit only the desired signal.

Furthermore, according to the composition device in a communication system of the twenty-first invention, even if noise is mixed in with the input signal, it is possible to combine and to transmit only the desired signal.

Furthermore, according to the switchover device in a communication system of the twenty-second invention, it is possible to perform switching over such as, for example, either executing band limitation upon the input signal, or not; so that it becomes possible to perform many types of processing.

Furthermore, according to the signal reception device in a communication system of the twenty-third invention, even if, for example, an interference signal or the like is mixed in with the signal which is received, it is possible to extract only the desired signal.

Furthermore, according to the signal transmission device in a communication system of the twenty-fourth invention, it is possible to suppress spurious signal transmission in the signal which is transmitted.

Furthermore, according to the mobile station device in a mobile communication system of the twenty-fifth invention, even if, for example, an interference signal or the like is mixed in with the signal which is received, it is possible to extract only the desired signal. Furthermore, it is possible to suppress spurious signal transmission in the signal which is transmitted.

Furthermore, according to the base station device in a mobile communication system of the twenty-sixth invention, even if, for example, an interference signal or the like is mixed in with the signal which is received, it is possible to extract only the desired signal. Furthermore, it is possible to suppress spurious signal transmission in the signal which is transmitted.

Furthermore, according to the wireless communication device of the twenty-seventh invention, even if, for example, an interference signal or the like is mixed in with the signal which is received, it is possible to extract only the desired signal. Further, it is possible to suppress spurious signal transmission in the signal which is transmitted.

Furthermore, according to the printed substrate of the twenty-eighth invention, along with it being possible to reduce the influence of noise when performing the desired band transmission processing within the filter, it is also possible to suppress the undesirable propagation of the input signal which is inputted from the input side terminal electrode directly to the output side terminal electrode, and it is possible reliably to establish transmission within the filter, so that it is possible to prevent deterioration of the attenuation characteristic of the filter for the input signal which is inputted from the input side terminal electrode.

Furthermore, according to the printed substrate of the twenty-ninth invention, by providing the through hole in the vicinity of the input side terminal electrode and the output side terminal electrode, along with it being possible to reduce the influence of noise by a yet further level, it is also possible reliably to establish transmission of the input signal within the filter.

Furthermore, according to the printed substrate of the thirtieth invention, by setting the diameter of the through hole to 0.3 to 0.5 mm, along with it being possible to reduce the influence of noise, also it becomes possible to establish the input signal to be reliably transmitted within the filter, so that it is possible to obtain the desired attenuation characteristic.

Furthermore, according to the printed substrate of the thirty-first invention, it is possible to prevent deterioration of the attenuation characteristic of the filter with respect to an input signal which is inputted into the filter.

Furthermore, according to the printed substrate of the thirty-second invention, it is possible to prevent deterioration of the attenuation characteristic of the filter with respect to the input signal; and, as compared to a SAW filter which utilizes, for example, quartz or the like as its piezoelectric element, it is possible reliably to obtain a higher desired attenuation characteristic.

Furthermore, according to the amplification device in a communication system of the thirty-third invention, even if noise is mixed in with the input signal, it is possible to amplify only the desired signal.

Furthermore, according to the distribution device in a communication system of the thirty-fourth invention, even if noise is mixed in with the input signal, it is possible to distribute and to transmit only the desired signal.

Furthermore, according to the composition device in a communication system of the thirty-fifth invention, even if noise is mixed in with the input signal, it is possible to combine and to transmit only the desired signal.

Furthermore, according to the switchover device in a communication system of the thirty-sixth invention, it is possible to perform switching over so as, for example, either to execute band limitation upon the input signal, or not, or the like; and it becomes possible to perform many types of processing.

Furthermore, according to the signal reception device in a communication system of the thirty-seventh invention, even if, for example, an interference signal or the like is mixed in with the signal which is received, it is possible to extract only the desired signal.

Furthermore, according to the signal transmission device in a communication system of the thirty-eighth invention, it is possible to suppress spurious signal transmission in the signal which is transmitted.

Furthermore, according to the mobile station device in a mobile communication system of the thirty-ninth invention, even if, for example, an interference signal or the like is mixed in with the signal which is received, it is possible to extract only the desired signal. Furthermore, it is possible to suppress spurious signal transmission in the signal which is transmitted.

Furthermore, according to the base station device in a mobile communication system of the fortieth invention, even if, for example, an interference signal or the like is mixed in with the signal which is received, it is possible to extract only the desired signal. Furthermore, it is possible to suppress spurious signal transmission in the signal which is transmitted.

Furthermore, according to the wireless communication device of the forty-first invention, even if, for example, an interference signal or the like is mixed in with the signal which is received, it is possible to extract only the desired signal. Furthermore, it is possible to suppress spurious signal transmission in the signal which is transmitted.

Furthermore, according to the electronic component comprising a shield structure of the forty-second invention, by the size of the surface of the protective member which is in contact with the surface of the filter and which covers this surface of the filter being made to be the same as the size of the surface of the filter, or being made to be smaller than the surface of the filter, the undesirable propagation of the input signal which is inputted to the filter over, for example, the space on top of the surface of the filter or over the printed substrate or the like is suppressed, and, along with it being possible reliably to establish transmission within the filter, it is possible reliably to suppress the influence of electromagnetic waves or of noise from the outside. Due to this, it is possible to prevent deterioration of the attenuation characteristic of the filter for the input signal which is inputted to the filter.

Furthermore, according to the electronic component comprising a shield structure of the forty-third invention, it is possible reliably to suppress the influence of electromagnetic waves or of noise from the outside, so that it is possible to prevent deterioration of the attenuation characteristic of the filter for the input signal which is inputted to the filter by yet a further level.

Furthermore, according to the electronic component comprising a shield structure of the forty-fourth invention, it is possible to prevent positional deviation or the like of the protective member which is arranged so as to be in contact with the surface of the filter and with the inner surface of the shield box, and it is possible to obtain the desired attenuation characteristic of the filter in a stable manner and with good repeatability.

Here, if for example the thickness of the protective member in its elastically deformed state is less than 50% of its thickness in its natural state, then the weight which is required for maintaining the protective member in its elastically deformed state becomes excessively large, and there is a fear that damage to the filter or the like may occur; while, conversely, if the thickness of the protective member in its elastically deformed state is greater than 80% of its thickness in its natural state, then it becomes impossible to prevent positional deviation or the like of the protective member. Furthermore, according to the electronic component comprising a shield structure of the forty-fifth invention, the undesirable propagation of the input signal which is inputted to the filter over, for example, the space on top of the surface of the filter or over the printed substrate or the like is suppressed, and it is possible reliably to prevent deterioration of the attenuation characteristic of the filter for the input signal which is inputted to the filter.

Furthermore, according to the electronic component comprising a shield structure of the forty-sixth invention, the undesirable propagation of the input signal which is inputted to the filter over, for example, the space on top of the surface of the filter or over the printed substrate or the like is suppressed, so that it is possible reliably to prevent deterioration of the attenuation characteristic of the filter for the input signal which is inputted to the filter by yet a further level.

Furthermore, according to the electronic component comprising a shield structure of the forty-seventh invention, it is possible to prevent deterioration of the attenuation characteristic of the filter with respect to the input signal; and, as compared to a SAW filter which utilizes, for example, quartz or the like as its piezoelectric element, it is possible reliably to obtain a higher desired attenuation characteristic.

Furthermore, according to the amplification device in a communication system of the forty-eighth invention, it is possible to amplify and to transmit only the desired signal.

Furthermore, according to the distribution device in a communication system of the forty-eighth invention, even if noise is mixed in with the input signal, it is possible to distribute and to transmit only the desired signal.

Furthermore, according to the composition device in a communication system of the fiftieth invention, even if noise is mixed in with the input signal, it is possible to combine and to transmit only the desired signal.

Furthermore, according to the switchover device in a communication system of the fifty-first invention, it is possible to perform switching over so as, for example, either to execute band limitation upon the input signal, or not, or the like; and it becomes possible to perform many types of processing.

Furthermore, according to the signal reception device in a communication system of the fifty-second invention, even if, for example, an interference signal or the like is mixed in with the signal which is received, it is possible to extract only the desired signal.

Furthermore, according to the signal transmission device in a communication system of the fifty-third invention, it is possible to suppress spurious signal transmission in the signal which is transmitted.

Furthermore, according to the mobile station device in a mobile communication system of the fifty-fourth invention, even if, for example, an interference signal or the like is mixed in with the signal which is received, it is possible to extract only the desired signal. Furthermore, it is possible to suppress spurious signal transmission in the signal which is transmitted.

Furthermore, according to the base station device in a mobile communication system of the fifty-fifth invention, even if, for example, an interference signal or the like is mixed in with the signal which is received, it is possible to extract only the desired signal. Furthermore, it is possible to suppress spurious signal transmission in the signal which is transmitted.

Furthermore, according to the wireless communication device of the fifty-sixth invention, even if, for example, an interference signal or the like is mixed in with the signal which is received, it is possible to extract only the desired signal. Furthermore, it is possible to suppress spurious signal transmission in the signal which is transmitted.

What is claimed is:

1. A printed substrate for mounting a filter, comprising:
   an input side connection terminal electrode that is connected to an input terminal of the filter and an output side connection terminal electrode that is connected to an output terminal of the filter, in a fitting region for said filter;
   a slit pierced through said printed substrate in said fitting region for intersecting the straight line which joins said input side connection terminal electrode and said output side connection terminal electrode; and
   a wiring connected to said input side connection terminal electrode, and a wiring connected to said output side connection terminal electrode, each of said wirings extending in a direction that is orthogonal to a transmission direction of an input signal within said filter up to an elbow position at equal to or less than 10 mm from said fitting region, and extending in a direction parallel to the transmission direction of the input signal within said filter from said elbow position.

2. The printed substrate according to claim 1, wherein said slit extends in a direction which is orthogonal to the transmission direction of an input signal within said filter.

3. The printed substrate according to claim 1, wherein a direction in which said slit extends intersects a direction in which each of said wirings extends from said elbow portion.

4. The printed substrate according to claim 1, wherein a through hole is provided which electrically connects together a filter mounting surface of said printed substrate and a rear surface of said printed substrate which has been grounded.

5. The printed substrate according to claim 1, wherein said filter utilizes langasite as its piezoelectric element, and allows signals of a predetermined frequency band to pass by taking advantage of surface elastic waves which are transmitted along a surface of said piezoelectric element.

6. An amplification device in a communication system, comprising the printed substrate according to claim 1.

7. A distribution device in a communication system, comprising the printed substrate according to claim 1.

8. A composition device in a communication system, comprising the printed substrate according to claim 1.

9. A switchover device in a communication system, comprising the printed substrate according to claim 1.

10. A signal transmission device in a communication system, comprising the printed substrate according to claim 1.

11. A signal reception device in a communication system, comprising the printed substrate according to claim 1.

12. A mobile station device in a mobile communication system, comprising the signal reception device according to claim 11.

13. A base station device in a mobile communication system, comprising the signal reception according to claim 11.

14. A wireless communication device which performs wireless communication, comprising the printed substrate according to claim 1.

15. A printed substrate for mounting a filter, comprising:
   an input side connection terminal electrode that is connected to an input terminal of the filter and an output side connection terminal electrode that is connected to an output terminal of the filter, in a fitting region for said filter;
   a wiring for said input side connection terminal electrode and a wiring for said output connection side terminal electrode, each of said wirings extending in a direction which is orthogonal to a transmission direction of an input signal within said filter up to an elbow position at equal to or less than 10 mm from said fitting region, and extending in a direction parallel to the transmission direction of the input signal within said filter from said elbow position; and
   a through hole which electrically connects together a filter mounting surface of said printed substrate and the rear surface of said printed substrate which has been grounded.

16. The printed substrate according to claim 15, wherein said through hole is provided in the vicinity of said input side connection terminal electrode and said output side connection terminal electrode.

17. The printed substrate according to claim 15, wherein the diameter of said through hole is 0.3 mm to 0.5 mm.

18. The printed substrate according to claim 15, wherein said through hole outside of said fitting region is provided in a region within a predetermined distance from said fitting region.

19. A printed substrate according to claim 15, wherein said filter utilizes langasite as its piezoelectric element, and allows signals of a predetermined frequency band to pass by taking advantage of surface elastic waves which are transmitted along a surface of said piezoelectric element.

* * * * *

UNITED STATES PATENT AND TRADEMARK OFFICE
CERTIFICATE OF CORRECTION

PATENT NO. : 7,280,008 B2 Page 1 of 1
APPLICATION NO. : 10/501934
DATED : October 9, 2007
INVENTOR(S) : Yamaguchi et al.

It is certified that error appears in the above-identified patent and that said Letters Patent is hereby corrected as shown below:

On the title page, Item (75), the Inventor information is incorrect. Item (75) should read:

-- (75) Inventors: Kunio Yamaguchi, Chichibu-gun (JP);
  Ryouhei Kimura, Chichibu-gun (JP);
  Atsushi Tanaka, Chichibu-gun (JP);
  Kenyu Morozumi, Yokohama-shi (JP) --

Signed and Sealed this

Eighteenth Day of December, 2007

JON W. DUDAS
*Director of the United States Patent and Trademark Office*